US011303280B1

(12) United States Patent
Mathuriya et al.

(10) Patent No.: US 11,303,280 B1
(45) Date of Patent: Apr. 12, 2022

(54) FERROELECTRIC OR PARAELECTRIC BASED SEQUENTIAL CIRCUIT

(71) Applicant: Kepler Computing Inc., San Francisco, CA (US)

(72) Inventors: Amrita Mathuriya, Portland, OR (US); Ikenna Odinaka, Durham, NC (US); Rajeev Kumar Dokania, Beaverton, OR (US); Rafael Rios, Austin, TX (US); Sasikanth Manipatruni, Portland, OR (US)

(73) Assignee: Kepler Computing Inc., San Francisco, CA (US)

( * ) Notice: Subject to any disclaimer, the term of this patent is extended or adjusted under 35 U.S.C. 154(b) by 0 days.

(21) Appl. No.: 17/407,031

(22) Filed: Aug. 19, 2021

(51) Int. Cl.
*H03K 19/23* (2006.01)
*H03K 19/185* (2006.01)
*H03K 19/17736* (2020.01)
*H01L 49/02* (2006.01)
*G11C 7/10* (2006.01)

(52) U.S. Cl.
CPC .......... *H03K 19/185* (2013.01); *H01L 28/55* (2013.01); *H03K 19/17744* (2013.01); *G11C 7/106* (2013.01); *G11C 7/1087* (2013.01)

(58) Field of Classification Search
CPC ....... G11C 7/106; G11C 7/1087; H01L 28/55; H03K 19/17744; H03K 19/185
See application file for complete search history.

(56) References Cited

U.S. PATENT DOCUMENTS

| 3,260,863 | A | * | 7/1966 | Burns | H03K 19/0948 326/121 |
|---|---|---|---|---|---|
| 3,524,977 | A | | 8/1970 | Wang | |
| 5,381,352 | A | | 1/1995 | Shou et al. | |
| 5,818,380 | A | | 10/1998 | Ito et al. | |
| 5,835,045 | A | | 11/1998 | Ogawa et al. | |
| 5,926,057 | A | | 7/1999 | Ogawa et al. | |
| 5,978,827 | A | | 11/1999 | Ichikawa | |
| 6,043,675 | A | * | 3/2000 | Miyamoto | H03M 1/145 326/11 |
| 6,166,583 | A | | 12/2000 | Kochi et al. | |

(Continued)

OTHER PUBLICATIONS

Wang et al., "Ferroelectric Transistor based Non-Volatile Flip-Flop", ISLPED '16: Proceedings of the 2016 International Symposium on Low Power Electronics and Design, Aug. 2016, pp. 10-15, https://doi.org/10.1 145/2934583.2934603.

(Continued)

*Primary Examiner* — Kurtis R Bahr
(74) *Attorney, Agent, or Firm* — Mughal IP P.C.

(57) ABSTRACT

A low power sequential circuit (e.g., latch) uses a non-linear polar capacitor to retain charge with fewer transistors than traditional CMOS sequential circuits. In one example, a sequential circuit includes pass-gates and inverters, but without a feedback mechanism or memory element. In another example, a sequential uses load capacitors (e.g., capacitors coupled to a storage node and a reference supply). The load capacitors are implemented using ferroelectric material, paraelectric material, or linear dielectric. In one example, a sequential uses minority, majority, or threshold gates with ferroelectric or paraelectric capacitors. In one example, a sequential circuit uses minority, majority, or threshold gates configured as NAND gates.

22 Claims, 29 Drawing Sheets

(56) References Cited

U.S. PATENT DOCUMENTS

| | | |
|---|---|---|
| 6,198,652 B1 | 3/2001 | Kawakubo et al. |
| 6,208,282 B1 | 3/2001 | Miyamoto |
| 7,837,110 B1 | 11/2010 | Hess et al. |
| 7,897,454 B2 | 3/2011 | Wang et al. |
| 8,247,855 B2 | 8/2012 | Summerfelt |
| 9,276,040 B1 | 3/2016 | Marshall et al. |
| 9,324,405 B2 | 4/2016 | Evans, Jr. et al. |
| 9,697,882 B1 | 7/2017 | Evans, Jr. et al. |
| 9,858,979 B1 | 1/2018 | Derner et al. |
| 10,217,522 B2 | 2/2019 | Wang et al. |
| 10,622,050 B2 | 4/2020 | El-Mansouri et al. |
| 10,679,782 B2 | 6/2020 | Manipatruni et al. |
| 2001/0052619 A1* | 12/2001 | Inoue .................. H01L 27/1211 257/347 |
| 2003/0095452 A1 | 5/2003 | Takasu et al. |
| 2004/0183508 A1 | 9/2004 | Toyoda et al. |
| 2005/0017757 A1 | 1/2005 | Fujimori |
| 2010/0301959 A1 | 12/2010 | Liu et al. |
| 2015/0337983 A1 | 11/2015 | Dolenti et al. |
| 2017/0337983 A1 | 11/2017 | Wang et al. |
| 2018/0076815 A1 | 3/2018 | Vigeant et al. |
| 2019/0074295 A1 | 3/2019 | Schröder |
| 2019/0318775 A1 | 10/2019 | Rakshit et al. |
| 2019/0348098 A1 | 11/2019 | El-Mansouri et al. |
| 2020/0091407 A1* | 3/2020 | Liu .......................... G11C 11/18 |
| 2020/0210233 A1 | 7/2020 | Chen et al. |

OTHER PUBLICATIONS

"Kepler Logic", Named for Amalie Emmy Noether @ https://en.wikipedia.org/wiki/Emmy_Noether.

Fichtner, S. et al., "AlScN: A III-V semiconductor based ferroelectric", Journal of Applied Physics 125, 114103 (2019); https://doi.org/10.1063/1.5084945, 2019, 28 pages.

Muller, J. et al., "Ferroelectric Hafnium Oxide Based Materials and Devices: Assessment of Current Status and Future Prospects", ECS Journal of Solid State Science and Technology, 4 (5) N30-N35 (215). 6 pages.

Muroga, S., "Threshold Logic and its Applications", New York, Wiley-Interscience. published 1971.

Subbarao, E., "Ferroelectric and antiferroelectric materials", Department of Metallurgical Engineering, Indian Institute of Technology, Kanpur, IN. First published Mar. 15, 2011. Ferroelectrics, 5:1, 267-280.

Notice of Allowance notified Jul. 20, 2021 for U.S. Appl. No. 17/129,842.

\* cited by examiner

FERROELECTRIC OR PARAELECTRIC BASED SEQUENTIAL CIRCUIT

BACKGROUND

A sequential circuit is a logic circuit whose output is sampled by clock. The output depends not only on the present value of an input (e.g., data) but also on the sequence of past inputs. As such, the input history plays a role in the value of the output. This contrasts with combinational logic; whose output is a function of only the present input. Typical sequential circuit such as a flip-flop may consist of several gates and transistors to form master and slave stages and many interconnects to connect the various gates and transistors. These transistors and gates toggle regularly that increase the dynamic power consumption of the sequential circuit. As processors are pushing down the power envelope to save battery power, existing architectures for sequential circuits present challenges to the goal of lower power consumption.

The background description provided here is for the purpose of generally presenting the context of the disclosure. Unless otherwise indicated here, the material described in this section is not prior art to the claims in this application and are not admitted to be prior art by inclusion in this section.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1A:
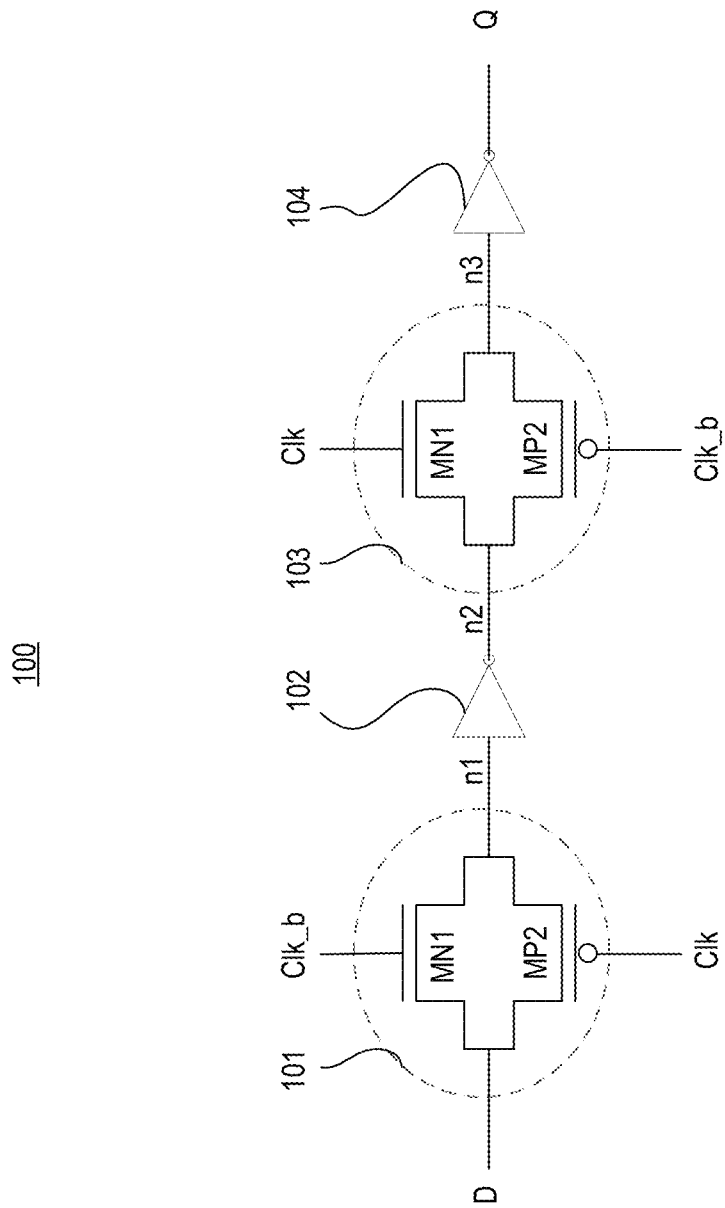
FIG. 1A illustrates a flip-flop design with pass gates and inverters without a feedback mechanism, in accordance with some embodiments.

Various embodiments here describe a new class of sequential logic circuits (e.g., flip-flops (FFs) and latches). In some embodiments, a first FF is illustrated comprising pass-gates and inverters, but without a feedback mechanism or memory element. Such a design reduces the time for which a stage can be held by the first FF. The first FF of some embodiments uses fewer number of transistors and consumes much less power than a traditional FF having at least two latches or memory elements. As such, more of the first FFs can be packed in a given area. For arithmetic circuits (e.g., arithmetic logic unit (ALU), floating point unit (FPU) etc.), where clock frequency is very fast (e.g., higher than 8

Gigahertz), the first FF of some embodiments provides enough retention time to allow for combinational circuits to correctly receives inputs.

In some embodiments, a second FF is illustrated that uses load capacitors (e.g., capacitors coupled to a storage node and a reference supply). In some embodiments, these load capacitors are implemented using ferroelectric material, paraelectric material, or linear dielectric. These load capacitors increase the hold time for the data for a longer period compared to the first FF design. The second FF also provides noise immunity against various factors. Such noise could come from cross coupling of various wires, random particle strikes, charge injection through substrate etc. Here, the capacitors in the design provide enough charge (Q critical) to ensure immunity against noise. In some embodiments, without the presence of these load capacitors, leakage of various components in the circuit leaks away the charge and hold time reduces. These capacitors enable longer hold duration and ability to read the data from the second FF for a longer period at the order of microseconds. In some embodiments, the second FF design is highly suitable for arithmetic circuits for which flip-flops may not need to retain states for a long period of time.

In some embodiments, a third FF is illustrated that uses capacitors on an input of a last driving stage (e.g., an inverter). These capacitors include two capacitors—a first capacitor and a second capacitors. The first capacitor is coupled to the input and ground, while a second capacitor is coupled to the input and a power supply rail or a reference voltage rail. In some embodiments, the capacitors are implemented using ferroelectric material, paraelectric material, or linear dielectric. In various embodiments, at least one capacitor is implemented using ferroelectric material or paraelectric material. The ferroelectric or paraelectric material of the capacitor(s) allows for absorbing charge fluctuations from cross-coupling better than a capacitor with linear dielectric, in accordance with some embodiments.

In some embodiments, a fourth FF is illustrated that uses majority or minority gates. These majority or minority gates include a non-linear polar capacitor(s) to retain charge. Unlike standard CMOS (Complementary Metal Oxide Semiconductor) based transistors where each transistor must be directly connected to a Source or Drain, in some embodiments, transistors are connected to a charged ferroelectric capacitor. In some embodiments, the fourth FF circuit comprises a 3-input majority gate having first, second, and third inputs, and a first output. The majority gate uses non-linear polar material and forms a new class of logic gates. In some embodiments, a threshold gate can be used instead of the majority gate. The majority gate can be replaced with a minority gate, which has an inverted output relative to the majority gate. The majority or minority gates may use linear input capacitors followed by a non-linear polar material-based capacitors to store the majority or minority function. The non-linear polar material comprises ferroelectric or paraelectric material. In some embodiments, the majority or minority gates use non-linear input capacitors that couple to a summing node to store the majority or minority function.

Various other embodiments of the FFs are described that use 3-input and 5-input minority gates. These 3-input and 5-input minority gates can be organized with roles of supervisor and supervisee, in accordance with some embodiments. In some embodiments, a FF design is described that uses minority gates that are configured as NAND gates. Such a FF design can be used where reducing delay is a priority. Other technical effects will be evident from the various figures and embodiments.

In some embodiments, input signals in the form of analog, digital, or a combination of them are driven to first terminals of non-ferroelectric capacitors of the majority gate. The second terminals of the non-ferroelectric capacitors are coupled to form a majority node. Majority function of the input signals occurs on this node. The majority node is then coupled to a first terminal of a capacitor comprising non-linear polar material. The second terminal of the capacitor provides the output of the logic gate. While the various embodiments illustrate drivers of the minority or majority gates as inverters or buffers, the drivers can be replaced with any suitable logic such as NAND gate, NOR gate. Any suitable logic can be used to drive the input or output of the FFs. As such, the majority or minority gate of various embodiments can be combined with existing transistor technologies such as complementary metal oxide semiconductor (CMOS), tunneling field effect transistor (TFET), GaAs based transistors, ribbon FETs, bipolar junction transistors (BJTs), Bi-CMOS transistors, etc.

In some embodiments, the sequential circuit comprises a compare circuitry (e.g., an exclusive-OR (XOR) gate) to receive a clock and the second output. The compare circuitry generates a third output which is coupled to the second input (of the 3-input majority gate), where the first input of the 3-input majority is to receive data (e.g., input data to be sampled), and where the third input (of the 3-input majority gate) is to receive the second output (e.g., output of the driver).

In some embodiments, the majority or minority gate of the sequential circuit is replaced with a threshold gate. In a threshold gate, an additional fixed or programmable input is coupled to the majority node via another capacitor. This additional fixed or programmable input can be a positive or negative bias. The bias behaves as a threshold or offset added or subtracted to or from the voltage (or current) on the majority node and determines the final logic value of the logic gate. Depending on the polarity or voltage value of the bias, AND gate or OR logic gate functions are realized, in accordance with various embodiments.

In some embodiments, the non-linear polar material includes one of: ferroelectric material, para-electric material, or non-linear dielectric material. In some embodiments, the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La or Nb; a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST). In some embodiments, perovskite ferroelectrics includes one of: $BaTiO_3$, $PbTiO_3$, $KNbO_3$, or $NaTaO_3$. In some embodiments, hexagonal ferroelectric includes one of: $YMnO_3$ or $LuFeO_3$. In some embodiments, hexagonal ferroelectrics of a type h-$RMnO_3$, where R is a rare earth element including one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides of a form, $Hfl-x Ex Oy$ where E can be Al, Ca, Ce, Dy, er, Gd, Ge, La, Sc, Si, Sr, Sn, or Y; $Al(l-x)Sc(x)N$, $Ga(l-x)Sc(x)N$, Al(1-x)Y(x)N or Al(1-x-y)Mg(x)Nb(y)N, y doped Hf02, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100. In some embodiments, the non-linear polar capacitor is positioned in a backend of a die, while transistors of the driver and the compare logic are positioned in a frontend of a die.

There are many technical effects of the various embodiments. For example, extremely compact sequential circuit is formed using the FF design of various embodiments. The non-linear polar material used in the FF or latch can be ferroelectric material, para-electric material, or non-linear dielectric. The majority/minority gate and/or threshold gate of various embodiments lowers the power consumption of a sequential circuit because majority/minority gate and/or threshold gate do not use switching transistors and the interconnect routings are much fewer than the interconnect routings used in transitional CMOS logic gates. For example, 10× fewer interconnect length is used by the majority gate and threshold gate of various embodiments than traditional CMOS circuits for the same function and performance. The capacitor with non-linear polar material provides non-volatility that allows for intermittent operation and zero power drain when not in use.

For example, a processor having such sequential logic gates can enter and exit various types of low power states without having to worry about losing data. Since the capacitor with non-linear polar material can store charge from low energy devices, the entire processor can operate at much lower voltage level from the power supply, which reduces overall power of the processor. Further, very low voltage switching (e.g., 100 mV) of the non-linear polar material state allows for low swing signal switching, which in turn results in low power.

The capacitor with non-linear polar material can be used with any type of transistor. For example, the capacitor with non-linear polar material of various embodiments can be used with planar or non-planar transistors. The transistors can be formed in the frontend or backend of a die. The capacitors with non-linear polar material can be formed in the frontend or backend of the die. As such, the logic gates can be packed with high density compared to traditional logic gates. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

It is pointed out that those elements of the figures having the same reference numbers (or names) as the elements of any other figure can operate or function in any manner like that described but are not limited to such.

FIG. 1A illustrates flip-flop (FF) 100 with pass gates and inverters without a feedback mechanism, in accordance with some embodiments. FF 100 comprises first pass gate 101, first inverter 102, second pass-gate 103, and second inverter 104, data input D, output Q, clock nodes Clk and Clkb (where Clkb provides a clock which is an inverse of the clock on node Clk), and internal nodes n1, n2, and n3 coupled as shown. In some embodiments, pass-gates 101 and 103 can be replaced with tri-stateable buffers. In some embodiments, the inverters 102 and 104 can be replaced with any suitable driver such a NAND gate, NOR gate, etc. with knobs to reset or preset voltage on node n2 and output Q. Here, node names and signal names are interchangeably used. For example, clock Clk may reference to node Clk or the clock signal Clk on that node depending on the context of the sentence.

Flip-flop 100 is independent of a latch. For example, FF 100 removes the feedback loops within regular D-flip-flops. Removing the feedback loops or memory element in the FF reduces the time for which state can be held by FF 100. In various embodiments, FF 100 uses a lesser number of transistors compared to traditional FF. As such, more FFs can be packed in a given area while consuming low power. FF 100 is well suited for compute heavy logic circuits such as arithmetic circuits where the clock is very fast (e.g., 6 GHZ or more). FF 100 provides enough retention time to allow for combinational circuits to correctly receive the inputs.

Figure 1B:
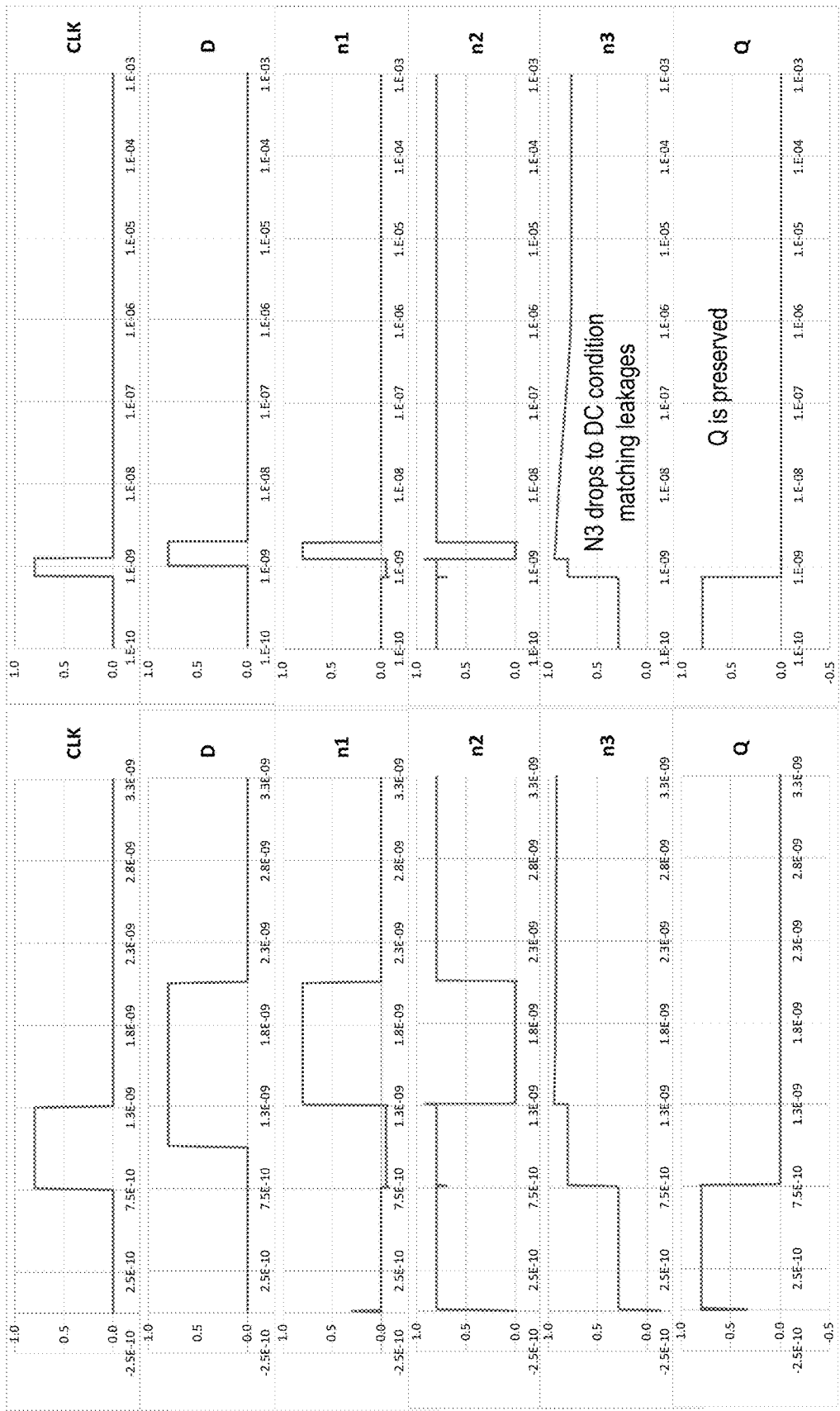
FIG. 1B illustrates a timing diagram of the flip-flop of FIG. 1A when data goes to 0, in accordance with some embodiments.

FIG. 1B illustrates timing diagram 120 of flip-flop 100 of FIG. 1A when data goes to 0 in accordance with some embodiments. Timing diagram 120 shows the functionality of FF 100. In this example, FF 100 shows that charge flops around 1 microsecond. This time could further go down with external noise in the circuit and other random events. Timing diagram 120 a situation where a clock edge of CLK captures the data signal D while it is high and afterwards the data signal D goes down. The simulation runs for a few microseconds to show the retention time of flip-flop 100 in this scenario. Node n1 captures the data value. Node n2 is inverted signal of node n1. Node n3 is supposed to follow the node n2, controlled by the clock signal. However, due to the leakage present in the system of various components, specially of inverters 102 and 104 and pass gates 101 and 103, the voltage on the node n3 drops slowly drops to match the DC condition.

Figure 1C:
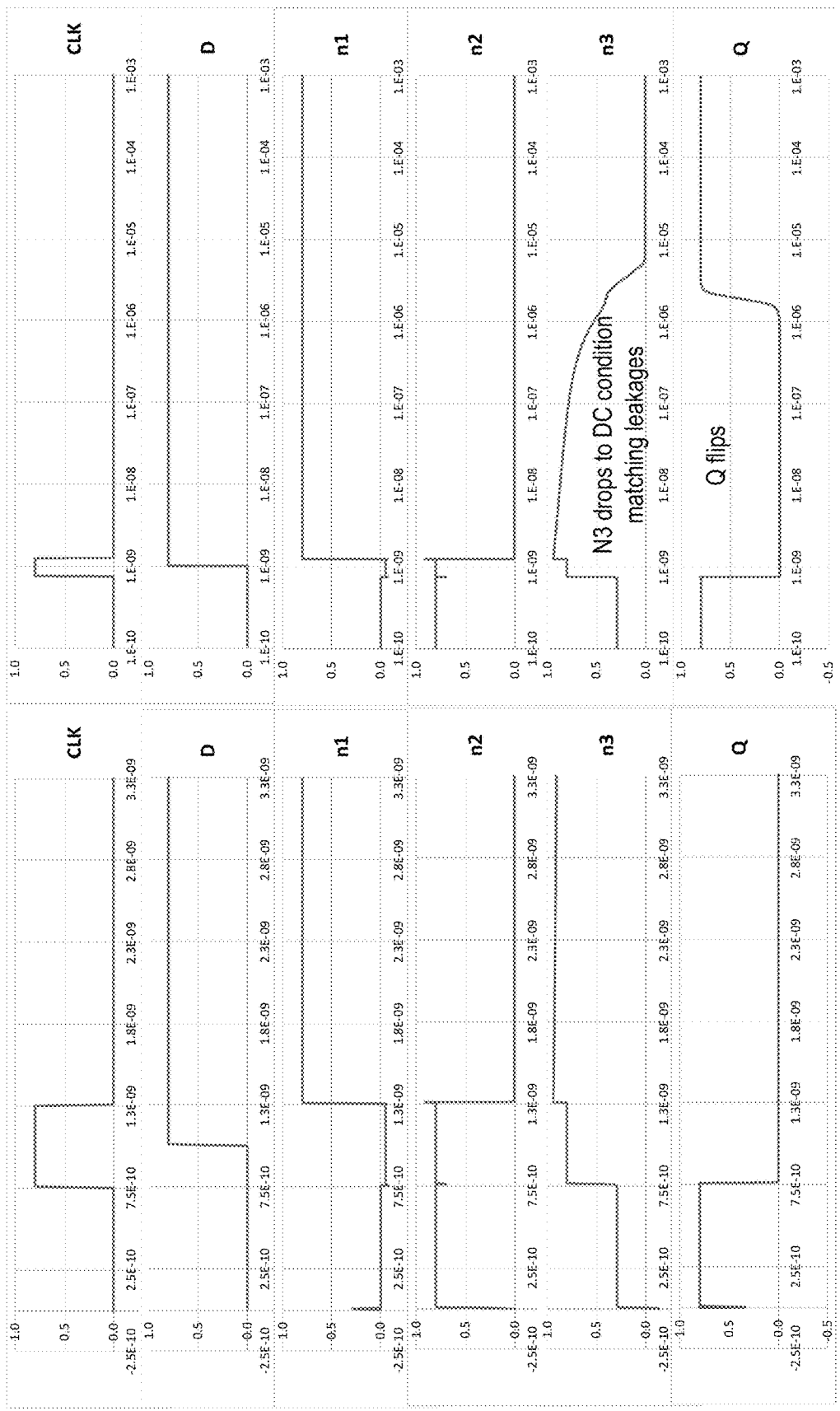
FIG. 1C illustrates a timing diagram of the flip-flop of FIG. 1A when data goes to 1, in accordance with some embodiments

FIG. 1C illustrates timing diagram 130 the flip-flop 100 of FIG. 1A when data goes to 1, in accordance with some embodiments. In this case, data D continues to be high for a longer period. This is a situation where node n3 and n2 are of opposite polarity. Due to the leakage present in the system, voltage at node n3 discharges down and finally the output state of flip-flop 100 switches to incorrect state.

Figure 2:
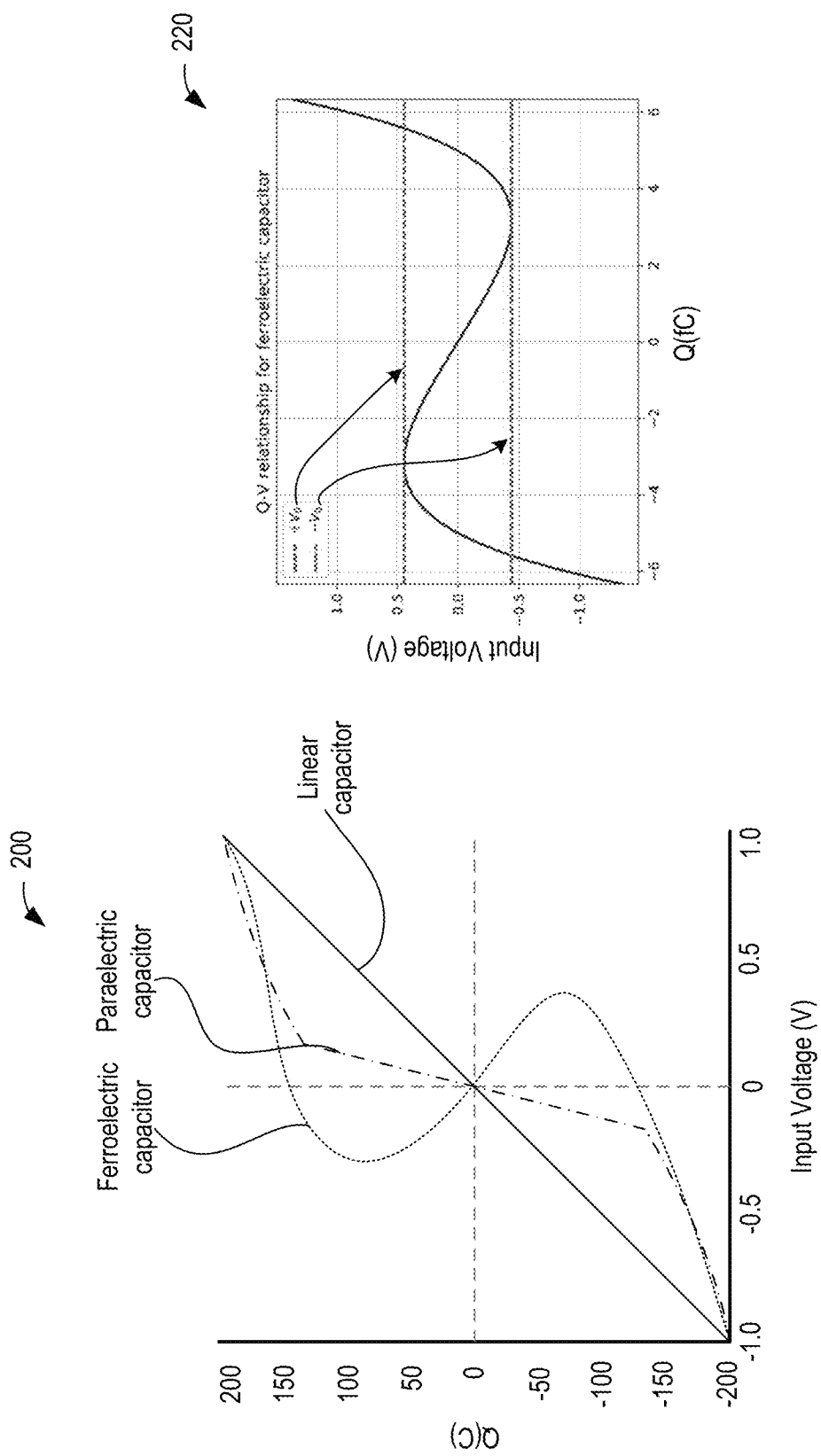
FIG. 2 illustrates a set of plots showing behavior of a ferroelectric capacitor, a paraelectric capacitor, and a linear capacitor.

FIG. 2 illustrates a set of plots 200 and 220 showing behavior of a ferroelectric capacitor, a paraelectric capacitor, and a linear capacitor. Plot 200 compares the transfer function for a linear capacitor, a paraelectric (PE) capacitor (a non-linear capacitor) and a ferroelectric (FE) capacitor (a non-linear capacitor). Here, x-axis is input voltage or voltage across the capacitor, while the y-axis is the charge on the capacitor. The ferroelectric material can be any suitable low voltage FE material that allows the FE material to switch its state by a low voltage (e.g., 100 mV). Threshold in the FE material has a highly non-linear transfer function in the polarization vs. voltage response. The threshold is related to: a) non-linearity of switching transfer function, and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1. The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of a FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

Plot 220 shows the charge and voltage relationship for a ferroelectric capacitor. A capacitor with ferroelectric material (also referred to as a FEC) is a non-linear capacitor with its potential $V_F(Q_F)$ as a cubic function of its charge. Plot 220 illustrates characteristics of a FEC. Plot 220 is a charge-voltage (Q-V) plot for a block of $Pb(Zr_{0.5}Ti_{0.5})O_3$ of area $(100 \text{ nm})^2$ and thickness 20 nm (nanometer). Plot 220 shows local extrema at $+/-V_o$ indicated by the dashed lines. Here, the term $V_c$ is the coercive voltage. In applying a potential V across the FEC, its charge can be unambiguously determined only for $|V|>V_o$. Otherwise, the charge of the FEC is subject to hysteresis effects.

Figure 3A:
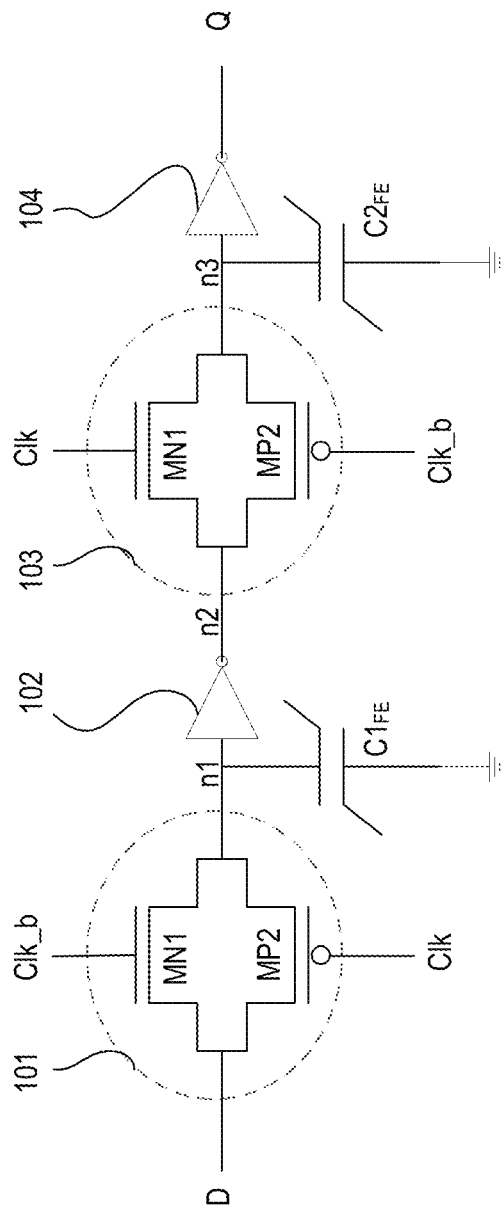
FIG. 3A illustrates a flip-flop design with load capacitors, wherein the load capacitors include paraelectric or ferroelectric material, in accordance with some embodiments.

FIG. 3A illustrates flip-flop 300 with load capacitors, wherein the load capacitors paraelectric or ferroelectric, in accordance with some embodiments. FF 300 is like FF 100 but with load capacitors on nodes n1 and n3. These load capacitors can be implemented as ferroelectric capacitors (e.g., $C1_{FE}$ and $C2_{FE}$), paraelectric capacitors, dielectric (linear) capacitors, and non-linear dielectric based capacitors. In some embodiments, adding the capacitor increases the hold time for the data for a longer period. It also provides noise immunity against various factors. Such noise could come from cross coupling of various wires, random particle strikes, charge injection through substrate etc. Here, the capacitors in the design provide enough charge (Q critical) to ensure immunity against noise. Without the presence of capacitors, leakage of various components in the circuit leaks away the charge and hold time reduces, in accordance with some embodiments. These capacitors enable longer hold duration and ability to read the data from the flip-flop for a longer period in the order of microseconds. For example, the capacitors help retain the voltages on the floating nodes n1 and n3 longer than without the capacitors.

If the retention on nodes n1 and n3 is not desired to be long (e.g., greater than 1 microseconds), then the capacitors can be removed and FF 100 can be adapted instead, in accordance with some embodiments. The size of the capacitors (hence its capacitance) depends on the desired retention duration and speed of discharge on nodes n1 and n3, which is based on leakage of transistors attached to nodes n1 and n3. This type of flip-flop design is suitable for arithmetic circuits for which flip-flops may not need to retain states for a long period of time. Here, the data is written to the flip-flops during each clock cycle either on the rising or falling edge.

When the clock frequency is high enough (e.g., in the order of 100's of MHz or at the order of GHz), sufficient charge is established on the capacitors to hold the value for multiple clock cycles (e.g., order of 100s or 1000s). At the same time, capacitors holding the value also provide noise immunity against external factors in the circuit listed herein. Therefore, the capacitors (e.g., $C1_{FE}$ and $C2_{FE}$) serve the purpose of holding the data value for a long duration to be able to compute in an attached combinational circuit. The charge on the capacitors is decided based on the reliability of the desired circuits attached to the flipflops and is dependent upon the system for which these flip-flops are used. This could be in the order of 100s of attocoulomb (e.g., 400 attocoulomb (aC)) for advanced technology nodes (e.g., those based on FinFET), and can scale easily with system requirements. Size of the capacitors is chosen such that they hold a minimum amount of charge. This minimum charge is dependent on the desired reliability of, for example, arithmetic circuits that the flip-flops are attached to. Also, external noise that is seen by the flip-flops is accounted for. This external noise may be because of various factors such as current injection through the substrate, disturbances caused by supply voltages, random particle strikes and cross coupled capacitors.

In some embodiments, the capacitors can be built in the backend of a die and may not take away the area in the front-end of the die. Thereby, increasing the density advantage. In various embodiments, these capacitors can be made with non-linear polar materials (e.g., ferroelectric or paraelectric) with high charge densities (e.g., in the order of few microcoulomb/cm$^2$). As such, the area occupied by the capacitors reduces and the density compared to linear capacitors increases, while providing the functionality required for a compute arithmetic combinational circuit attached to flip-flop 300.

Figure 3B:
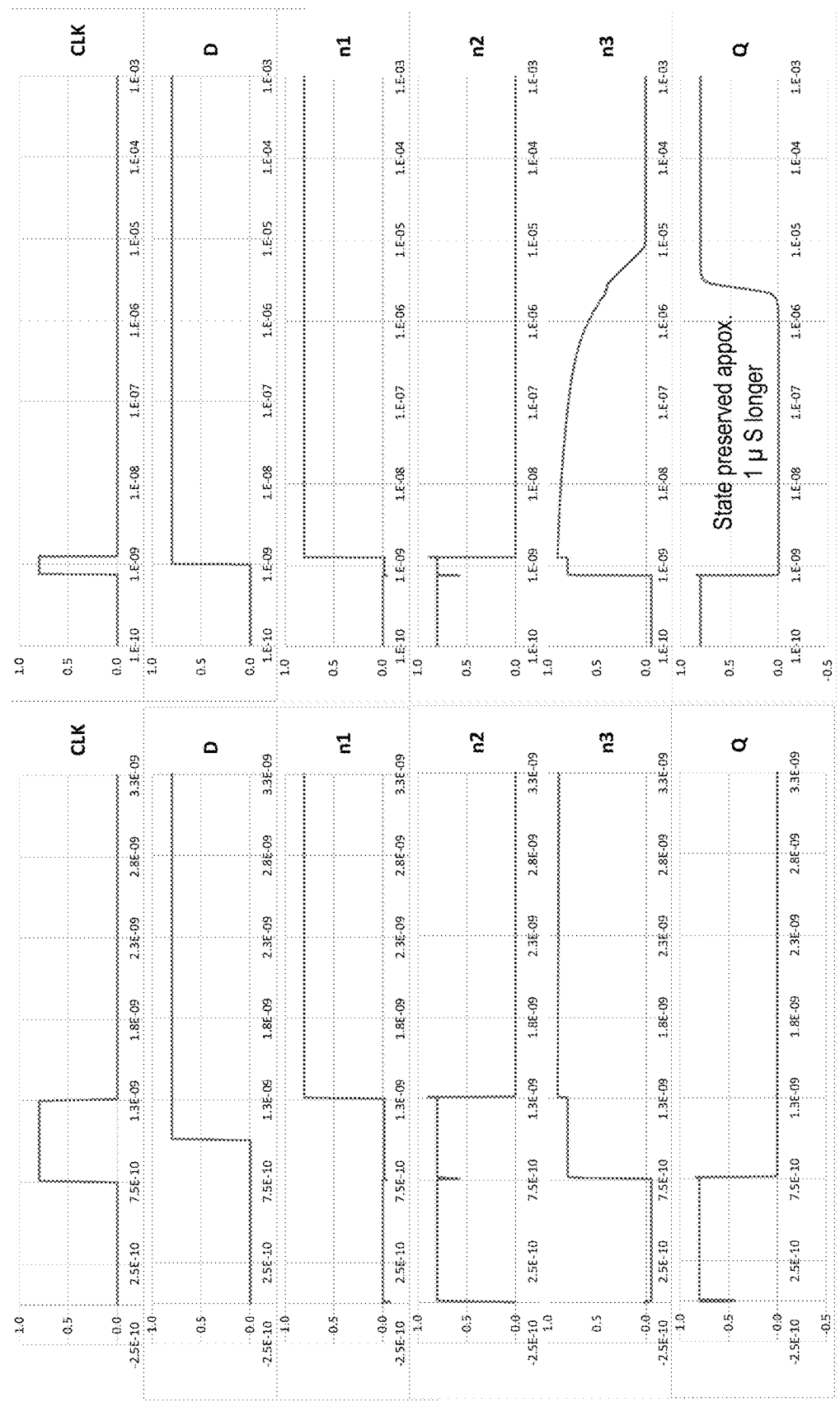
FIG. 3B illustrates a timing diagram of the flip-flop of FIG. 1A, in accordance with some embodiments.

FIG. 3B illustrates timing diagram 320 of the flip-flop of FIG. 1A, in accordance with some embodiments. Timing diagram 320 shows that adding a ferroelectric capacitor of 400 aC, keeps the state preserved for 1 μs longer. The capacitance value can be further adjusted depending on the system requirements and noise present in the system. Timing diagram 320 shows voltages at various nodes and input and clock signals. When nodes n2 and n3 are of opposite polarities, it takes longer time to discharge node n3 to the DC condition and hence longer time taken for flipping the output of the flip-flop to an incorrect state.

Figure 3C:
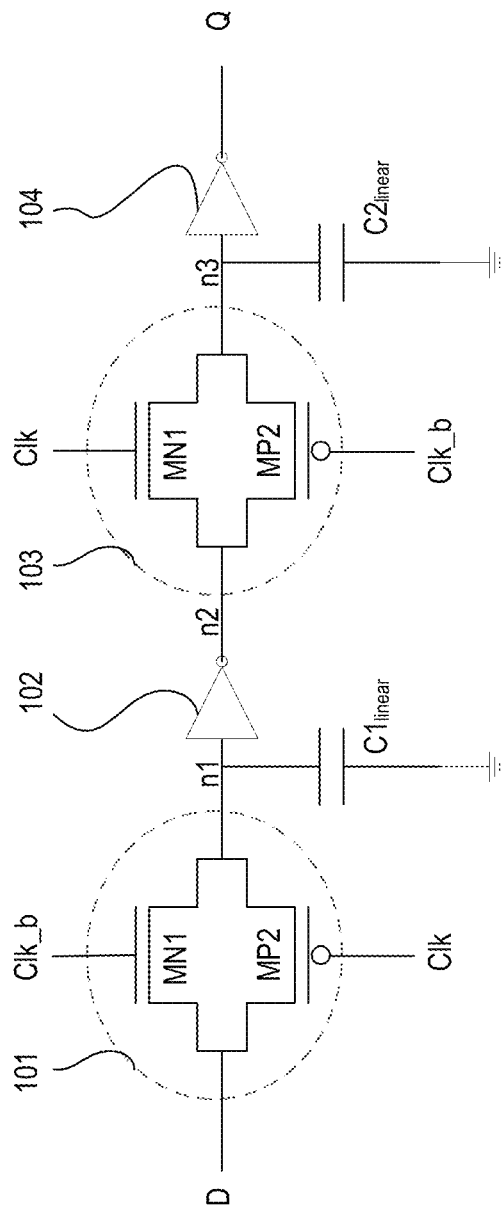
FIG. 3C illustrates a flip-flop design with load capacitors, wherein the load capacitors include linear material, in accordance with some embodiments.

FIG. 3C illustrates flip-flop design 330 with load capacitors, wherein the load capacitors include linear material, in accordance with some embodiments. FF 330 is like FF 300 but for using linear capacitors for the load capacitors. A capacitor is a linear capacitor when voltage and current as functions of time depend in a linear way on each other. Examples of linear capacitors are Metal-insulator-Metal (MIM) capacitor, transistor-based capacitors configured to operate in a linear region of operation, or a combination of them. Other technical effects described with reference to FIG. 3A are also applicable to FF 330.

Figure 4:
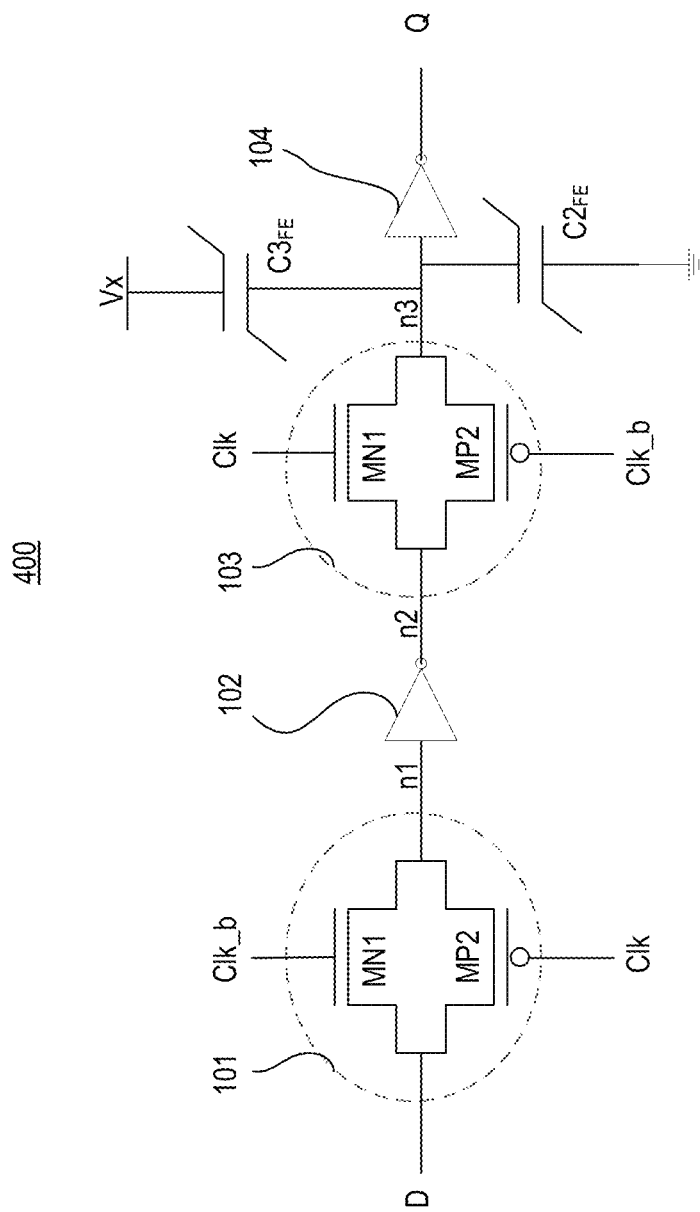
FIG. 4 illustrates a flip-flop with ferroelectric or paraelectric capacitors at the input of an output driver, in accordance with some embodiments.

FIG. 4 illustrates flip-flop 400 with ferroelectric or paraelectric capacitors at the input of an output driver, in accordance with some embodiments. FF 400 is like FF 100 but for capacitors on node n3. Here, two ferroelectric capacitors $C2_{FE}$ and $C3_{FE}$ are shown connected to node n3. While the embodiments illustrate ferroelectric capacitors, the capacitors can be replaced with paraelectric capacitors or a combination of ferroelectric or paraelectric capacitors. In some embodiments, capacitor $C2_{FE}$ is coupled to node n3 and ground. In some embodiments, capacitor $C3_{FE}$ is coupled to node n3 and Vx. In some embodiments, node Vx is a power supply rail which also provides power to inverters 102 and 104. In some embodiments, Vx is a reference supply rail that carries a voltage between ground and a supply level. In various embodiments, capacitors $C2_{FE}$ and $C3_{FE}$ provide higher noise immunity due to non-linearity of ferroelectric or paraelectric material. The configuration of FF 400 provides better noise immunity and hence are more reliable design.

Figure 5:
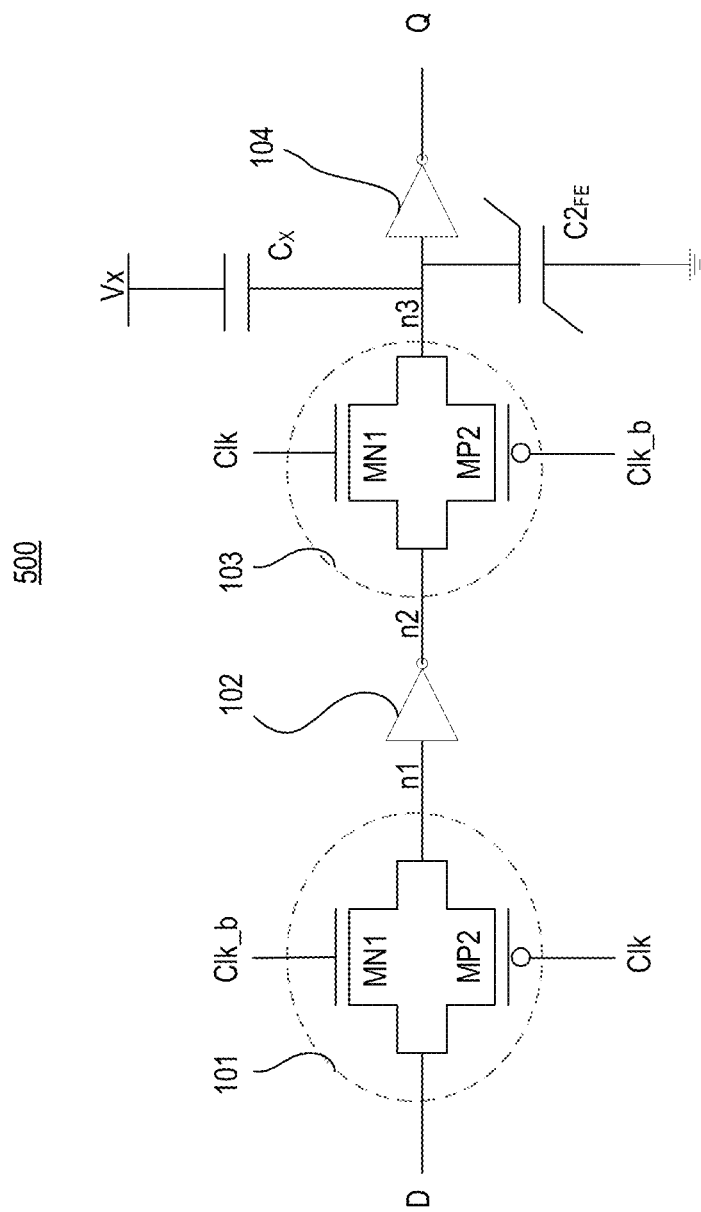
FIG. 5 illustrates a flip-flop with ferroelectric or paraelectric capacitor and a linear capacitor at the input of an output driver, in accordance with some embodiments.

FIG. 5 illustrates flip-flop 500 with a ferroelectric or paraelectric capacitor and a linear capacitor at the input of an output driver, in accordance with some embodiments. FF 500 is like FF 400 but for replacing one of the non-linear capacitors with a linear capacitors Cx. In some embodiments, linear capacitor Cx is coupled to reference supply rail Vx. In some embodiments, non-linear capacitor $C2_{FE}$ is replaced with a linear capacitor while linear capacitor Vx is replaced with a non-linear capacitor.

Figure 6A:
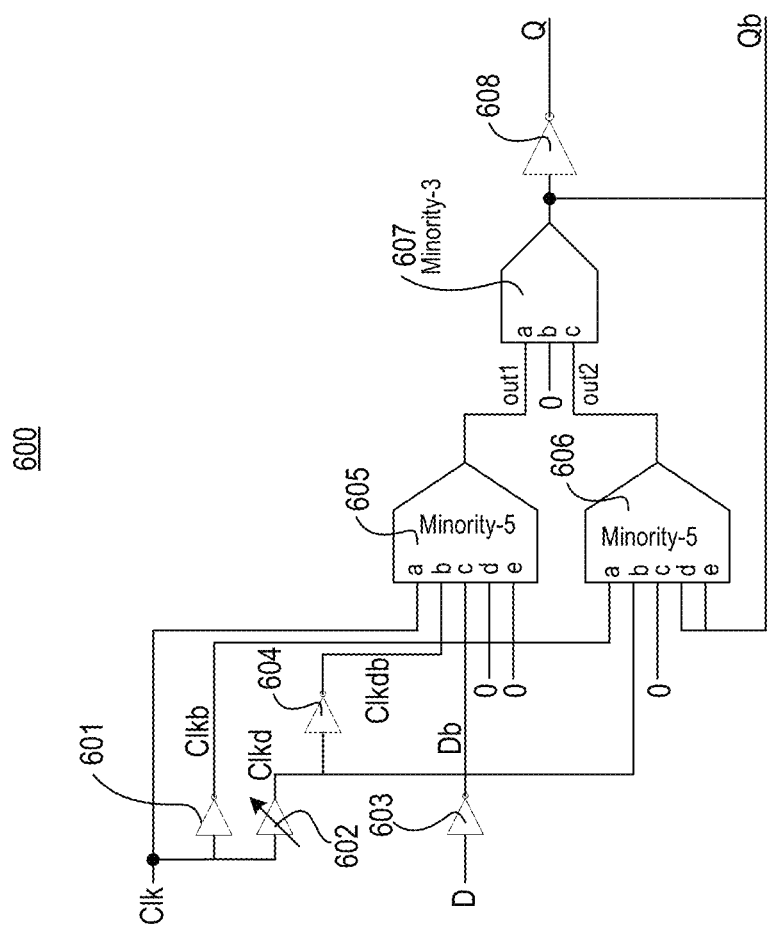
FIG. 6A illustrates a flip-flop with 5-input minority gates and a 3-input minority gate, in accordance with some embodiments.

FIG. 6A illustrates flip-flop 600 with 5-input minority gates and a 3-input majority gate, in accordance with some embodiments. FF 600 comprises inverter 601, adjustable delay stage 602, inverter 603, inverter 604, first 5-input minority gate 605, second 5-input minority gate 606, 3-input minority gate 607, and output inverter 608 coupled a shown. Here, inputs are clock Clk and data D. Db is an inversion of data D, while Clkb is an inversion of Clk, and Clkd is a delayed version of clock Clk. In some embodiments, minority gates 605, 606, and 607 can be replaced with majority gates, threshold gates, or a combination of them. A minority gate is a majority gate with an inverter at its output. In some embodiments, one or more inverters 601, 603, 604, and/or 608 can be replaced with any other inverting logic such as a NAND gate, NOR gate, a tri-stateable inverter, inverting multiplexer etc. Such inverting logic can provide additional knobs to control the signal flow. For example, the signal flow can be gated or forced to a predetermined voltage (e.g., supply level Vdd or ground) by a NAND gate or NOR gate. In some embodiments, delay stage 602 has a programmable delay. In some embodiments, delay stage 602 has a fixed delay. One purpose of the delay stage 602 is to capture positive or negative clock edges of clock Clk. In some embodiments, one or more inputs of minority gates 605, 606, and 607 are provided with fixed voltages (e.g., ground voltage 0).

In some embodiments, 5-input minority gate 605 receives a first input 'a' which is a clock Clk, a second input 'b' which is Clkdb, a third input 'c' which is data Db, a fourth input 'd' which is tied to ground, and a fifth input 'e' which is tied to ground. In some embodiments, 5-input minority gate 606 receives a first input 'a' which is a clock Clk, a second input 'b' which is Clkd, a third input 'c' which is ground, a fourth input 'd' which is tied to an output of the 3-input majority gate 607, and a fifth input 'e' which is tied to an output of the 3-input majority gate 607. In some embodiments, gates 605 and 606 are of same propagation delay to keep the circuit balanced. As such, both gates 605 and 606 are 5-input minority gates, in accordance with some embodiments. In some embodiments, 3-input minority gate 607 receives a first input 'a' which is an output out1 of first 5-minority gate 605, a second input 'b' which is tied to ground, and a third input 'c' which is an output out2 of second 5-minority gate 606. In various embodiments, the output of 3-input minority input 607 is Qb (which is an inverse of Qb). In various embodiments, the inverters herein can be replaced with other inverting gates such as NAND gates, NOR gates, with extra knob to control or gate the output. The output of 3-input minority input 607 is inverted by inverter 608 to generate the output Q of FF 600. FF 600 is a rising edge flip-flop.

Both first level minority gates 605 and 606 receive either inverted clock (Clkb) or direct clock (Clk) and delayed clock Clkd signals. With the combination of these two, a pulse is created for first level minority gates 605 and 606. In some embodiments, first minority gate 605 receives signals of (a=clock, b=inverted delayed clock, c=inverted data and d=0, e=0). Just after the clock signal Clk goes up, first minority gate 605 receives (a=1, b=1, c=inverted data, d=0, e=0). Since first minority gate 605 is a minority gate, first minority gate 605 outputs data D at the rising edge of clock Clk.

In some embodiments, second minority gate 606 at the first level has inputs of (a=inverted clock, b=delayed clock, c=0, d=Qb, e=Qb). At the rising edge of Clk, second minority gate 606 receives (a=0, b=0, c=0, d=Qb, e=Qb). Therefore, second minority gate 606 outputs 1 regardless of the value of Qb, in accordance with some embodiments. The outputs D and 0 of both of first level minority gates 605 and 606, respectively, at the rising edge go to second level 3-input minority gate 607. And since, second level 3-input minority gate 607 receives (a=D, b=0, c=1) as inputs, second level 3-input minority gate 607 outputs inverted data signal (Db as Qb) as the output. Finally, this output Qb is inverted to get back the signal of Q=D during the rising edge of the clock Clk.

In some embodiments, during the falling edge of Clk, first minority gate 605 receives (a=0, b=0, c=inverted data, d=0, and e=0), which outputs out1=1, regardless of the data value of D. In some embodiments, during the falling edge of Clk, second minority gate 606 at the first level receives (a=1, b=1, c=0, d=Qb, e=Qb). Therefore, second minority gate 606 outputs Q. In various embodiments, third minority gate 607 at the second level receives (a=1, b=0, and c=out2). The output of third minority gate 607 is Qb, which feeds back to second minority gate 606 at the first level. Examples of majority, minority, and threshold gates are provided with reference to FIGS. 7A-C.

Figure 6B:
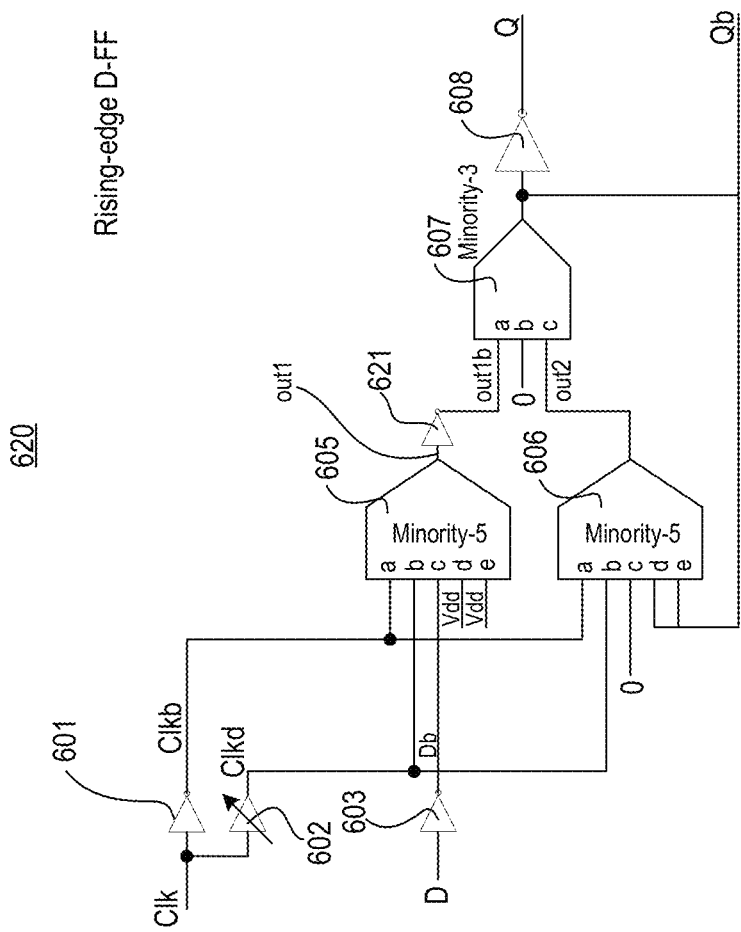
FIG. 6B illustrates a rising-edge flip-flop with 5-input minority gates and a 3-input minority gate, in accordance with some embodiments.

FIG. 6B illustrates rising-edge flip-flop 620 with 5-input minority gates and a 3-input minority gate, in accordance with some embodiments. Compared to FF 600, here two inputs 'd' and 'e' of 5-input minority gate 605 are coupled to a logic high (e.g., tied to supply node Vdd). In some embodiments, 5-input minority gate 605 and 5-input minority gate 606 receive Clkb as input at respective inputs 'a'. In some embodiments, 5-input minority gate 605 and 5-input minority gate 606 receive Clkd as input on respective inputs 'b'. Note Clkd is a delayed version of Clk. In some embodiments, inverted version of data D (e.g., Db) is received by 5-input minority gate 605 at input 'c'. In various embodiments, two inputs 'd' and 'e' of 5-input minority gate 406 are coupled to output Qb, which is an output of 3-input minority gate 607. The output out1 of 5-input minority gate 605 is inverted by inverter 621. The output of inverter is out1b which is provided as input to 3-input minority gate 607. In various embodiments, the inverters herein can be replaced with other inverting gates such as NAND gates, NOR gates, with extra knob to control or gate the output. As discussed herein, the minority gates can be replaced with majority gates (or threshold gates) after taking care of logic inversion to achieve the same function. Compared to rising-edge FF 600, rising-edge FF 620 uses one less inverter. FF 620 behaves in a similar fashion to as FF 600 of FIG. 6A. Here, other than first 5-input minority gate 605 at the first level, which now gets inputs of (a=inverted clock, b=delayed clock, c=Db, d=1, e=1) logic levels, other gates are connected in a similar fashion and operate similar to FF 600. At the rising edge of Clk, first 5-input minority gate 605 gets the inputs of (a=0, b=0, c=Db, d=1, e=1) and hence it outputs out1=D at the rising edge of clock Clk. The operation of FF 620 at the falling edge of clock Clk is like the operation of FF 600 described with reference to FIG. 6A.

Figure 6C:
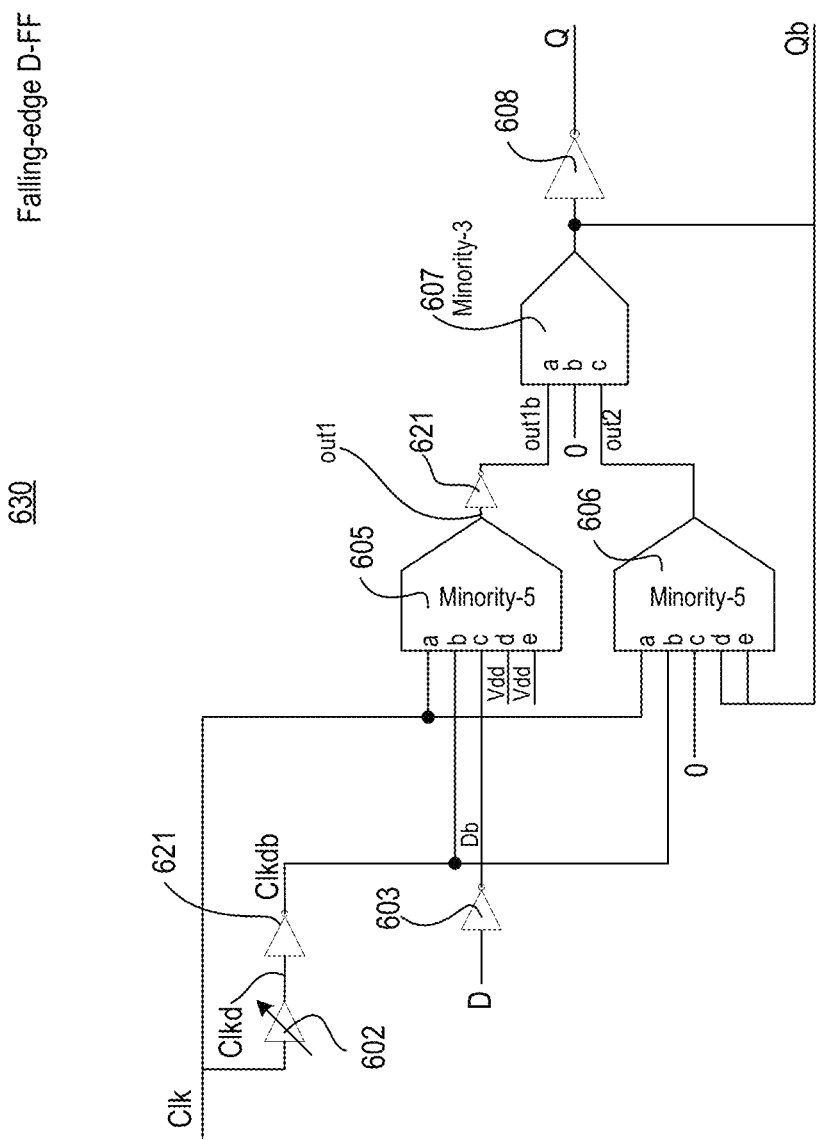
FIG. 6C illustrates a falling-edge flip-flop with 5-input minority gates and a 3-input minority gate, in accordance with some embodiments.

FIG. 6C illustrates falling-edge flip-flop 630 with 5-input minority gates and a 3-input minority gate, in accordance with some embodiments. Falling-edge flipflops can be obtained by using the inverted (Clk and Clkd) signals from those used in a rising-edge flipflop and keeping the other components the same. For example, if Clkb is connected to a gate in rising-edge FF, in a falling edge FF, Clk is connected to the same gate. Similarly, if Clkd is connected to a gate in a rising-edge FF, in falling edge FF, Clkdb is connected to that gate.

Compared to FF 600, here two inputs 'd' and 'e' of 5-input minority gate 605 are coupled to a logic high (e.g., tied to supply node Vdd). In some embodiments, 5-input minority gate 605 and 5-input minority gate 606 receive Clk as input at respective inputs 'a'. In some embodiments, 5-input minority gate 605 and 5-input minority gate 606 receive Clkbd as input at nodes 'b', which is a delayed and inverted version of Clk. In some embodiments, inverted version of data D (e.g., Db) is received by 5-input minority gate 605 at input 'c'. In various embodiments, two inputs 'd' and 'e' of 5-input minority gate 606 are coupled to output Qb, which is an output of 3-input minority gate 607. The output out1 of 5-input minority gate 605 is inverted by inverter 621. The output of inverter is out1*b* which is provided as input to 3-input minority gate 607. In various embodiments, the inverters herein can be replaced with other inverting gates such as NAND gates, NOR gates, with extra knob to control or gate the output. As discussed herein, the minority gates can be replaced with majority gates (or threshold gates) after taking care of logic inversion to achieve the same function. Here, both first level gates (e.g., 5-input minority gate 605 and 5-input minority gate 606) receives Clk and Clkdb signals. Both these signals Clk and Clkdb are high when there is rising edge on Clk, and both signals Clk and Clkdb are low when there is a falling edge on Clk. On the falling edge of Clk, data D is passed through the first minority gate 605 since the inputs are (a=0, b=0, c=Db, d=Vdd, and e=Vdd) and the output ou1 of minority gate 605 becomes D. Outputs of other gates are set similarly.

Figure 6D:
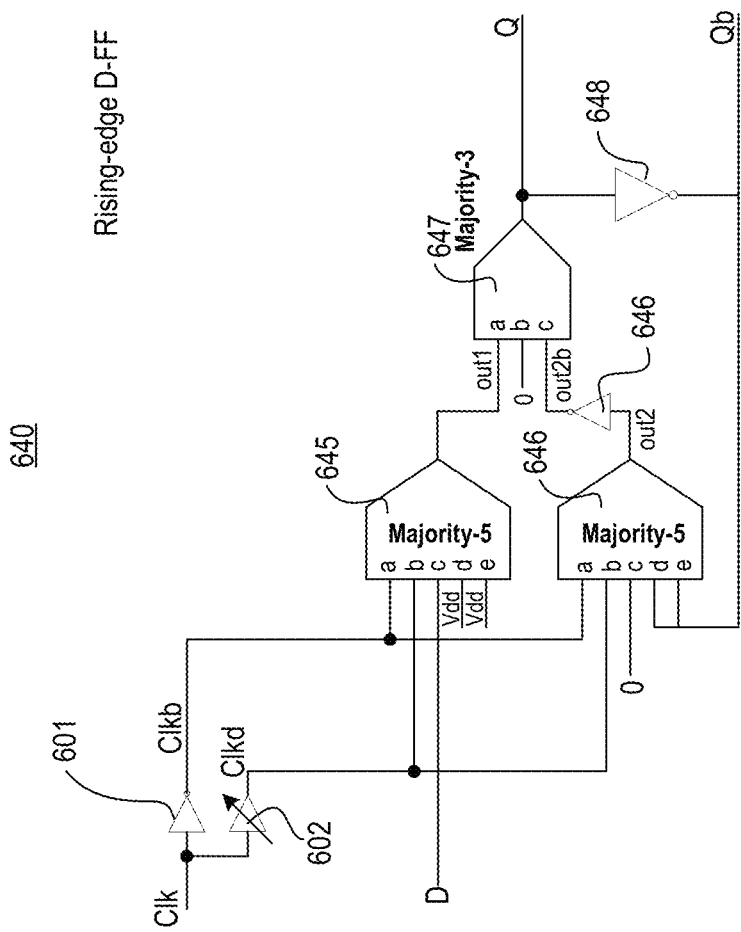
FIG. 6D illustrates a rising-edge flip-flop with 5-input majority gates and a 3-input majority gate, in accordance with some embodiments.

FIG. 6D illustrates rising-edge flip-flop 640 with 5-input majority gates and a 3-input majority gate, in accordance with some embodiments. Compared to FF 620, here two 5-input minority gate 605, 5-input minority gate 606, and 5-input minority gate 607 are replaced with 5-input majority gate 645, 5-input majority gate 646, and 5-input majority gate 647, respectively. Note, a minority gate can be converted into a majority gate by adding an inverter at the output of the majority gate or removing an inverter at the output of a minority gate. In various embodiments, inputs 'd' and 'e' of 5-input majority gate 645 are coupled to a logic high (e.g., tied to supply node Vdd). In some embodiments, 5-input majority gate 645 and 5-input majority gate 646 receive Clkb as input at respective inputs 'a'. In some embodiments, 5-input majority gate 645 and 5-input majority gate 646 receive Clkd as input on respective inputs 'b'. Note Clkd is a delayed version of Clk. In some embodiments, data D is received by 5-input majority gate 645 at input 'c'. In various embodiments, the inverters herein can be replaced with other inverting gates such as NAND gates, NOR gates, with extra knob to control or gate the output. In various embodiments, two inputs 'd' and 'e' of 5-input majority gate 646 are coupled to output Qb, which is an inverted output of 3-input majority gate 647 via inverter 648. In various embodiments, the inverters herein can be replaced with other inverting gates such as NAND gates, NOR gates, with extra knob to control or gate the output. FF 640 works like FF 630 but with optimized for inverters. As such, one less inverter is used in FF 640 than FF 630. FF of FIG. 6D works like FF of FIG. 6B at the rising edge of clock Clk. FF 640 is built with majority gates instead of minority gates but preserves the functionality of FF 620. A minority gate can be disintegrated into a majority gate and an inverter. Two inverters can be canceled out with each other to achieve the equivalent Boolean function. For example, here two inverters cancel out each other and are not used for logical operation but might be useful to provide extra drive strength.

Figure 6E:
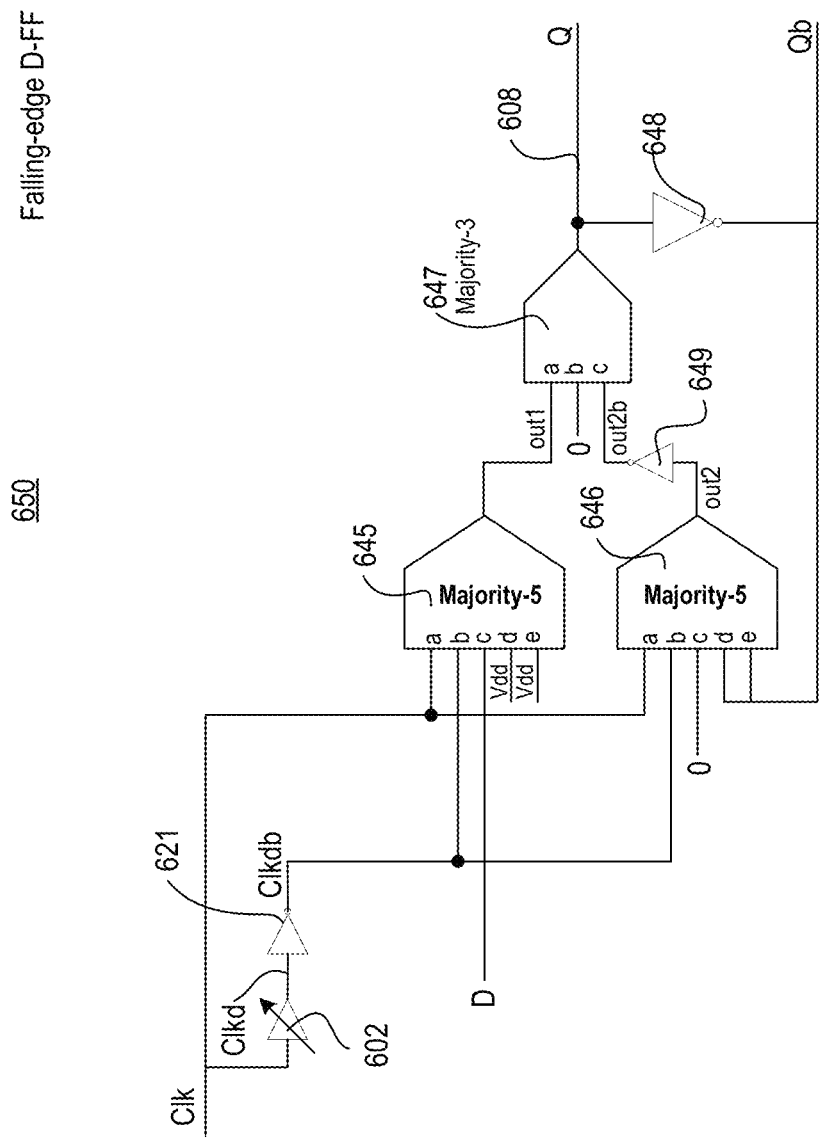
FIG. 6E illustrates a falling-edge flip-flop with 5-input majority gates and a 3-input majority gate, in accordance with some embodiments.

FIG. 6E illustrates falling-edge flip-flop 650 with 5-input majority gates and a 3-input majority gate, in accordance with some embodiments. Falling-edge flipflops can be obtained by using the inverted (Clk and Clkd) signals from those used in a rising-edge flipflop and keeping the other components the same. For example, if Clkb is connected to a gate in rising-edge FF, in a falling edge FF, Clk is connected to the same gate. Similarly, if Clkd is connected to a gate in a rising-edge FF, in falling edge FF, Clkdb is connected to that gate.

Compared to FF 630, 5-input minority gate 605, 5-input minority gate 606, and 3-input minority gate 607 are replaced with 5-input majority gate 645, 5-input majority gate 646, and 3-input majority gate 647. Here two inputs 'd' and 'e' of 5-input majority gate 645 are coupled to a logic high (e.g., tied to supply node Vdd). In some embodiments, 5-input majority gate 645 and 5-input majority gate 646 receive Clkb as input at respective inputs 'a'. In some embodiments, 5-input majority gate 645 and 5-input majority gate 646 receive Clkd as input at nodes 'b', which is a delayed version of Clk. In some embodiments, data D is received by 5-input majority gate 645 at input 'c'. In various embodiments, two inputs 'd' and 'e' of 5-input majority gate 646 are coupled to output Qb, which is an inverted output of 3-input majority gate 647 via inverter 648. In some embodiments, an inverted version of output out2 of 5-input majority gate 646 is generated by inverter 646. This inverted version out2*b* is then input to 3-input majority gate 647, which also receives an input set at ground. In various embodiments, the inverters herein can be replaced with other inverting gates such as NAND gates, NOR gates, with extra knob to control or gate the output. Here, data D is captured like FF 630 but that the falling edge of Clk and Clkdb signals. FIG. 6E is functionally equivalent to FIG. 6C with equivalent boolena functionality using majority gates, and works at the falling edge of Clk. The inverters are also optimized resulting in one less inverter compared to FF 630.

Figure 6F:
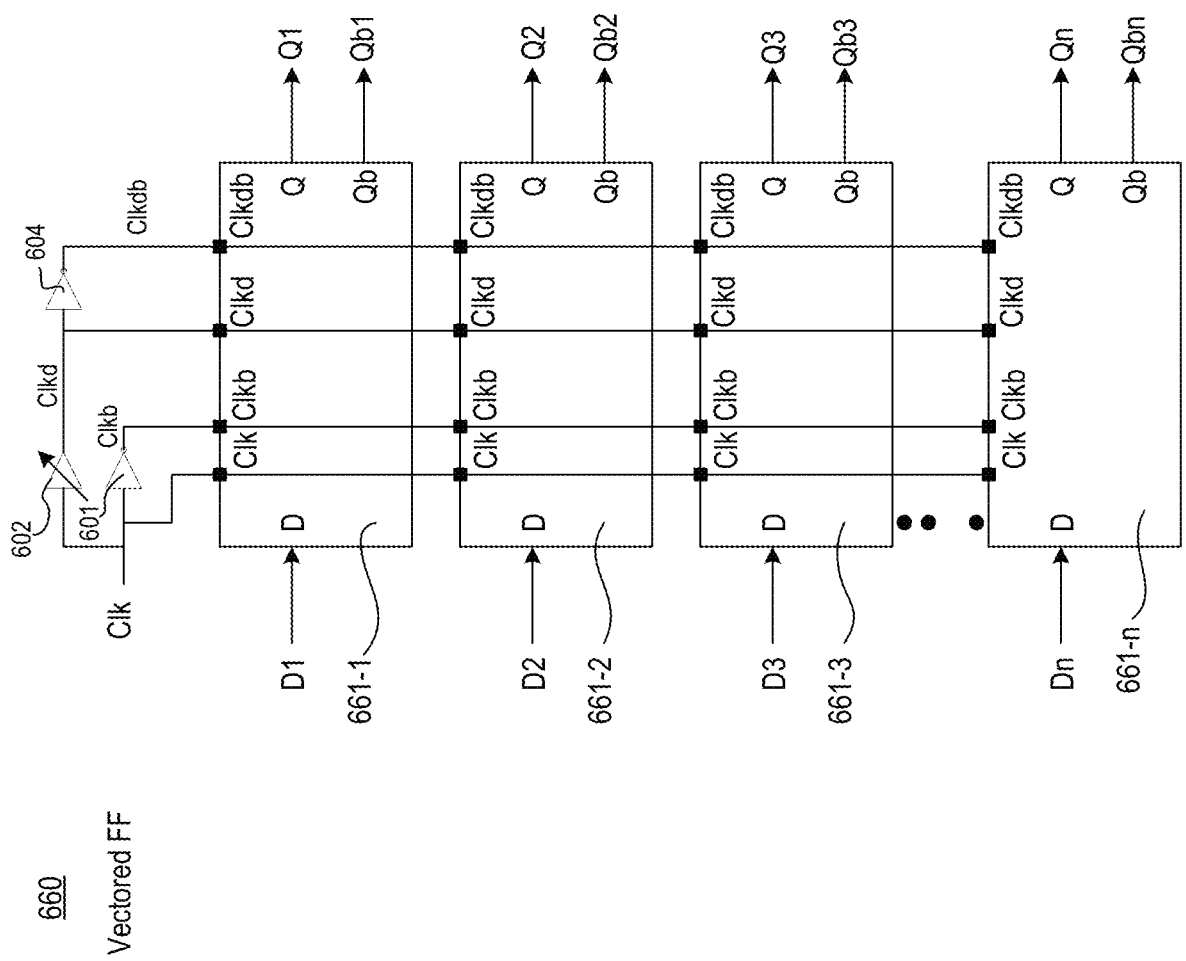
FIG. 6F illustrates a vectored flip-flop or latch using any of the flip-flop or latch designs described herein, in accordance with some embodiments.

FIG. 6F illustrates a vectored flip-flop or latch 660 using any of the flip-flop or latch designs described herein, in accordance with some embodiments. In some embodiments, several instances of FFs or latches 661-1 through **661-*n* (where 'n' is a number greater than 1) are clubbed or grouped together such that they share same clocks and their derivative signals (e.g., Clk, Clkb, Clkd, Clkdb). By sharing the clock and its derivative(s), area and power is reduced. In some embodiments, inverters, and delay stage(s) 601, 604, and 602 are shared by the FFs or latches. Each FF or latch can be any of the FFs or latches discussed herein with reference to various figures including implementations of FIG. 1A, FIG. 3A, FIG. 3C, FIG. 4, FIG. 5, and FIGS. 6A-E**.

In some instances, the FFs or latches in the vectored FF or latch may not need all the clock derivatives. For example, delay stage 602 and its inverter 604 may be removed. Each instance of FF or latch in the vectored FF or latch 660 receives its data and generates its corresponding sampled or latched outputs. For example, FF or latch 661-1 receives data D1 and generates outputs Q1 and Qb1, where Qb1 is an inverse of Qb1, FF or latch 661-2 receives data D2 and generates outputs Q2 and Qb2, where Qb2 is an inverse of Qb2, FF or latch 661-3 receives data D3 and generates outputs Q3 and Qb3, where Qb3 is an inverse of Qb3, and FF or latch 661-n receives data Dn and generates outputs Qn and Qbn, where Qbn is an inverse of Qbn.

Figure 7A:
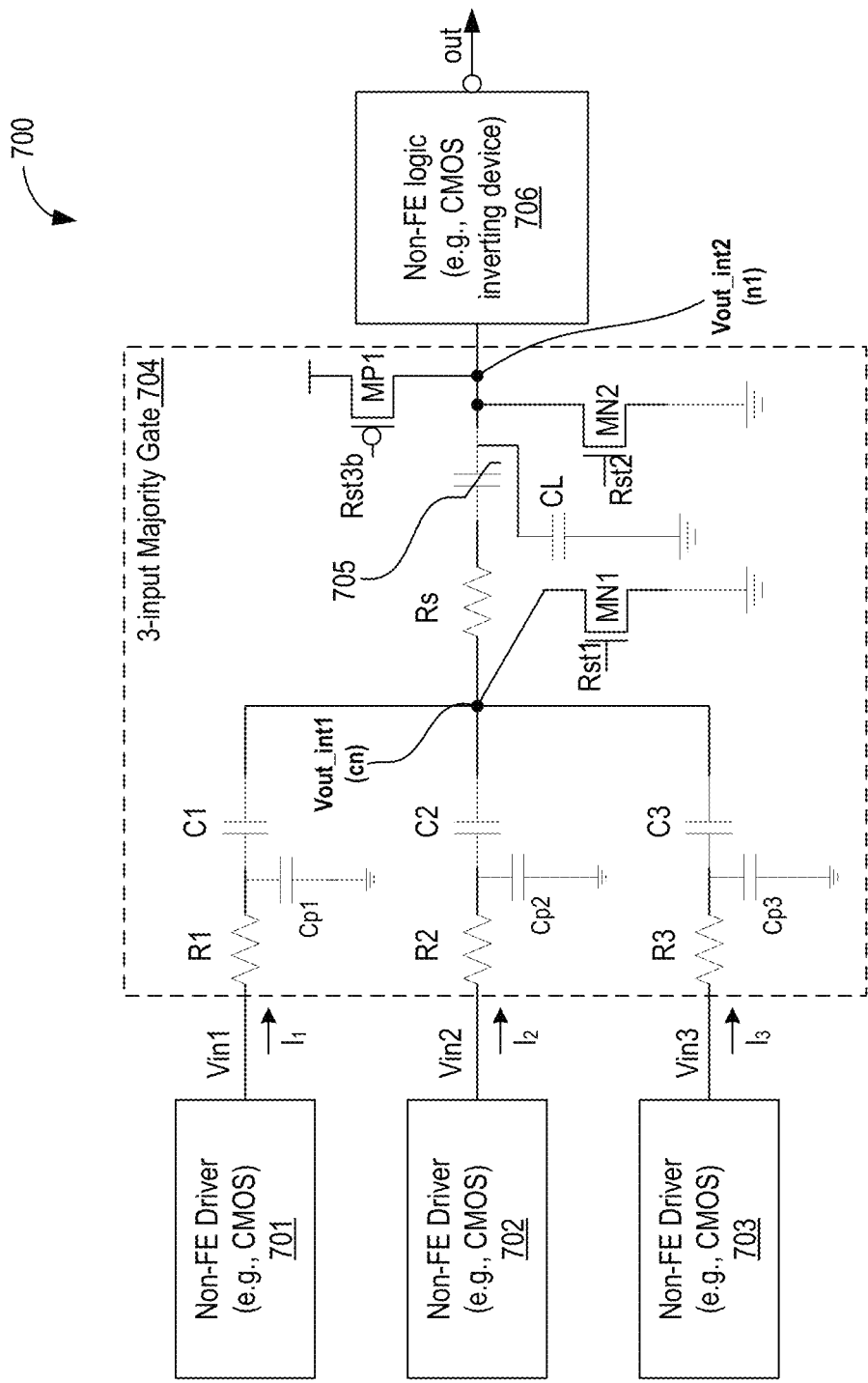
FIG. 7A illustrates a 3-input majority or minority gate with linear input capacitors and non-linear output capacitor, in accordance with some embodiments.

FIG. 7A illustrates 3-input majority or minority gate 700 with linear input capacitors and non-linear output capacitor, in accordance with some embodiments. Logic Gate 700 comprises first, second, and third drivers 701, 702, and 703, respectively. These drivers can be analog drivers generating analog signals or digital drivers generating signals that toggle between ground and the power supply rail, or a combination of analog or digital drivers. For example, driver 701 is a CMOS driver such as a buffer, inverter, a NAND gate, NOR gate, etc., while driver 702 is an amplifier generating a bias signal. The drivers provide input signals Vin1 (and current $I_1$), Vin2 (and current $I_2$), and Vin3 (and current $I_3$) to the three inputs of 3-input majority gate 704.

In various embodiments, 3-input majority gate 704 comprises three input nodes Vin1, Vin2, and Vin3. Here, signal names and node names are interchangeably used. For example, Vin1 refers to node Vin1 or signal Vin1 depending on the context of the sentence. 3-input majority gate 703 further comprises capacitors C1, C2, and C3. Here, resistors R1, R2, and R3 are interconnect parasitic resistances coupled to capacitors C1, C2, and C3 respectively. In various embodiments, capacitors C1, C2, and C3 are non-ferroelectric capacitors. In some embodiments, the non-ferroelectric capacitor includes one of: dielectric capacitor, paraelectric capacitor, or non-linear dielectric capacitor.

A dielectric capacitor comprises first and second metal plates with a dielectric between them. Examples of such dielectrics are: HfO, ABO3 perovskites, nitrides, oxy-fluorides, oxides, etc.

A paraelectric capacitor comprises first and second metal plates with a para-electric material between them. In some embodiments, f-orbital materials (e.g., lanthanides) are doped to the ferroelectric materials to make paraelectric material. Examples of room temperature paraelectric material include: SrTiO3, Ba(x)Sr(y)TiO3 (where x is −0.5, and y is 0.95)), HfZrO2, Hf—Si—O, La-substituted PbTiO3, PMN-PT based relaxor ferroelectrics.

A dielectric capacitor comprises first and second metal plates with non-linear dielectric capacitor between them. The range for dielectric constant is 1.2 to 10000. The capacitors C1, C2, and C3 can be implemented as MIM (metal-insulator-metal) capacitor technology, transistor gate capacitor, hybrid of metal capacitors or transistor capacitor. The capacitors C1, C2, and C3 can be implemented as MIM (metal-insulator-metal) capacitor technology, transistor gate capacitor, or hybrid of metal capacitors or transistor capacitor.

One terminal of the capacitors C1, C2, and C3 is coupled to a common node cn. This common node is coupled to node n1, which is coupled to a first terminal of a non-linear polar capacitor 705. The majority function is performed at the common node cn, and the resulting voltage is projected on to capacitor 705. For example, the majority function of the currents ($I_1$, $I_2$, and $I_3$) on node cn results in a resultant current that charges capacitor 705. Table 1 illustrates the majority function f(Majority Vin1, Vin2, Vin3).

TABLE 1

| Vin1 | Vin2 | Vin3 | cn (f(Majority Vin1, Vin2, Vin3)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

Referring to FIG. 7A, in some embodiments, N odd number of capacitors are coupled to a single FEC to form a majority gate. In this case, N=3. The measured charge on the FEC ($Q_F$) is the output of the majority gate. Solving for a steady-state solution, the parasitic resistors are ignored and the input potentials $V_i$ (or Vin) are assumed to be constant. In this case, the charge across each linear capacitor (C1, C2, C3) is:

$$Q_i = C_i(V_i - V_F) \quad (1)$$

The charge summed at node Cn and across FEC 705 is express as:

$$Q_F = \sum_i Q_i \quad (2)$$

$$Q_F = \sum_i C_i V_i - \sum_i C_i V_F \quad (3)$$

$$Q_F = \sum_i C_i V_i - C V_F(Q_F) \quad (4)$$

$$V_F(Q_F) = \sum_i \frac{C_i}{C} V_i - \frac{Q_F}{C} \quad (5)$$

Here, $C = \sum_i C_i$ is the sum of the capacitances. In the limit, $C \to \infty$, the following is achieved:

$$V_F(Q_F) = \sum_i \frac{C_i}{C} V_i = \overline{V} \quad (6)$$

The potential across FEC 705 is the average of all the input potentials weighted by the capacitances (e.g., C1, C2, and C3).

When $C_i = C/N$ are all equal, $V_F$ is just a simple mean. To ensure that $$Q_F = V_F^{-1}(\overline{V}) \quad (7)$$

is well defined, all possible values of $\overline{V}$ have magnitudes greater than $V_c$, the coercive potential. Assuming binary input of $+/-V_s$, the potential with the smallest magnitude is:

$$V = V_s/N \quad (8)$$

This occurs when $(N+1)/2$ of the inputs are $+V_s$ and $(N-1)/2$ are $-V_s$. Then, $$V_s > NV_c \quad (9)$$

As an example, for N=3, the possible inputs are:

$$V \in \left\{ -\frac{3}{3}V_s, -\frac{1}{3}V_s, +\frac{1}{3}V_s, +\frac{3}{3}V_s \right\} \quad (10)$$

Referring to FIG. 7A, since capacitor 705 is a non-linear polar capacitor, both terminals of the capacitor are pre-discharged to ground or to a known predetermined voltage via n-type transistors pull-down transistors MN1 and MN2, and p-type pull-up transistors. The predetermined voltage can be programmable. The pre-determined voltage can be positive or negative. In some embodiments, n-type transistor MN1 is coupled to node Vout_int1 (internal Vout node) and is controllable by clock or reset signal Rst1. In some embodiments, n-type transistor MN2 is coupled to node Vout_int2 (internal Vout node) and is controllable by clock or reset signal Rst2. In some embodiments, p-type transistor MP1 is coupled to node Vout_int2 and is controllable by Rst3b.

In some embodiments, the n-type transistors MN1 and MN2 are replaced with p-type transistors to pre-charge both terminals (Vout_int1 and Vout_int2) of capacitor 705 to a supply voltage or another predetermined voltage, while the p-type transistor MP1 is replaced with an n-type transistor coupled to ground or a negative supply rail. The predetermined voltage can be programmable. The pre-determined voltage can be positive or negative.

In some embodiments, the pre-charge or pre-discharge of the terminals of capacitor 705 (or nodes cn and n1) is done periodically by a control signals Rst1, Rst2, and Rst3b. The controls can be a non-clock signal that is generated by a control logic (not shown). For example, the control can be issued every predetermined or programmable time. In some embodiments, control signals Rst1, Rst2, and Rst3b are issued in a reset phase, which is followed by an evaluation phase where inputs Vin1, Vin2, and Vin3 are received, and majority function is performed on them.

Rst1 has a pulse larger than the pulse widths of Rst2 and Rst3b. Rst3b is an inverse of Clk3 (not shown). In some embodiments, Rst1 is first asserted which begins to discharge node Vout_int1. While node Vout_int1 is being discharged, Rst2 is asserted. Rst2 may have a pulse width which is substantially half of the pulse width of Rst1. When Rst2 is asserted, node Vout_int2 is discharged. This sequence assures that both terminals of the non-linear polar material of capacitor 705 are discharged sequentially. In various embodiments, before discharging node Vout_int2, Rst3b is de-asserted which turns on transistor MP1, causing Vout_int2 to be charged to a predetermined value (e.g., supply level). The pulse width of Rst3b is smaller than the pulse width of Rst1 to ensure the Rst3b pulsing happens within the Rst1 pulse window. This is useful to ensure non-linear polar capacitor 705 is initialized to a known programmed state along with the other capacitors (e.g., C1, C2, C3) which are initialized to 0 V across them. The pulsing on Vout_int2 creates the correct field across the non-linear polar capacitor 705 in conjunction with Vout_int1 to put it in the correct state, such that during operating mode, if Vout_int1 goes higher than Vc value (coercive voltage value), it triggers the switching for non-linear polar capacitor 705, thereby resulting into a voltage build up on Vout_int2.

In some embodiments, load capacitor CL is added to node Vout_int2. In some embodiments, load capacitor CL is a regular capacitor (e.g., a non-ferroelectric capacitor). The capacitance value of CL on Vout_int2 is useful to ensure that the FE switching charge (of FE capacitor 705) provides the right voltage level. For a given FE size (area A), with polarization switching density (dP) and desired voltage swing of Vdd (supply voltage), the capacitance of CL should be approximately CL=dP*A/Vdd. There is slight deviation from the above CL value as there is charge sharing on Vout_int2 due to dielectric component of FE capacitor 705. The charge sharing responds relative to voltage on Vout_int1, and capacitor divider ratio between the dielectric component of the FE capacitor 705, and load capacitor (CL). Note, the capacitance of CL can be aggregate of all the capacitances (e.g., parasitic routing capacitance on the node, gate capacitance of the output stage 706, and drain or source capacitance of the reset devices (e.g., MN2, MP1) on the Vout_int2 node. In some embodiments, for a given size of non-linear polar capacitor 705, CL requirement can be met by just the load capacitance of non-FE logic 706, and parasitic component itself, and may not need to have it as a separate linear capacitor.

In some embodiments, the non-linear polar material of capacitor 705 includes one of: ferroelectric (FE) material, paraelectric material, relaxor ferroelectric, or non-linear dielectric. In various embodiments, para-electric material is the same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as para-electric materials, relaxors, and dipolar glasses.

In some embodiments, f-orbital materials (e.g., lanthanides) are doped to the ferroelectric material to make paraelectric material. Examples of room temperature paraelectric material include: SrTiO3, Ba(x)Sr(y)TiO3 (where x is −0.5, and y is 0.95), HfZrO2, Hf—Si—O, La-substituted PbTiO3, PMN-PT based relaxor ferroelectrics.

In various embodiments, the FE material can be any suitable low voltage FE material that allows the FE material to switch its state by a low voltage (e.g., 100 mV). In some embodiments, the FE material comprises a perovskite of the type ABO₃, where 'A' and B' are two cations of different sizes, and 'O' is oxygen which is an anion that bonds to both the cations. Generally, the size of A atoms is larger than the size of B atoms. In some embodiments, the perovskite can be doped (e.g., by La or Lanthanides). Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3 to 2%. For chemically substituted BiFeO3, BiCrO3, BiCoO3 class of materials, La or rare earth substitution into the Bi site can tune the spontaneous distortion.

Threshold in the FE material has a highly non-linear transfer function in the polarization vs. voltage response. The threshold is related to a) non-linearity of switching transfer function; and b) the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of the FE layer. A perfect epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, LaNiO3, and ReO3.

In some embodiments, the FE material comprises a stack of layers including low voltage FE material between (or sandwiched between) conductive oxides. In various embodiments, when FE material is a perovskite, the conductive oxides are of the type AA'BB'O$_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element such as: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides adjacent to the FE material are of A2O3 (e.g., In2O3, Fe2O3) and AB2O3 type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material for storing the charge state, the embodiments are also applicable for paraelectric material. For example, the capacitor of various embodiments can be formed using paraelectric material instead of ferroelectric material.

In some embodiments, the FE material includes one of: Hafnium (Hf), Zirconium (Zr), Aluminum (Al), Silicon (Si), their oxides or their alloyed oxides. In some embodiments, FE material includes one of: Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, the FE material includes Bismuth ferrite (BFO), lead zirconate titanate (PZT), BFO with doping material, or PZT with doping material, wherein the doping material is one of Nb or; and relaxor ferroelectrics such as PMN-PT.

In some embodiments, the FE material includes Bismuth ferrite (BFO), BFO with a doping material where in the doping material is one of Lanthanum, or any element from the lanthanide series of the periodic table. In some embodiments, the FE material includes lead zirconium titanate (PZT), or PZT with a doping material, wherein the doping material is one of La, Nb. In some embodiments, the FE material includes a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST).

In some embodiments, the FE material includes Hafnium oxides of the form, Hf1-x Ex Oy where E can be Al, Ca, Ce, Dy, er, Gd, Ge, La, Sc, Si, Sr, Sn, or Y. In some embodiments, FE material 705 includes Niobate type compounds LiNbO3, LiTaO3, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used.

In some embodiments, the FE material comprises organic material. For example, Polyvinylidene fluoride or polyvinylidene difluoride (PVDF).

The FE material is between two electrodes. These electrodes are conducting electrodes. In some embodiments, the electrodes are perovskite templated conductors. In such a templated structure, a thin layer (e.g., approximately 10 nm) of a perovskite conductor (such as SrRuO3) is coated on top of IrO2, RuO2, PdO2, or PtO2 (which have a non-perovskite structure but higher conductivity) to provide a seed or template for the growth of pure perovskite ferroelectric at low temperatures. In some embodiments, when the ferroelectric comprises hexagonal ferroelectric material, the electrodes can have hexagonal metals, spinels, or cubic metals. Examples of hexagonal metals include: PtCoO2, PdCoO2, and other delafossite structured hexagonal metallic oxides such as Al-doped ZnO. Examples of spinels include Fe3O4 and LiV2O4. Examples of cubic metals include Indium Tin Oxide (ITO) such as Sn-doped In2O3.

The charge developed on node n1 produces a voltage and current that is the output of the majority gate 704. Any suitable driver 706 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, etc. In some embodiments, output "out" is reset by driver 706 via Rst1 signal. For example, NAND gate with one input coupled to Vout_int2 and the other input coupled to Rst1 can be used to reset "out" during a reset phase.

While FIG. 7A illustrates a 3-input majority gate, the same concept can be extended to more than 3 inputs to make an N-input majority gate, where N is greater than 2. For example, a 5-input majority gate is like 3-input majority gate 704 but for additional inputs Vin4 and Vin5. These inputs can come from the same drivers (e.g., any one of drivers 701, 702, 703) or from different drivers. Input Vin4 and Vin5 can be analog, digital, or a combination of them. For example, Vin4 is a digital signal while Vin5 is an analog signal. The additional inputs Vin4 and Vin5 are coupled to additional non-ferroelectric capacitors C4 and C5, respectively (not shown). The composition and size of the capacitors C4 and C5 are like that of C1, C2, and C3. Here, resistors R4 and R5 are parasitic resistors.

The majority function is performed at the common node cn, and the resulting voltage is projected on to capacitor 705. For example, the majority function of the currents ($I_1$, $I_2$, $I_3$, $I_4$, and $I_5$) on node cn results in a resultant current that charges capacitor 705. Table 2 illustrates the majority function f(Majority Vin1, Vin2, Vin3, Vin4, Vin5) of a 5-input majority gate.

TABLE 2

| Vin1 | Vin2 | Vin3 | Vin4 | Vin5 | cn (f(Majority Vin1, Vin2, Vin3, Vin4, Vin5)) |
|---|---|---|---|---|---|
| 0 | 0 | 0 | 0 | 0 | 0 |
| 0 | 0 | 0 | 0 | 1 | 0 |
| 0 | 0 | 0 | 1 | 0 | 0 |
| 0 | 0 | 0 | 1 | 1 | 0 |
| 0 | 0 | 1 | 0 | 0 | 0 |
| 0 | 0 | 1 | 0 | 1 | 0 |
| 0 | 0 | 1 | 1 | 0 | 0 |
| 0 | 0 | 1 | 1 | 1 | 1 |
| 0 | 1 | 0 | 0 | 0 | 0 |
| 0 | 1 | 0 | 0 | 1 | 0 |
| 0 | 1 | 0 | 1 | 0 | 0 |
| 0 | 1 | 0 | 1 | 1 | 0 |
| 0 | 1 | 1 | 0 | 0 | 0 |
| 0 | 1 | 1 | 0 | 1 | 1 |
| 0 | 1 | 1 | 1 | 0 | 1 |
| 0 | 1 | 1 | 1 | 1 | 1 |
| 1 | 0 | 0 | 0 | 0 | 0 |
| 1 | 0 | 0 | 0 | 1 | 0 |
| 1 | 0 | 0 | 1 | 0 | 0 |
| 1 | 0 | 0 | 1 | 1 | 1 |
| 1 | 0 | 1 | 0 | 0 | 0 |
| 1 | 0 | 1 | 0 | 1 | 1 |
| 1 | 0 | 1 | 1 | 0 | 1 |
| 1 | 0 | 1 | 1 | 1 | 1 |
| 1 | 1 | 0 | 0 | 0 | 0 |
| 1 | 1 | 0 | 0 | 1 | 1 |
| 1 | 1 | 0 | 1 | 0 | 1 |
| 1 | 1 | 0 | 1 | 1 | 1 |
| 1 | 1 | 1 | 0 | 0 | 1 |
| 1 | 1 | 1 | 0 | 1 | 1 |
| 1 | 1 | 1 | 1 | 0 | 1 |
| 1 | 1 | 1 | 1 | 0 | 1 |

Figure 7B:
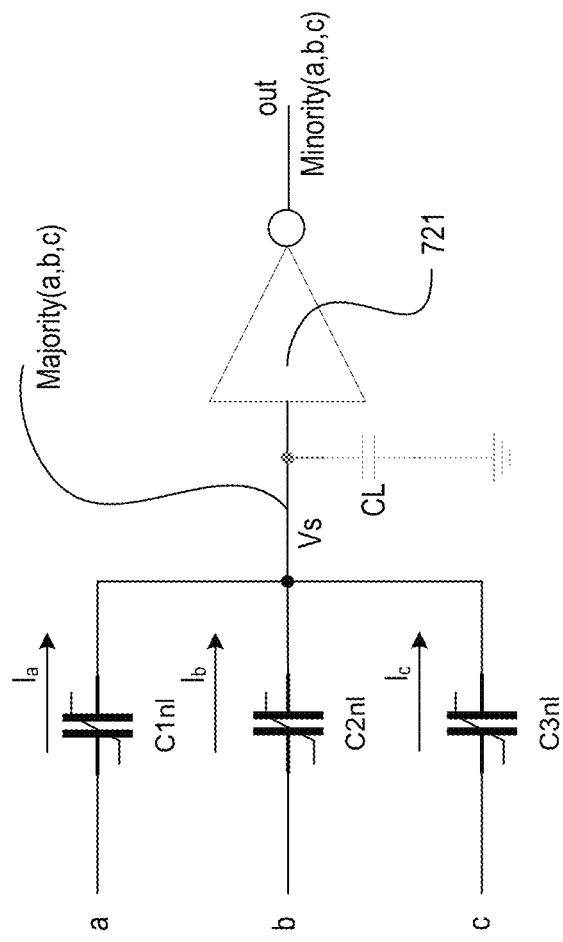
FIG. 7B illustrates a 3-input majority or minority gate with non-linear input capacitors, in accordance with some embodiments.

FIG. 7B illustrates 3-input majority or minority gate 720 with non-linear input capacitors, in accordance with some embodiments. In some embodiments, 3-input majority gate 720 comprises non-linear input capacitors C1n1, C2n1, and C3n1 that receives digital signals a, b, and c, respectively. Here, signal names and node names are interchangeably used. For example, 'a' refers to node 'a' or signal 'a' depending on the context of the sentence. One end or terminal of capacitor C1n1 is coupled to node a while the other end of capacitor C1n1 is coupled to summing node Vs. The same is true for other non-linear capacitors C2n1 and C3n1 as shown. In some embodiments, 3-input majority gate 720 comprises a driver circuitry 721. In this example, driver circuitry 721 is an inverter. In other embodiments, other types of driver circuitries can be used such as NAND gate, NOR gate, multiplexer, buffer, and other logic gates. The majority function is performed at summing node Vs as Majority(a,b,c). In this example, since driver 721 is an inverter, minority function is performed at output "out" as Minority(a,b,c).

In some embodiments, in addition to the gate capacitance of driver circuitry 721, an additional linear capacitor CL is coupled to summing node Vs and ground as shown. In some embodiments, this linear capacitor CL is a non-ferroelectric capacitor. In some embodiments, the non-ferroelectric capacitor includes one of: dielectric capacitor, para-electric capacitor, or non-linear dielectric capacitor. A dielectric capacitor comprises first and second metal plates with a dielectric between them. Examples of such dielectrics are: HfO, ABO3 perovskites, nitrides, oxy-fluorides, oxides, etc. A paraelectric capacitor comprises first and second metal plates with a para-electric material between them. In some embodiments, f-orbital materials (e.g., lanthanides) are doped to the ferroelectric materials to make paraelectric material. Examples of room temperature paraelectric material include: SrTiO3, Ba(x)Sr(y)TiO3 (where x is −0.5, and y is 0.95)), HfZrO2, Hf—Si—O, La-substituted PbTiO3, PMN-PT based relaxor ferroelectrics. A dielectric capacitor comprises first and second metal plates with non-linear dielectric capacitor between them. The range for dielectric constant is 1.2 to 10000. The capacitor CL can be implemented as MIM (metal-insulator-metal) capacitor technology, transistor gate capacitor, hybrid of metal capacitors or transistor capacitor. The capacitor CL can be implemented as MIM (metal-insulator-metal) capacitor technology, transistor gate capacitor, or hybrid of metal capacitors or transistor capacitor. In various embodiments, there is enough capacitance on node Vs that the capacitor CL is not needed.

In some embodiments, the non-linear input capacitors C1n1, C2n1, and C3n1 comprise non-linear polar material. In some embodiments, the non-linear polar material includes one of: ferroelectric (FE) material, paraelectric material, relaxor ferroelectric, or non-linear dielectric. In various embodiments, para-electric material is the same as FE material but with chemical doping of the active ferroelectric ion by an ion with no polar distortion. In some cases, the non-polar ions are non-s orbital ions formed with p, d, f external orbitals. In some embodiments, non-linear dielectric materials are same as para-electric materials, relaxors, and dipolar glasses.

The majority function is performed at the summing node Vs, and the resulting voltage is projected on to capacitance of driver circuitry 721. Table 3 illustrates the majority function f(Majority a, b, c).

TABLE 3

| a | b | c | Vs (f(Majority a, b, c)) |
|---|---|---|---|
| 0 | 0 | 0 | 0 |
| 0 | 0 | 1 | 0 |
| 0 | 1 | 0 | 0 |
| 0 | 1 | 1 | 1 |
| 1 | 0 | 0 | 0 |
| 1 | 0 | 1 | 1 |
| 1 | 1 | 0 | 1 |
| 1 | 1 | 1 | 1 |

The charge developed on node Vs produces a voltage and current that is the output of the majority gate 720. Any suitable driver 721 can drive this output. For example, a non-FE logic, FE logic, CMOS logic, BJT logic, etc. can be used to drive the output to a downstream logic. Examples of the drivers include inverters, buffers, NAND gates, NOR gates, XOR gates, amplifiers, comparators, digital-to-analog converters, analog-to-digital converters, multiplexers, etc.

While FIG. 7B illustrates a 3-input majority gate, the same concept can be extended to more than 3 inputs to make an N-input majority gate, where N is greater than 2. In various embodiments, 'N' is an odd number. For example, a 5-input majority gate is similar to input majority gate 720 but for additional inputs 'd' and 'e' (not shown). These inputs can come from the same drivers or from different drivers.

In some embodiments, the 3-input majority gate can be configured as a fast inverter with a much faster propagation delay compared to a similar sized (in terms of area footprint) CMOS inverter. This is particularly useful when the inputs have a significantly slower slope compared to the propagation delay through the non-linear input capacitors. One way to configure the 3-input majority gate as an inverter is to set one input to a logic high (e.g., b=1) and set another input to a logic low (e.g., b=0). The third input is the driving input which is to be inverted. The inversion will be at the Vs node. The same technique can also be applied to N-input majority gate, where 'N' is 1 or any other odd number. In an N-input majority gate, (N−1)/2 inputs are set to '1' and (N−1)/2 inputs are set to '0', and one input is used to decide the inversion function. It will be appreciated that the various embodiments are described as a majority gate, the same concepts are applicable to a minority gate. In a minority gate the driving circuitry is an inverting circuitry coupled to the summing node Vs. The minority function is seen at the output of the inverting circuitry.

In some embodiments, (2N−1) input majority gate can operate as an N-input AND gate where (N−1) inputs of the majority gate are set to zero. The AND function will be seen at the summing node Vs. Similarly, N-input NAND, OR, NOR gates can be realized. In various embodiments, the summing node Vs is driven by a driver circuitry (e.g., inverter, buffer, NAND gate, AND gate, OR gate, NOR gate, or any other logic circuitry). However, driver circuitry 721 can be replaced with another majority or minority gate. In one such embodiment, the storage node Vs is directly coupled to a non-linear capacitor of another majority or minority gate.

Any logic function $f(x_1, x_2, \ldots x_n)$ can be represented by two levels of logic as given by the min-term expansion: $f(x_1, x_2, \ldots x_n) = \vee_{C_1, C_2, \ldots C_n} f(x_1, x_2, \ldots x_n) \hat{} x_1^{C_1} \hat{} x_2^{C_2} \hat{} x_3^{C_3} \ldots \hat{} x_n^{C_n}$ where $C_i$ is either 0 or 1. When $C_i$ is 1, $x_i^{C_i} = x_i$ (the input is used in its original form). When $C_i$ is 0, $x_i^{C_i} = \overline{x_i}$ (the input is used in its inverted form). The first level of logic is represented by at most $2_n$ AND gates ($\Delta$), one for each of the $2_n$ possible combinations of 0 and 1 for $C_1, C_2, \ldots C_n$. The second level of logic is represented by a single OR gate ($\vee$). Each operand of the OR gate is a representation of a row in the truth table for $f(x_1, x_2, \ldots x_n)$.

A (2N−1)-input majority gate can represent an N-input AND gate, by tying (N−1) of the majority gate's inputs to a ground level. Similarly, a (2N−1)-input majority gate can represent an N-input OR gate, by tying (N−1) of the majority gate's inputs to a supply level (Vdd). Since a majority gate can represent AND and OR gates, and the inputs to the AND and OR gates are either original or inverted forms of the input digital signals, any logic function can be represented by majority gates and inverters only, in accordance with some embodiments.

Figure 7C:
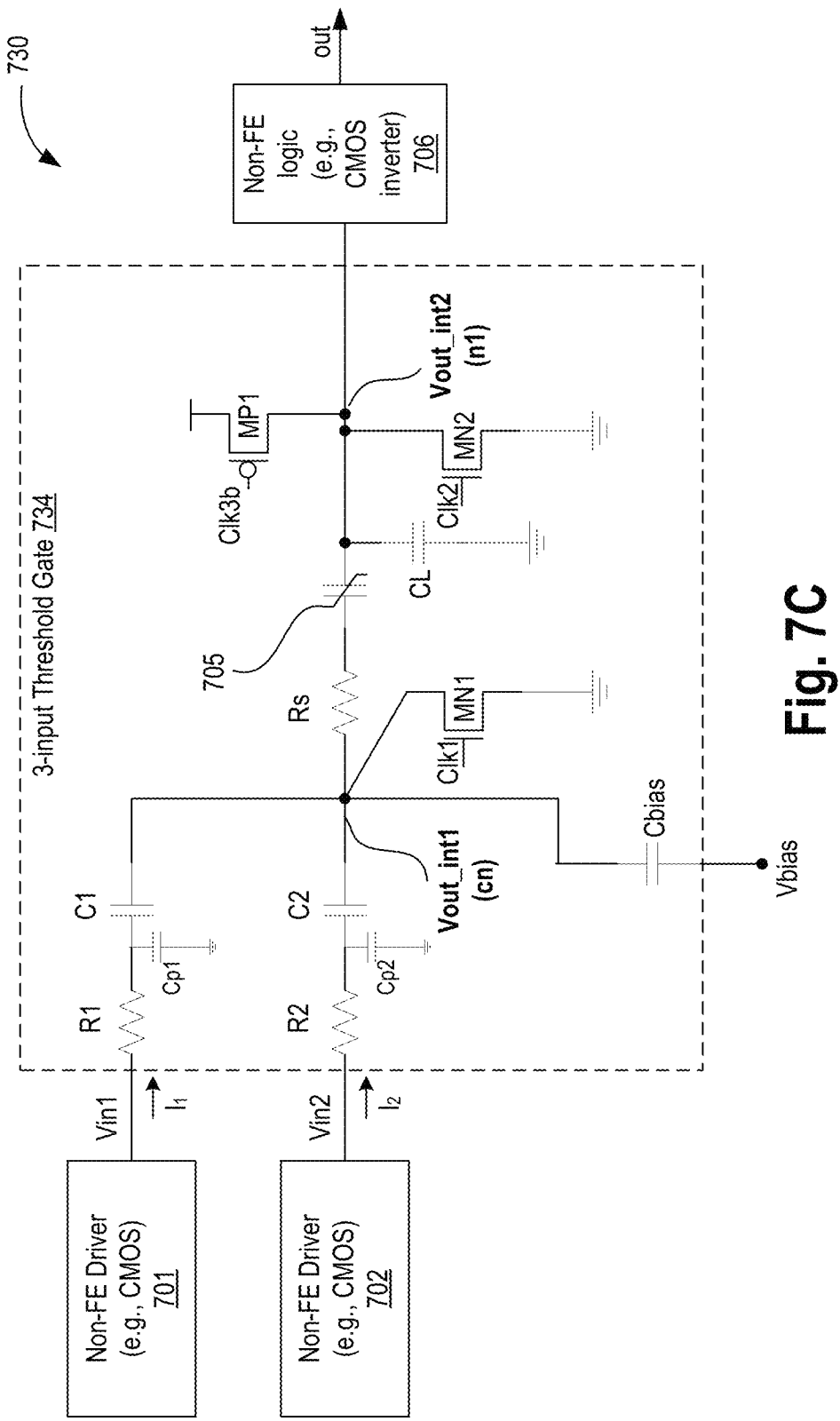
FIG. 7C illustrates a 3-input threshold gate with non-linear input capacitors, in accordance with some embodiments.

FIG. 7C illustrates 3-input threshold gate 730 with non-linear input capacitors, in accordance with some embodiments. Logic gate 200 is like logic gate 700 but for removing the third input Vin and adding an input Vbias. This additional input bias makes the logic gate a threshold gate 734. Threshold gate 734 is referred to as a 3-input threshold gate because of the three inputs Vin1, Vin2, and Vbias. It can also be referred to as 2-input threshold gate if the Vbias input is not counted as a separate input. In various embodiments, threshold gate 734 comprises an additional capacitor Cbias that has one terminal coupled to node cn and another terminal coupled to Vbias. The material for capacitor Cbias can be same as material for capacitors C1, C2, and C3. For example, capacitor Cbias comprises non-ferroelectric material.

Vbias can be positive or negative voltage depending on the desired logic function of threshold gate 734. Any suitable source can generate Vbias. For example, a bandgap reference generator, a voltage divider such as a resistor divider, a digital to analog converter (DAC), etc. can generate Vbias. Vbias can be fixed or programmable (or adjustable). For example, Vbias can be adjusted by hardware (e.g., fuses, register), or software (e.g., operating system). In some embodiments, when Vbias is positive, the majority function on node cn is an OR function. For example, the function at node cn is OR(Vin1, Vin2, 0). In some embodiments, when Vbias is negative, the majority function on node cn is an AND function. For example, the function at node cn is AND(Vin1, Vin2, 1). Table 4 and Table 5 summarizes the function of threshold gate 734. Applying a positive voltage or Vbias can be akin to applying an input signal logic high as well. Likewise, applying a negative voltage on Vbias can be askin to applying an input signal logic low as well.

TABLE 4

| Vin1 | Vin2 | Vbias | cn OR(Vin1, Vin2, Vbias) |
|---|---|---|---|
| 0 | 0 | Positive or logic 1 | 0 |
| 0 | 1 | Positive or logic 1 | 1 |
| 1 | 0 | Positive or logic 1 | 1 |
| 1 | 1 | Positive or logic 1 | 1 |

TABLE 5

| Vin1 | Vin2 | Vbias | cn AND(Vin1, Vin2, Vbias) |
|---|---|---|---|
| 0 | 0 | Negative or logic 0 | 0 |
| 0 | 1 | Negative or logic 0 | 0 |
| 1 | 0 | Negative or logic 0 | 0 |
| 1 | 1 | Negative or logic 0 | 1 |

Compared to transitional CMOS AND logic gate and OR logic gate, here the AND function and OR function are performed by a network of capacitors. The output of the majority or threshold function on node cn is then stored in the non-linear polar capacitor 705. This capacitor provides the final state of the logic in a non-volatile form. As such, the logic gate of various embodiments describes a non-volatile multi-input AND or OR gate with one or two transistors for pre-discharging or pre-charging nodes cn and n1. The silicon area of the AND or OR gates of various embodiments is orders of magnitude smaller than traditional AND or OR gates. While FIG. 7C illustrates a 3-input threshold gate, the same concept can be extended to more than 3 inputs to make an N-input threshold gate, where N is greater than 2 and an odd number. The reset mechanism of FIG. 7C is like the one described with reference to FIG. 7A.

Figure 8A:
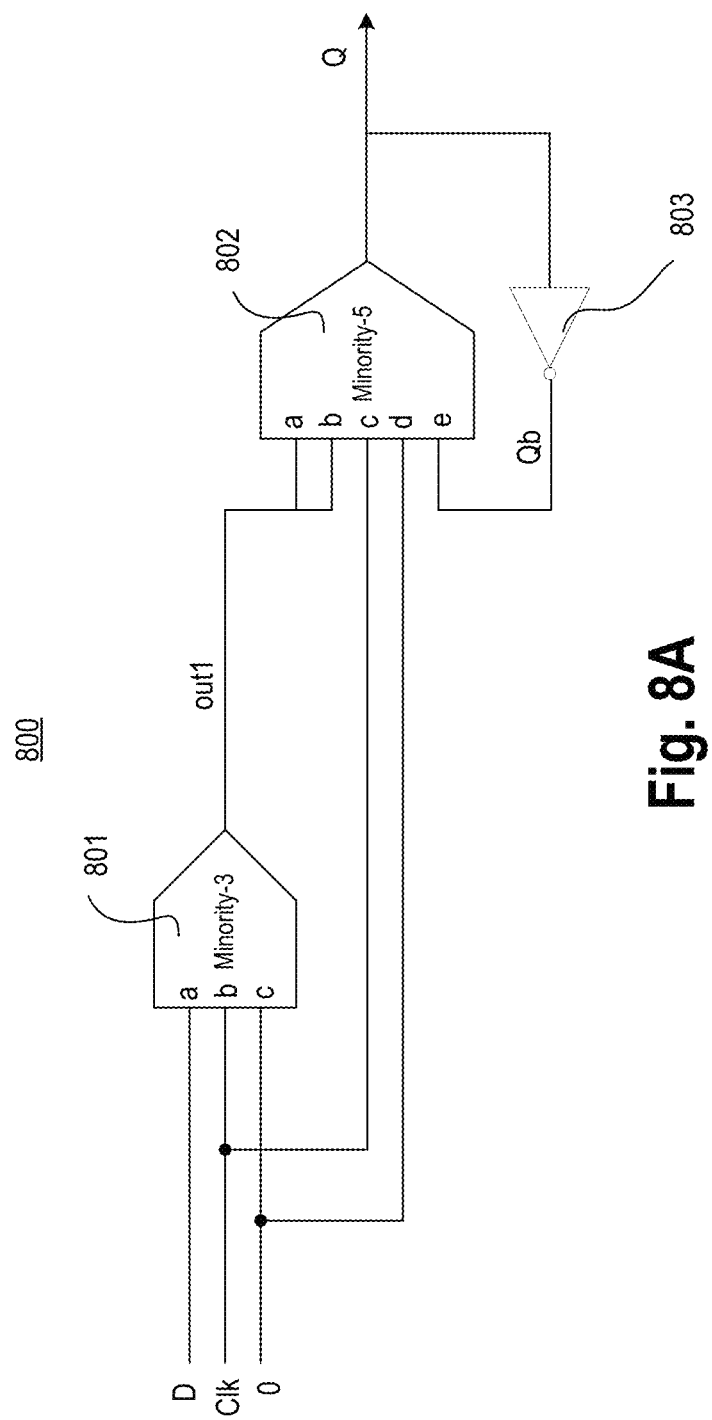
FIG. 8A illustrates a gated latch with minority gates, in accordance with some embodiments.

FIG. 8A illustrates gated D-latch 800 with minority gates, in accordance with some embodiments. Gated D-Latch 800 comprises a 3-input minority gate 801, a 5-input minority gate 802, and inverter 803 coupled a shown. In some embodiments, 3-input minority gate 801 receives data input D at input 'a', clock Clk at input 'b', and fixed voltage 0 at input 'c'. The output out1 of 3-input minority gate 801 is received by inputs 'a' and 'b' of 5-input minority gate 802. In some embodiments, input 'c' of 5-input minority gate 802 receives clock Clk. In some embodiments, input 'd' of 5-input minority gate 802 receives fixed voltage 0. In some embodiments, input 'e' of 5-input minority gate 802 receives inverted version of output Q, which is inverted by inverter 803. While the embodiment is illustrated using minority gates, latch 800 can be implemented by majority gates and/or threshold gates.

In some embodiments, first minority gate 801 is an equivalent of a NAND gate since one of the inputs is tied to 0. In some embodiments, when both the data and clock are 1, the output out1 of first minority gate 801 results into 0. Hence, when clock Clk is high, the output out1 of first minority gate 801 results into Db. In some embodiments, when the clock is high, second 5-input minority gate 802 gate receives (a=Db,b=Db,c=1,d=0,e=Qb), and therefore, the output results into Q=D. In some embodiments, when the clock Clk is low, first 3-input minority gate 801 produces 1 on node out1, and therefore second 5-input minority gate 802 receives (a=1, b=1, c=0, d=0, e=Qb) and outputs Q. As such, the embodiment of FIG. 8A functions as a latch.

Figure 8B:
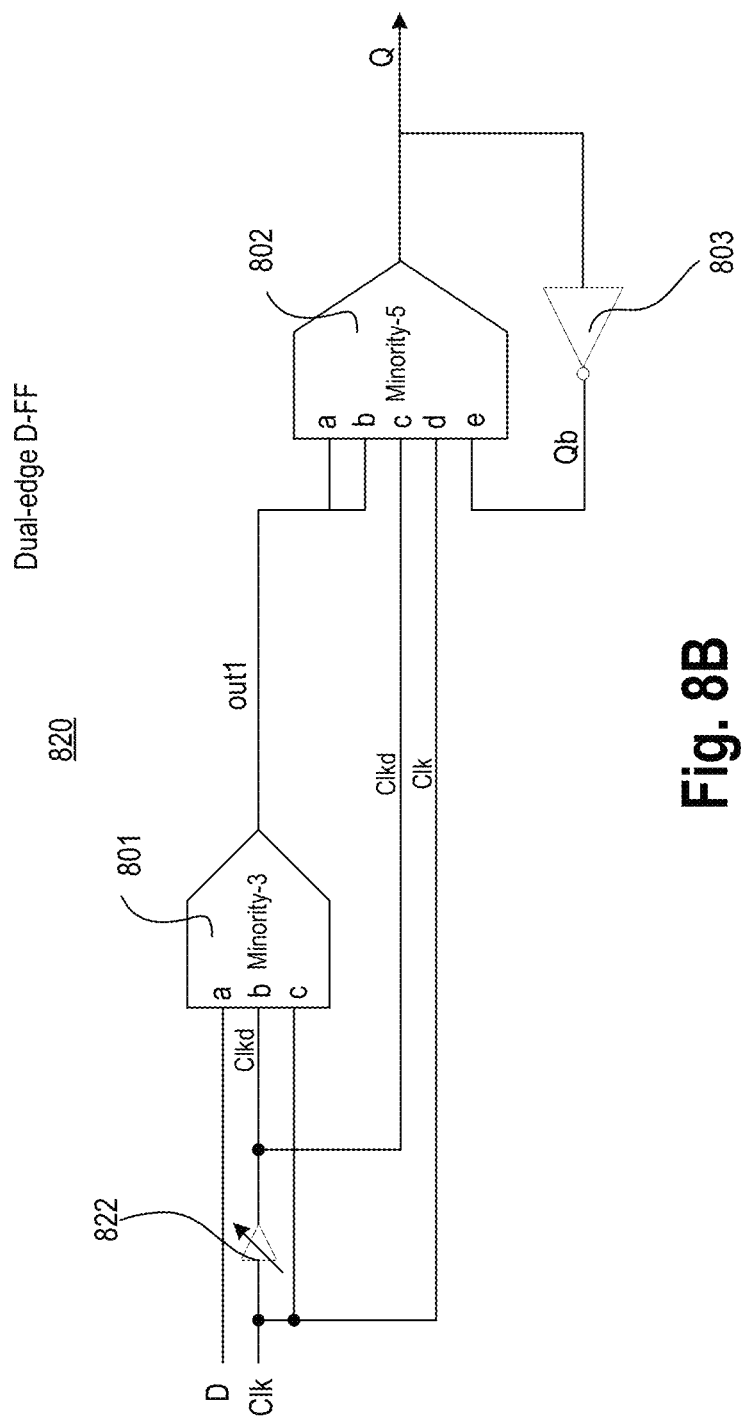
FIG. 8B illustrates a dual-edge flip-flop with minority gates, in accordance with some embodiments.

FIG. 8B illustrates dual-edge flip-flop 820 with minority gates, in accordance with some embodiments. Here, data D is passed to the output on both rising and falling edges of the clock Clk. In some embodiments, dual-edge flip-flop 820 comprises 3-input minority gate 801, 5-input minority gate 802, inverter 803, adjustable delay buffer 822, data node D, clock node Clk, delayed clock node Clkd, output node out1, output node Q, and output node Qb coupled as shown. In some embodiments, 3-input minority gate 801 receives data input D at input 'a', Clkd at input 'b', and Clk at input 'c'. The output out1 of 3-input minority gate 801 is received by inputs 'a' and 'b' of 5-input minority gate 802. In some embodiments, input 'c' of 5-input minority gate 802 receives Clkd (delayed clock). In some embodiments, input 'd' of 5-input minority gate 802 receives clock Clk. In some embodiments, input 'e' of 5-input minority gate 802 receives inverted version of output Q, which is inverted by inverter 803. While the embodiment is illustrated using minority gates, latch 800 can be implemented by majority gates and/or threshold gates.

FF 820 uses Clk and Clkd to capture the rising and falling edges of the clock Clk. During both the edges of Clk, the inputs Clk or Clkd are of opposite value. For example, at the rising edge Clk=1 and Clkd=0 and for the falling edge Clk=0, Clkd=1. During those edges, first minority gate 801 outputs out1=Db, where Db is an inverse of D. In various embodiments, second minority gate 802 receives (a=Db, b=Db, c=clkd, d=clk, e=Qb). During the clock edges of Clk, Clk and Clkd cancel each other, and the output Q is D. During the time when both Clk and Clkd=1, out1=0, and second minority gate 802 receives (a=0, b=0, c=1, d=1, e=Qb), which results in an output of Q. During the time when both Clk and Clkd=1, out1=0, and second minority gate 802 sees (a=0, b=0, c=1, d=1, e=Qb), and the output is still Q. Therefore, it the output changes value during the dual edge and works as the dual-edge FF.

Figure 8C:
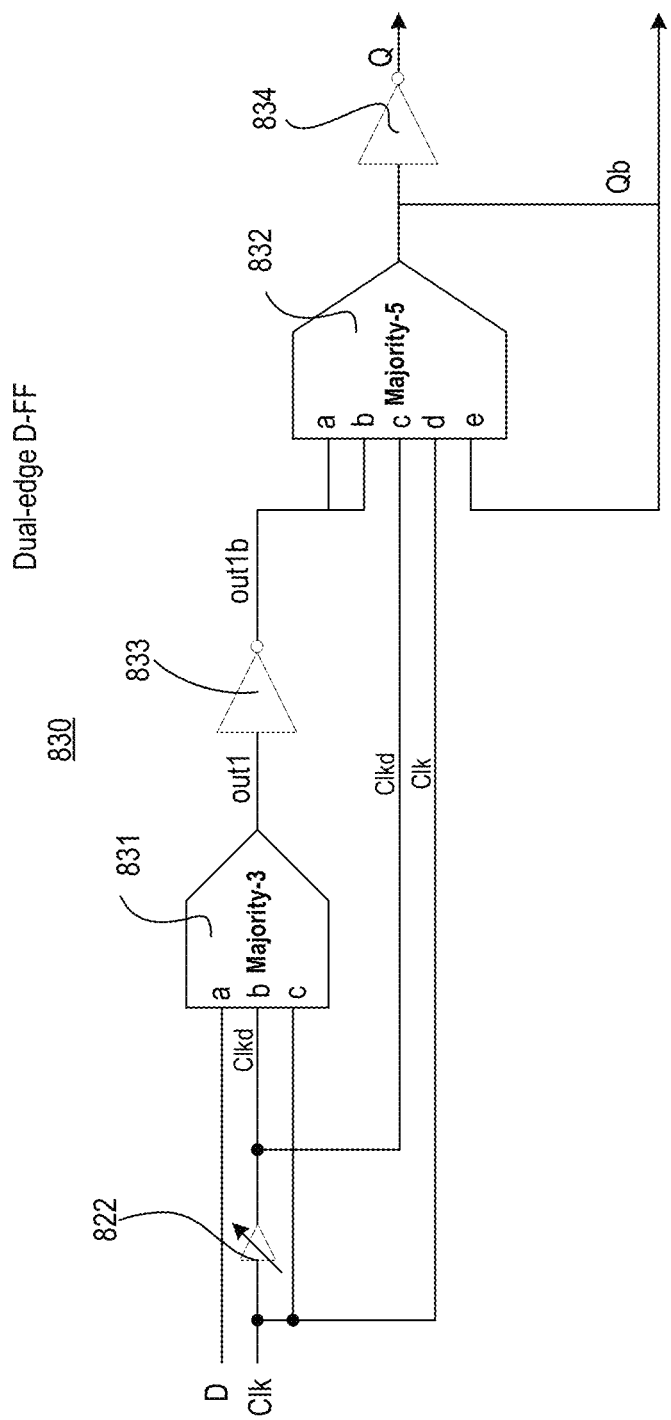
FIG. 8C illustrates a dual-edge flip-flop with majority gates, in accordance with some embodiments.

FIG. 8C illustrates dual-edge flip-flop 830 with majority gates, in accordance with some embodiments. Here, data D is passed to the output on both rising and falling edges of the clock Clk. In some embodiments, dual-edge flip-flop 830 comprises 3-input majority gate 831, 5-input majority gate 832, inverter 833, adjustable delay buffer 822, data node D, clock node Clk, delayed clock node Clkd, output node out1, node out1b (which carries a signal inverse of the signal on node out1), output node Q, and output node Qb coupled as shown. In some embodiments, 3-input majority gate 831 receives data input D at input 'a', Clkd at input 'b', and Clk at input 'c'. The output out1 of 3-input majority gate 831 is inverted by inverter 833 to generate out1b which is received by inputs 'a' and 'b' of 5-input majority gate 832. In some embodiments, input 'c' of 5-input majority gate 832 receives Clkd (delayed clock). In some embodiments, input 'd' of 5-input majority gate 832 receives clock Clk. In some embodiments, input 'e' of 5-input majority gate 832 receives Qb, which is inverted to generate output Q by inverter 834. The functionally of FF 830 is equivalent to the functionality of FF 820 with Boolean logic. Minority gate can be made with an equivalent majority gate and an inverter. Also, here two inverters can cancel out each other for the same Boolean value.

Figure 8D:
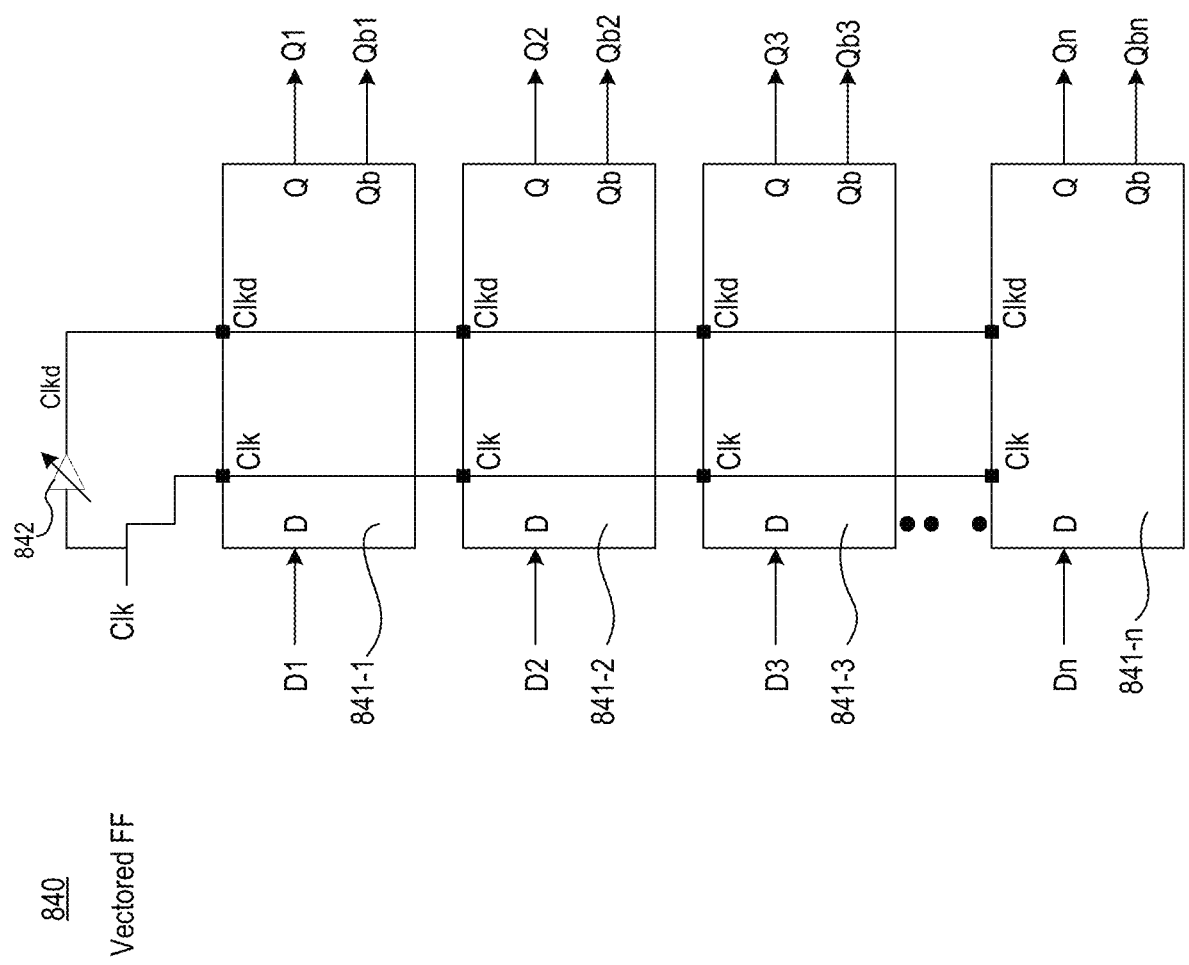
FIG. 8D illustrates a vectored flip-flop or latch using any of the flip-flop or latch designs described herein, in accordance with some embodiments.

FIG. 8D illustrates vectored flip-flop or latch 840 using any of the flip-flop or latch designs of FIGS. 8A-C, in accordance with some embodiments. Like vectored flip-flop or latch 660, here several FFs or latches of FIGS. 8A-C (e.g., FFs or latches 841-1 through 841-n, where 'n' is a number greater than 1) are grouped together and share Clk and Clkd signals. In some embodiments, delay stage 842 (e.g., 822) is shared with the group of FFs or latches 841-1 through 841-n. In some embodiments, where delay stage 842 is not used, it can be removed and clock is shared with the group of FFs or latches.

Figure 9:
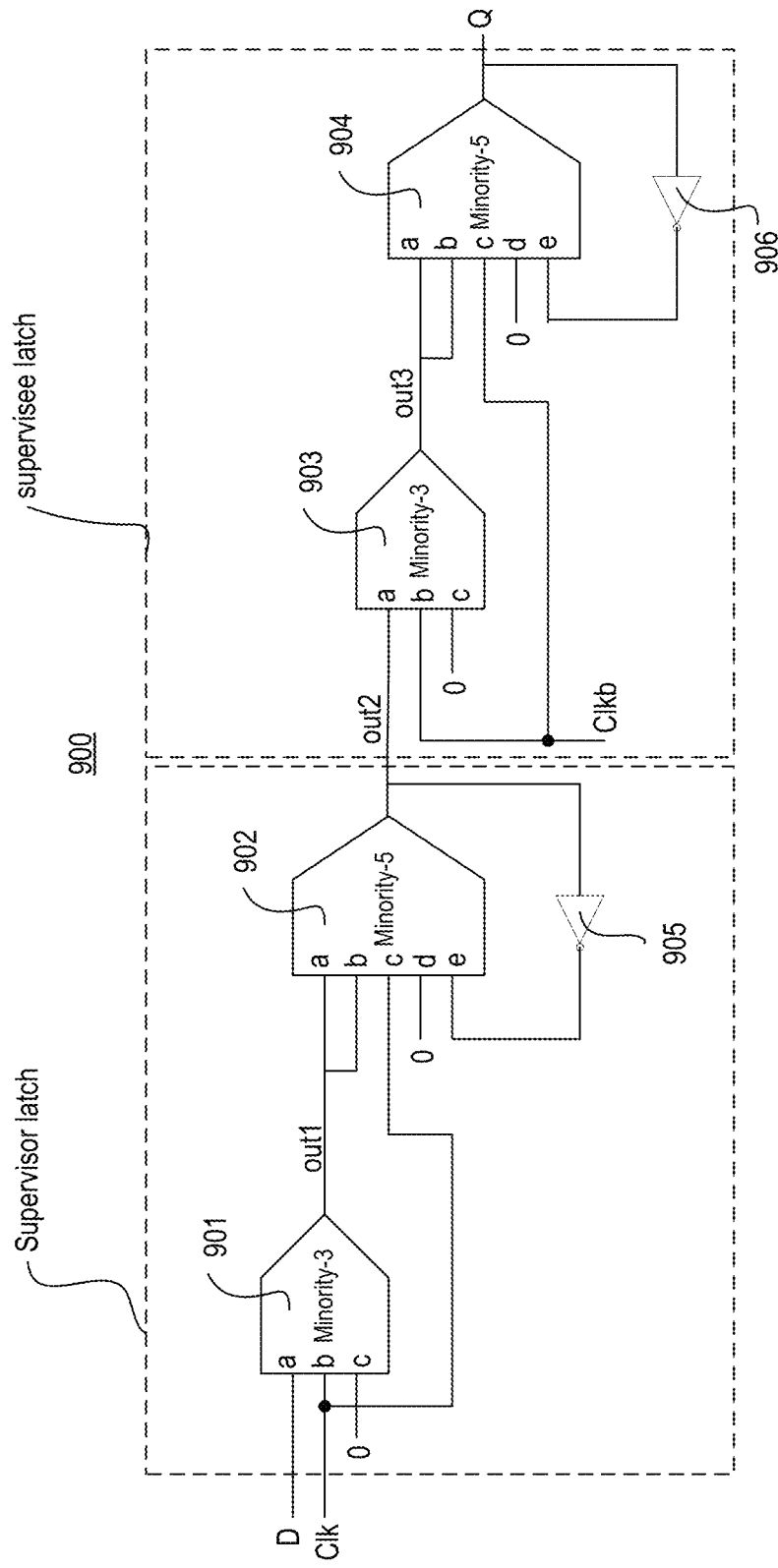
FIG. 9 illustrates a supervisor-supervisee flip-flop with minority gates, in accordance with some embodiments.

FIG. 9 illustrates supervisor-supervisee flip-flop 900 with minority gates, in accordance with some embodiments. In some embodiments, latch 800 can be coupled in series with another latch 800 to form supervisor-supervisee flip-flop 900. Here, supervisor latch comprises an instance of latch 800 comprising 3-input minority gate 901, 5-input majority gate 902, and inverter 905 coupled as shown. Here, supervisee latch comprises an instance of latch 800 comprising 3-input minority gate 903, 5-input majority gate 909, and inverter 906 coupled as shown. The output out2 of 5-input minority gate 902 is input to 2-input minority gate 903. Input b of 2-input minority gate 903 and input c of 5-input minority gate 904 receive Clkb, which is an inverted version of clock Clk. As such, supervisor latch is used to latch data D using clock Clk while supervisee latch is used to latch data out2 using Clkb. Here, out1 and out3 are outputs of respective 3-input minority gates of supervisor latch and supervisee latch. As discussed herein, the minority gates can be replaced with majority gate or threshold gate, or a combination of them. The implementations of the minority and majority gates (or threshold gates) can be according to gates illustrated with reference to FIGS. 7A-C.

Figure 10:
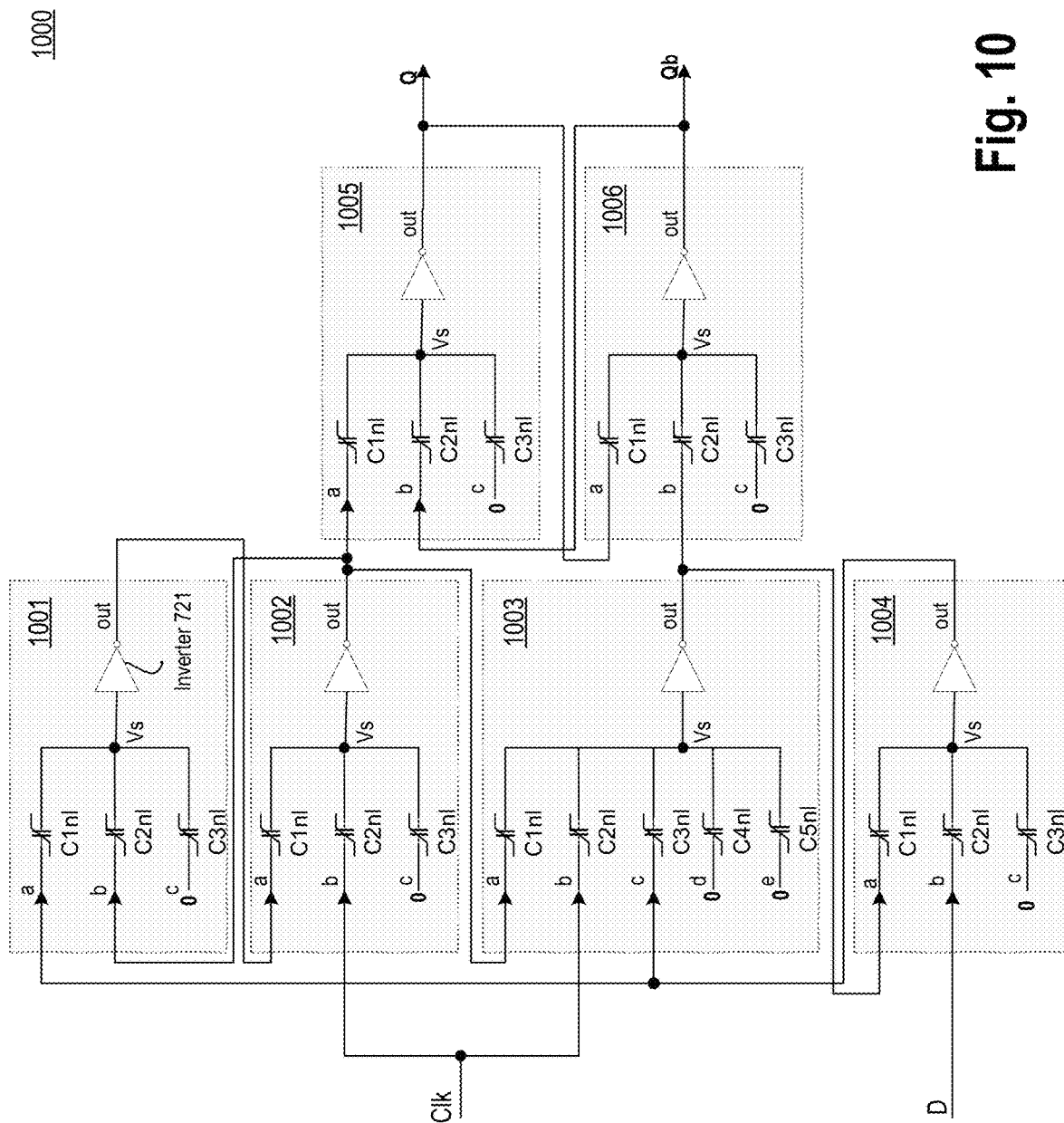
FIG. 10 illustrates a flip-flop with minority gate-based NAND gates, in accordance with some embodiments.

FIG. 10 illustrates flip-flop 1000 with minority gate-based NAND gates, in accordance with some embodiments. FF 1000 comprises majority gates 1001, 1002, 1003, 1004, 1005, and 1006 coupled as shown. Each instance of majority gates is implemented using the design described with reference to FIG. 7B which uses non-linear input capacitors. These non-linear input capacitors can be ferroelectric or paraelectric capacitors. In various embodiments, majority gates 1001, 1002, 1003, 1004, 1005, and 1006 are configured as NAND gates by tying at least one input of each gate to ground.

In some embodiments, clock Clk is received by inputs of gates 1002 and 1003. In some embodiments, data is received as input by gate 1004. The output of gate 1004 is provided as input to gate 1003 and gate 1001. The output of gate 1001 is provide as input to gate 1002. In some embodiments, the output of gate 1002 is provide as input to gate 1001 and gate 1005. In some embodiments, the output of gate 1003 is provided as input to gates 1004 and gate 1006. In some embodiments, the output Q of gate 1005 is received as input by gate 1006. In some embodiments, the output Qb of gate 1006 is provided as input to gate 1005. As such, cross-coupled NAND gates together form FF 1000. FF 1000 can be used in designs where reducing delay is a high priority. While the embodiment for FF 1000 is illustrated with reference to NAND gates implemented as majority or minority gates, FF 1000 can also be realized using NOR gates implemented as majority or minority gates and having non-linear polar material.

Figure 11:
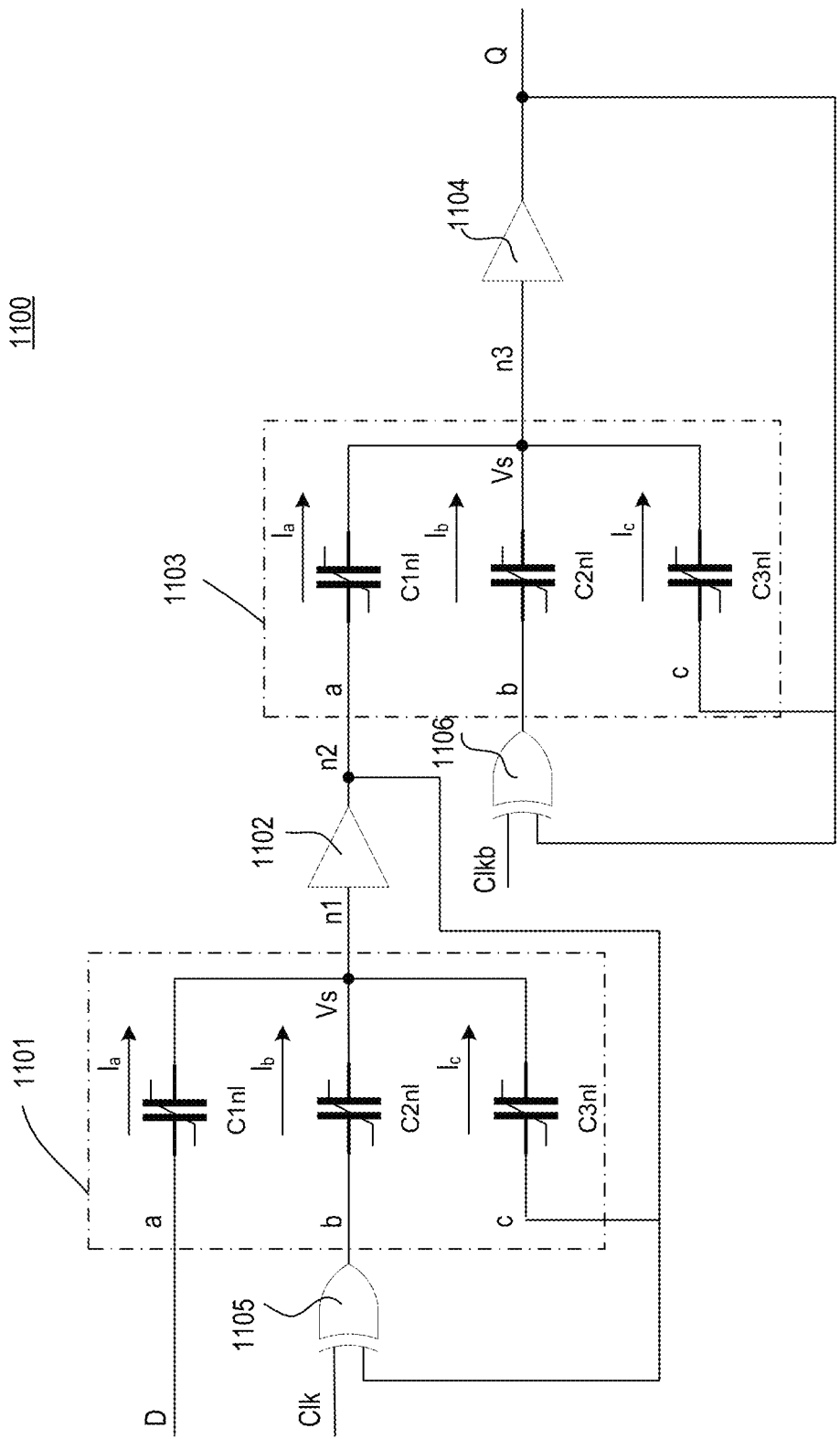
FIG. 11 illustrates a flip-flop having majority gates and XOR gates, in accordance with some embodiments.

FIG. 11 illustrates flip-flop 1100 having majority gates and compare circuitries (e.g., XOR gates), in accordance with some embodiments. FF 1100 comprises first majority gate 1101, first buffer 1102, second majority gate 1103, second buffer 1104, first compare circuitry 1105, second compare circuitry 1106, nodes n1, n2, and n3, input data D, input clock Clk, input clock Clkb (inverse of Clk), and output Q coupled as shown. In various embodiments, summing node or majority node n1 of first majority gate 1101 is received by buffer 1101. In some embodiments, the output of buffer 1102 is received as input by first compare circuitry 1105, which also receives clock Clk as its second input. In some embodiments, second XOR gate 1106 receives input Clkb and output Q. In some embodiments, output (node n2) of buffer 1102 is received by an input of second majority gate 1103. In some embodiments, summing node or majority node n3 of second majority gate 1104 is received by buffer 1104, which produced output Q. While the embodiments are described with reference to majority gates, the majority gates can be replaced with minority gates or threshold gates. While compare circuitry of FF 1100 is described with reference to an XOR gate, other logic gates can be used. For example, compare circuitry can be implemented as XNOR gate.

Figure 12:
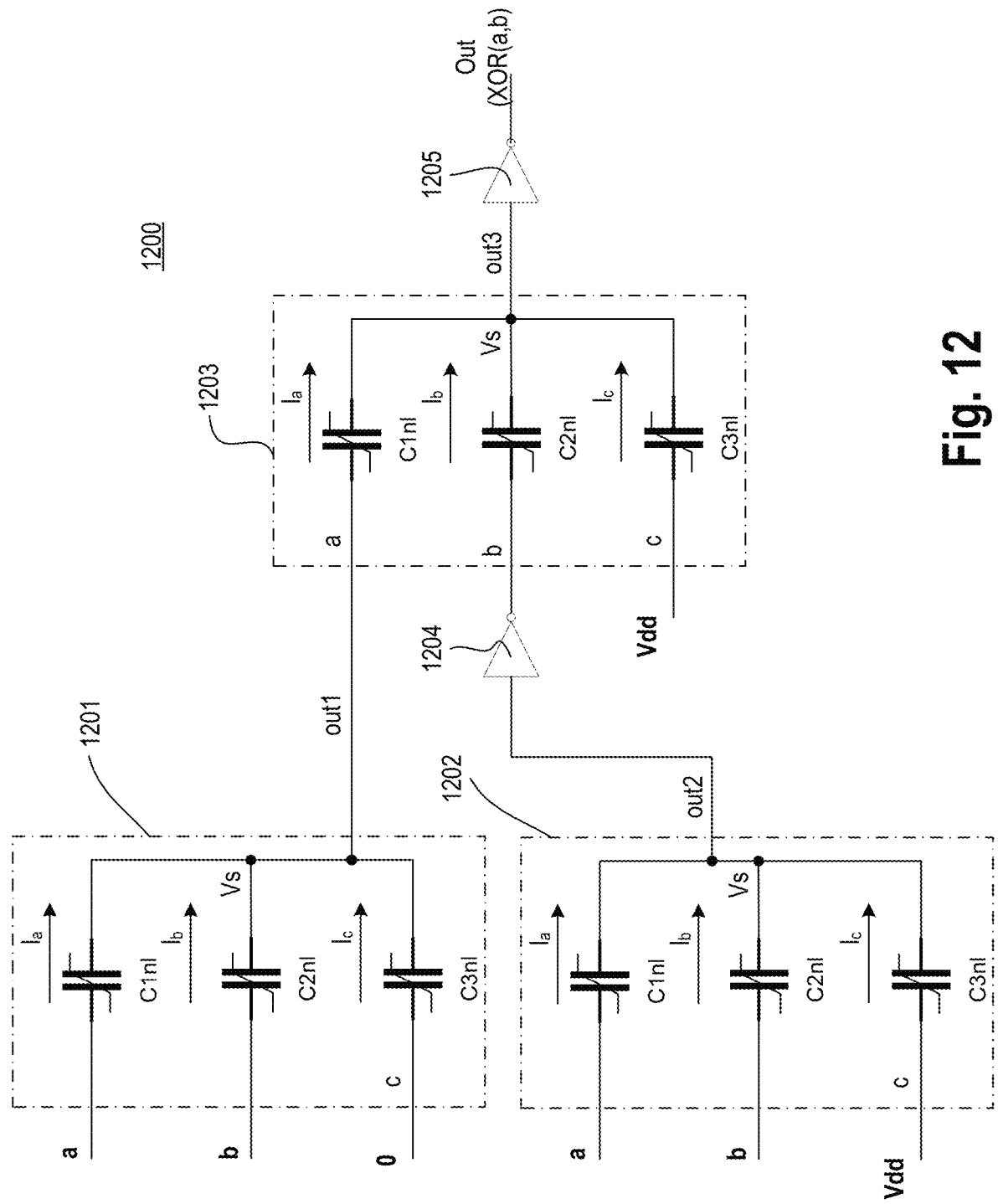
FIG. 12 illustrates an XOR gate with ferroelectric or paraelectric material-based majority or minority gates for the flip-flop of FIG. 11, in accordance with some embodiments.

FIG. 12 illustrates XOR gate 1200 with majority or minority gates for flip-flop 1100 of FIG. 11, in accordance with some embodiments. In some embodiments, XOR gate 1200 comprises first majority gate 1201, second majority gate 1202, third majority gate 1203, inverters 1204 and 1205, internal nodes out1, out2, and out3, inputs a and b, and output Out, coupled as shown. In some embodiments, first majority gate 1201 as one input tied to ground to produce a NAND function. In some embodiments, second majority gate 1202 has one input tied to Vdd to produce an OR function. The output out1 of first majority gate 1201 is received as input by third majority gate 1203. The output out2 of second majority gate 1202 is inverted by inverter 1204 and then provided as input to third majority gate 1203. The output of third majority gate 1203 is provided as input to inverter 1205, which provided the find output Out which is an XOR function of inputs a and b. While the embodiments are described with reference to majority gates, the majority gates can be replaced with minority gates or threshold gates. In some embodiments, inverter 1204 and 1205 can be replaced by other types of inverting logic gates such as NAND or NOR gates.

Figure 13:
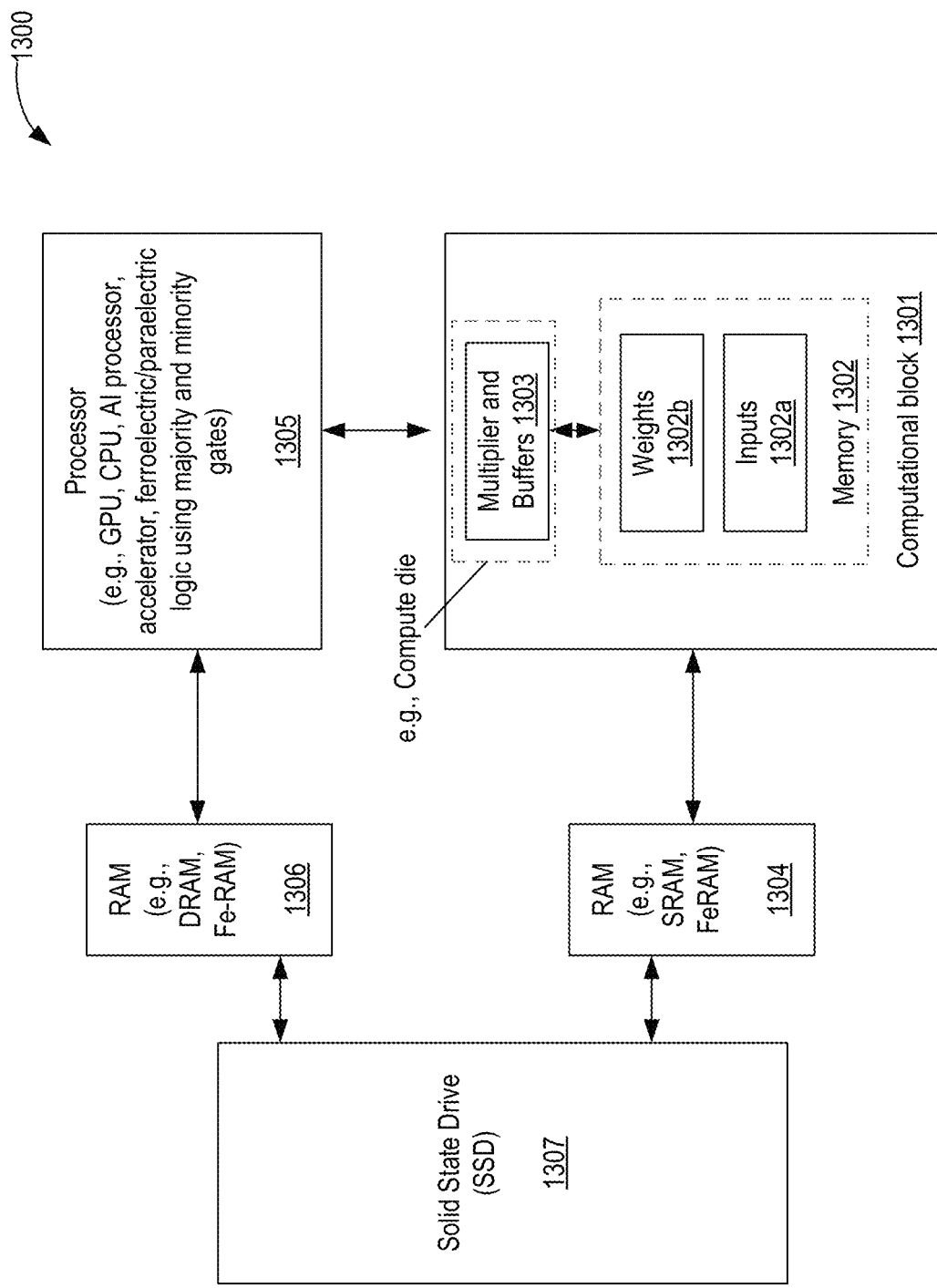
FIG. 13 illustrates a high-level architecture of an artificial intelligence (AI) machine comprising a compute die positioned on top of a memory die, wherein the compute die includes flip-flops in accordance with some embodiments.

FIG. 13 illustrates a high-level architecture of an artificial intelligence (AI) machine comprising a compute die positioned on top of a memory die, wherein the compute die includes flip-flops in accordance with some embodiments. Any of the blocks described herein can include the latch or FF of various embodiments. AI machine 1300 comprises computational block 1301 or processor having random-access memory (RAM) 1302 and computational logic 1303; first random-access memory 1304 (e.g., static RAM (SRAM), ferroelectric or paraelectric RAM (FeRAM), ferroelectric or paraelectric static random-access memory (FeSRAM)), main processor 1305, second random-access memory 1306 (dynamic RAM (DRAM), FeRAM), and solid-state memory or drive (SSD) 1307. In some embodiments, some or all components of AI machine 1300 are packaged in a single package forming a system-on-chip (SoC). The SoC can be configured as a logic-on-logic configuration, which can be in a 3D configuration or a 2.5D configuration.

In some embodiments, computational block 1301 is packaged in a single package and then coupled to processor 1305 and memories 1304, 1306, and 1307 on a printed circuit board (PCB). In some embodiments, computational block 1301 is configured as a logic-on-logic configuration, which can be in a 3D configuration or a 2.5D configuration. In some embodiments, computational block 1301 comprises a special purpose compute die 1303 or microprocessor. For example, compute die 1303 is a compute chiplet that performs a function of an accelerator or inference. In some embodiments, memory 1302 is DRAM which forms a special memory/cache for the special purpose compute die 1303. The DRAM can be embedded DRAM (eDRAM) such as 1T-1C (one transistor and one capacitor) based memories. In some embodiments, RAM 1302 is ferroelectric or paraelectric RAM (Fe-RAM).

In some embodiments, compute die 1303 is specialized for applications such as Artificial Intelligence, graph processing, and algorithms for data processing. In some embodiments, compute die 1303 further has logic computational blocks, for example, for multipliers and buffers, a special data memory block (e.g., buffers) comprising DRAM, FeRAM, or a combination of them. In some embodiments, RAM 1302 has weights and inputs stored in-order to improve the computational efficiency. The interconnects between processor 1305 (also referred to as special purpose processor), first RAM 1304 and compute die 1303 are optimized for high bandwidth and low latency. The architecture of FIG. 1 allows efficient packaging to lower the energy, power, or cost and provides for ultra-high bandwidth between RAM 1302 and compute chiplet 1303 of computational 1301.

In some embodiments, RAM 1302 is partitioned to store input data (or data to be processed) 1302a and weight factors 1302b. In some embodiments, input data 1302a is stored in a separate memory (e.g., a separate memory die) and weight factors 1302b are stored in a separate memory (e.g., separate memory die).

In some embodiments, computational logic or compute chiplet 1303 comprises matrix multiplier, adder, concatenation logic, buffers, and combinational logic. In various embodiments, compute chiplet 1303 performs multiplication operation on inputs 1302a and weights 1302b. In some embodiments, weights 1302b are fixed weights. For example, processor 1305 (e.g., a graphics processor unit (GPU), field programmable grid array (FPGA) processor, application specific integrated circuit (ASIC) processor, digital signal processor (DSP), an AI processor, a central processing unit (CPU), or any other high-performance processor) computes the weights for a training model. Once the weights are computed, they are stored in memory 1302b. In various embodiments, the input data, that is to be analyzed using a trained model, is processed by computational block 1301 with computed weights 1302b to generate an output (e.g., a classification result).

In some embodiments, first RAM 1304 is ferroelectric or paraelectric based SRAM. For example, a six transistor (6T) SRAM bit-cells having ferroelectric or paraelectric transistors are used to implement a non-volatile FeSRAM. In some embodiments, SSD 1307 comprises NAND flash cells. In some embodiments, SSD 1307 comprises NOR flash cells. In some embodiments, SSD 1307 comprises multi-threshold NAND flash cells.

In various embodiments, the non-volatility of FeRAM is used to introduce new features such as security, functional safety, and faster reboot time of architecture 1300. The non-volatile FeRAM is a low power RAM that provides fast access to data and weights. FeRAM 1304 can also serve as a fast storage for inference die 1301 (or accelerator), which typically has low capacity and fast access requirements.

In various embodiments, the FeRAM (FeDRAM or FeSRAM) includes ferroelectric or paraelectric material. The ferroelectric or paraelectric (FE) material may be in a transistor gate stack or in a capacitor of the memory. The ferroelectric material can be any suitable low voltage FE material that allows the FE material to switch its state by a low voltage (e.g., 100 mV). Threshold in the FE material has a highly non-linear transfer function in the polarization vs. voltage response. The threshold is related a) non-linearity of switching transfer function, and b) to the squareness of the FE switching. The non-linearity of switching transfer function is the width of the derivative of the polarization vs. voltage plot. The squareness is defined by the ratio of the remnant polarization to the saturation polarization; perfect squareness will show a value of 1.

The squareness of the FE switching can be suitably manipulated with chemical substitution. For example, in PbTiO3 a P-E (polarization-electric field) square loop can be modified by La or Nb substitution to create an S-shaped loop. The shape can be systematically tuned to ultimately yield a non-linear dielectric. The squareness of the FE switching can also be changed by the granularity of a FE layer. A perfectly epitaxial, single crystalline FE layer will show higher squareness (e.g., ratio is closer to 1) compared to a poly crystalline FE. This perfect epitaxial can be accomplished using lattice matched bottom and top electrodes. In one example, BiFeO (BFO) can be epitaxially synthesized using a lattice matched SrRuO3 bottom electrode yielding P-E loops that are square. Progressive doping with La will reduce the squareness.

In some embodiments, the FE material comprises a perovskite of the type $ABO_3$, where 'A' and 'B' are two cations of different sizes, and 'O' is oxygen which is an anion that bonds to both the cations. Generally, the size of atoms of A is larger than the size of B atoms. In some embodiments, the perovskite can be doped (e.g., by La or Lanthanides). In various embodiments, when the FE material is a perovskite, the conductive oxides are of the type $AA'BB'O_3$. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability.

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO3 type, where 'A' is a rare earth element and B is Mn.

In some embodiments, the FE material is perovskite, which includes one or more of: La, Sr, Co, Sr, Ru, Y, Ba, Cu, Bi, Ca, and Ni. For example, metallic perovskites such as: $(La,Sr)CoO_3$, $SrRuO_3$, $(La,Sr)MnO_3$, $YBa_2Cu_3O_7$, $Bi_2Sr_2CaCu_2O_8$, $LaNiO_3$, etc. may be used for FE material 213. Perovskites can be suitably doped to achieve a spontaneous distortion in a range of 0.3 to 2%. For example, for chemically substituted lead titanate such as Zr in Ti site; La, Nb in Ti site, the concentration of these substitutes is such that it achieves the spontaneous distortion in the range of 0.3-2%. For chemically substituted BiFeO3, BrCrO3, BuCoO3 class of materials, La or rate earth substitution into the Bi site can tune the spontaneous distortion. In some embodiments, the FE material is contacted with a conductive metal oxide that includes one of the conducting perovskite metallic oxides exemplified by: La—Sr—CoO3, SrRuO3, La—Sr—MnO3, YBa2Cu3O7, Bi2Sr2CaCu2O8, and LaNiO3.

In some embodiments, the FE material comprises a stack of layers including low voltage FE material between (or sandwiched between) conductive oxides. In various embodiments, when the FE material is a perovskite, the conductive oxides are of the type AA'BB'O3. A' is a dopant for atomic site A, it can be an element from the Lanthanides series. B' is a dopant for atomic site B, it can be an element from the transition metal elements especially Sc, Ti, V, Cr, Mn, Fe, Co, Ni, Cu, Zn. A' may have the same valency of site A, with a different ferroelectric polarizability. In various embodiments, when metallic perovskite is used for the FE material, the conductive oxides can include one or more of: IrO2, RuO2, PdO2, OsO2, or ReO3. In some embodiments, the perovskite is doped with La or Lanthanides. In some embodiments, thin layer (e.g., approximately 10 nm) perovskite template conductors such as SrRuO3 coated on top of IrO2, RuO2, PdO2, PtO2, which have a non-perovskite structure but higher conductivity to provide a seed or template for the growth of pure perovskite ferroelectric at low temperatures, are used as the conductive oxides.

In some embodiments, ferroelectric materials are doped with s-orbital material (e.g., materials for first period, second period, and ionic third and fourth periods). In some embodiments, f-orbital materials (e.g., lanthanides) are doped to the ferroelectric material to make paraelectric material. Examples of room temperature paraelectric materials include: SrTiO3, Ba(x)Sr(y)TiO3 (where x is −0.05, and y is 0.95), HfZrO2, Hf—Si—O, La-substituted PbTiO3, PMN-PT based relaxor ferroelectrics.

In some embodiments, the FE material comprises one or more of: Hafnium (Hf), Zirconium (Zr), Aluminum (Al), Silicon (Si), their oxides or their alloyed oxides. In some embodiments, the FE material includes one or more of: Al(l-x)Sc(x)N, Ga(l-x)Sc(x)N, Al(l-x)Y(x)N or Al(l-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction. In some embodiments, the FE material includes one or more of: Bismuth ferrite (BFO), lead zirconate titanate (PZT), BFO with doping material, or PZT with doping material, wherein the doping material is one of Nb or La; and relaxor ferroelectrics such as PMN-PT.

In some embodiments, the FE material includes Bismuth ferrite (BFO), BFO with a doping material where in the doping material is one of Lanthanum, or any element from the lanthanide series of the periodic table. In some embodiments, FE material 213 includes lead zirconium titanate (PZT), or PZT with a doping material, wherein the doping material is one of La, Nb. In some embodiments, the FE material includes a relaxor ferro-electric includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), Barium Titanium-Barium Strontium Titanium (BT-BST).

In some embodiments, the FE material includes Hafnium oxides of the form, Hfl-x Ex Oy where E can be Al, Ca, Ce, Dy, er, Gd, Ge, La, Sc, Si, Sr, Sn, or Y. In some embodiments, the FE material includes Niobate type compounds LiNbO3, LiTaO3, Lithium iron Tantalum Oxy Fluoride, Barium Strontium Niobate, Sodium Barium Niobate, or Potassium strontium niobate.

In some embodiments, the FE material comprises multiple layers. For example, alternating layers of [Bi2O2]2+, and pseudo-perovskite blocks (Bi4Ti3O12 and related Aurivillius phases), with perovskite layers that are n octahedral layers in thickness can be used. In some embodiments, the FE material comprises organic material. For example, Polyvinylidene fluoride or polyvinylidene difluoride (PVDF).

In some embodiments, the FE material comprises hexagonal ferroelectrics of the type h-RMnO3, where R is a rare earth element viz. cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), and yttrium (Y). The ferroelectric phase is characterized by a buckling of the layered MnO5 polyhedra, accompanied by displacements of the Y ions, which lead to a net electric polarization. In some embodiments, hexagonal FE includes one of: YMnO3 or LuFeO3. In various embodiments, when the FE material comprises hexagonal ferroelectrics, the conductive oxides are of A2O3 (e.g., In2O3, Fe2O3) and ABO$_3$ type, where 'A' is a rare earth element and B is Mn.

In some embodiments, the FE material comprises improper FE material. An improper ferroelectric is a ferroelectric where the primary order parameter is an order mechanism such as strain or buckling of the atomic order. Examples of improper FE material are LuFeO3 class of materials or super lattice of ferroelectric and paraelectric materials PbTiO3 (PTO) and SnTiO3 (STO), respectively, and LaAlO3 (LAO) and STO, respectively. For example, a super lattice of [PTO/STO]n or [LAO/STO]n, where 'n' is between 1 to 100. While various embodiments here are described with reference to ferroelectric material for storing the charge state, the embodiments are also applicable for paraelectric material. In some embodiments, paraelectric material includes one of: SrTiO3, Ba(x)Sr(y)TiO3 (where x is -0.5, and y is 0.95), HfZrO2, Hf—Si—O, La-substituted PbTiO3, or PMN-PT based relaxor ferroelectrics.

Figure 14:
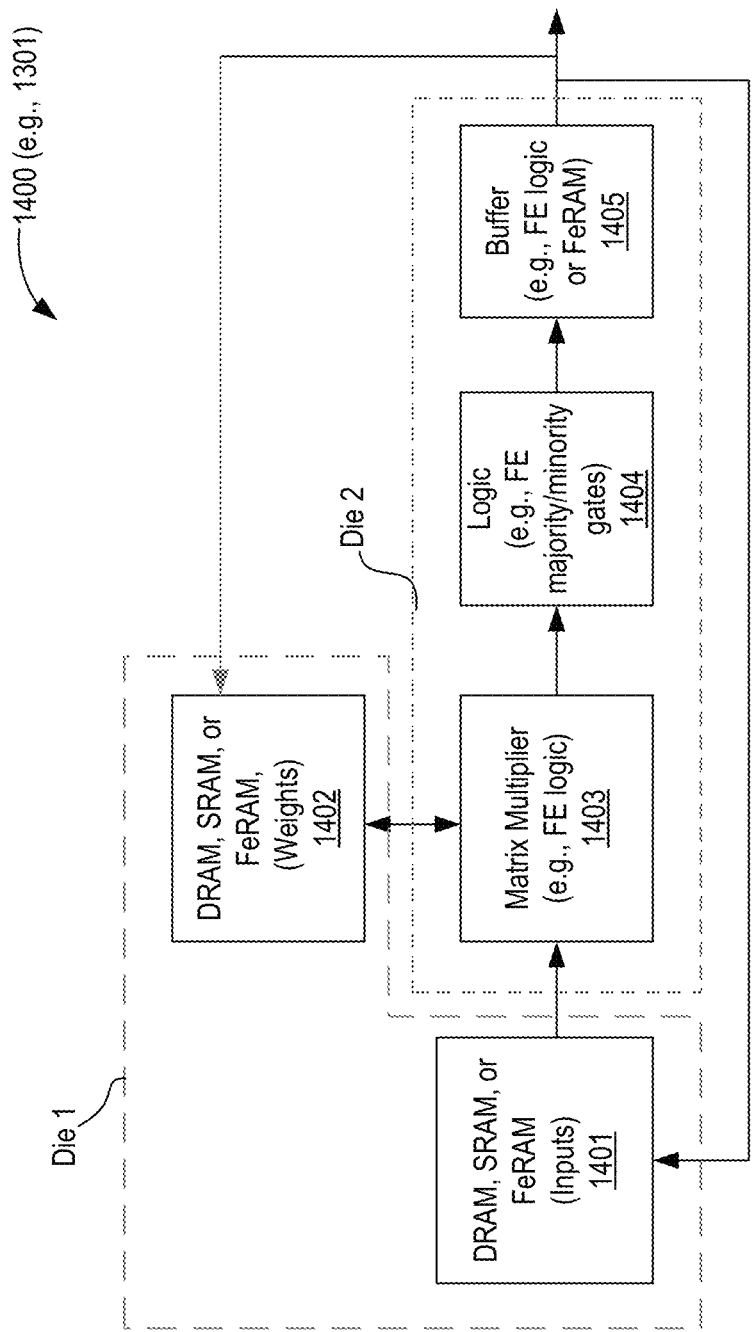
FIG. 14 illustrates an architecture of a computational block comprising a compute die positioned on top of a memory die, wherein the compute die includes flip-flops in accordance with some embodiments.

FIG. 14 illustrates an architecture of a computational block comprising a compute die positioned on top of a memory die, wherein the compute die includes flip-flops in accordance with some embodiments. Any of the blocks herein can include the flip-flops of various embodiments. The architecture of FIG. 14 illustrates an architecture for a special purpose compute die where RAM memory buffers for inputs and weights are split on die-1 and logic and optional memory buffers are split on die-2.

In some embodiments, memory die (e.g., Die 1) is positioned below compute die (e.g., Die 2) such that heat sink or thermal solution is adjacent to the compute die. In some embodiments, the memory die is embedded in an interposer. In some embodiments, the memory die behaves as an interposer in addition to its basic memory function. In some embodiments, the memory die is a high bandwidth memory (HBM) which comprises multiple dies of memories in a stack and a controller to control the read and write functions to the stack of memory dies. In some embodiments, the memory die comprises a first die 1401 to store input data and a second die 1402 to store weight factors. In some embodiments, the memory die is a single die that is partitioned such that first partition 1401 of the memory die is used to store input data and second partition 1402 of the memory die is used to store weights. In some embodiments, the memory die comprises DRAM. In some embodiments, the memory die comprises FE-SRAM or FE-DRAM. In some embodiments, the memory die comprises MRAM. In some embodiments, the memory die comprises SRAM. For example, memory partitions 1401 and 1402, or memory dies 1401 and 1402 include one or more of: DRAM, FE-SRAM, FE-DRAM, SRAM, and/or MRAM. In some embodiments, the input data stored in memory partition or die 1401 is the data to be analyzed by a trained model with fixed weights stored in memory partition or die 1402.

In some embodiments, the compute die comprises ferroelectric or paraelectric logic (e.g., majority, minority, and/or threshold gates) to implement matrix multiplier 1403, logic 1404, and temporary buffer 1405. Matrix multiplier 1403 performs multiplication operation on input data 'X' and weights 'W' to generate an output 'Y'. This output may be further processed by logic 1404. In some embodiments, logic 1404 performs: a threshold operation, pooling and drop out operations, and/or concatenation operations to complete the AI logic primitive functions.

In some embodiments, the output of logic 1404 (e.g., processed output 'Y') is temporarily stored in buffer 1405. In some embodiments, buffer 1405 is memory such as one or more of: DRAM, Fe-SRAM, Fe-DRAM, MRAM, resistive RAM (Re-RAM) and/or SRAM. In some embodiments, buffer 1405 is part of the memory die (e.g., Die 1). In some embodiments, buffer 1405 performs the function of a re-timer. In some embodiments, the output of buffer 1405 (e.g., processed output 'Y') is used to modify the weights in memory partition or die 1402. In one such embodiment, computational block 1400 not only operates as an inference circuitry, but also as a training circuitry to train a model. In some embodiments, matrix multiplier 1403 includes an array of multiplier cells, wherein the DRAMs 1401 and 1402 include arrays of memory bit-cells, respectively, wherein each multiplier cell is coupled to a corresponding memory bit-cell of DRAM 1401 and/or DRAM 1402. In some embodiments, computational block 1400 comprises an interconnect fabric coupled to the array of multiplier cells such that each multiplier cell is coupled to the interconnect fabric.

Architecture 1400 provides reduced memory accesses for the compute die (e.g., die 2) by providing data locality for weights, inputs, and outputs. In one example, data from and to the AI computational blocks (e.g., matrix multiplier 1403) is locally processed within a same packaging unit. Architecture 1400 also segregates the memory and logic operations on to a memory die (e.g., Die 1) and a logic die (e.g., Die 2), respectively, allowing for optimized AI processing. Desegregated dies allow for improved yield of the dies. A high-capacity memory process for Die 1 allows reduction of power of the external interconnects to memory, reduces cost of integration, and results in a smaller footprint.

Figure 15:
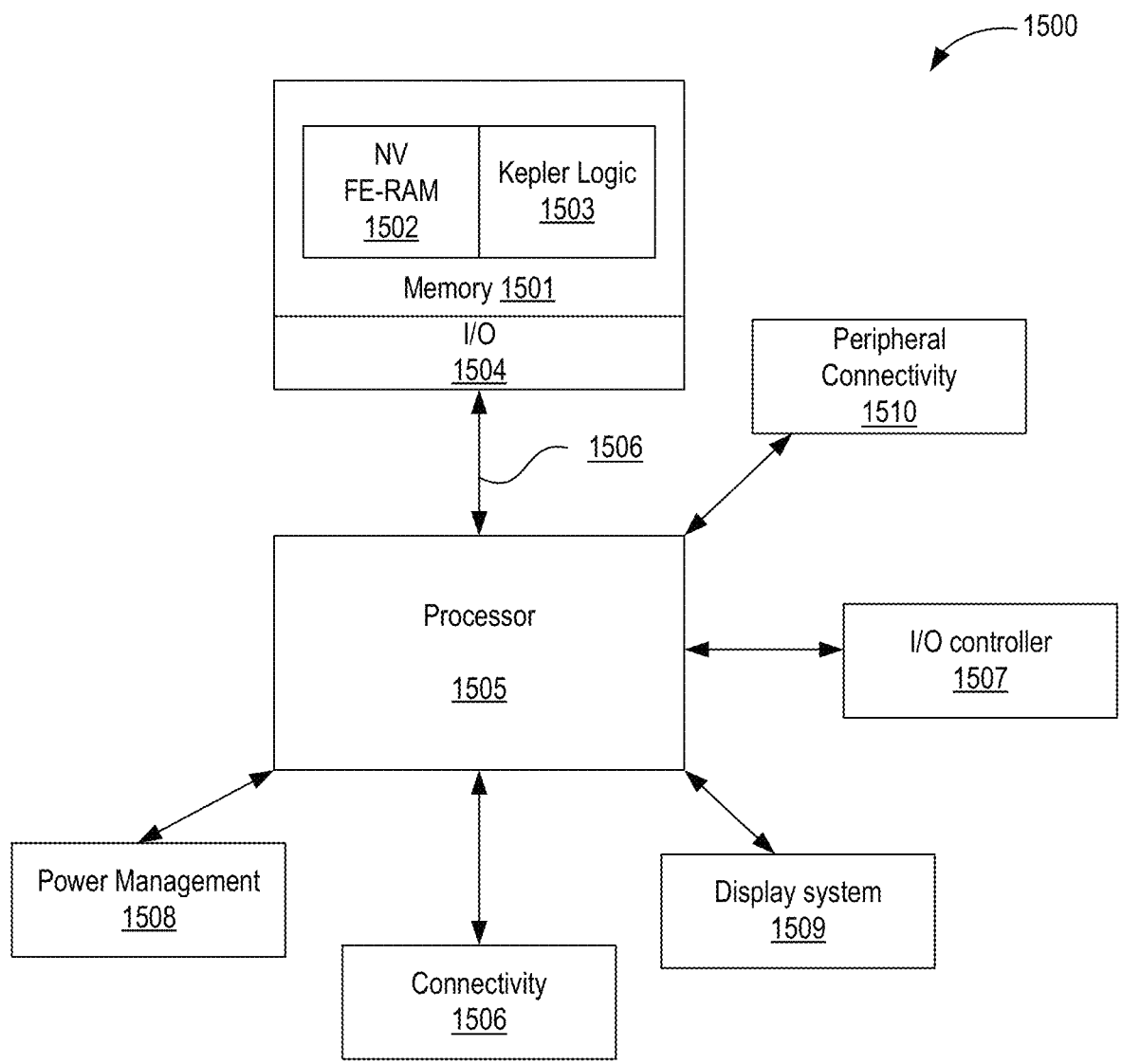
FIG. 15 illustrates a system-on-chip (SOC) that uses ferroelectric or paraelectric based sequential circuit, in accordance with some embodiments.

FIG. 15 illustrates a system-on-chip (SOC) that uses ferroelectric or paraelectric based sequential circuit, in accordance with some embodiments. Any of the blocks described herein can include the latch or FF of various embodiments. System-on-chip (SoC) 1500 comprises memory 1501 having static random-access memory (SRAM) or FE based random-access memory FE-RAM, or any other suitable memory. The memory can be non-volatile (NV) or volatile memory. Memory 1501 may also comprise logic 1503 to control memory 1502. For example, write and read drivers are part of logic 1503. These drivers and other logic are implemented using the majority or threshold gates of various embodiments. The logic can comprise majority or threshold gates and traditional logic (e.g., CMOS based NAND, NOR etc.).

SoC further comprises a memory I/O (input-output) interface 1504. The interface may be double-data rate (DDR) compliant interface or any other suitable interface to communicate with a processor. Processor 1505 of SoC 1500 can be a single core or multiple core processor. Processor 1505 can be a general-purpose processor (CPU), a digital signal processor (DSP), or an Application Specific Integrated Circuit (ASIC) processor. In some embodiments, processor 1505 is an artificial intelligence (AI) processor (e.g., a dedicated AI processor, a graphics processor configured as an AI processor).

AI is a broad area of hardware and software computations where data is analyzed, classified, and then a decision is made regarding the data. For example, a model describing classification of data for a certain property or properties is trained over time with large amounts of data. The process of training a model requires large amounts of data and processing power to analyze the data. When a model is trained, weights or weight factors are modified based on outputs of the model. Once weights for a model are computed to a high confidence level (e.g., 95% or more) by repeatedly analyzing data and modifying weights to get the expected results, the model is deemed "trained." This trained model with fixed weights is then used to make decisions about new data. Training a model and then applying the trained model for new data is hardware intensive activity. In some embodiments, the AI processor has reduced latency of computing the training model and using the training model, which reduces the power consumption of such AI processor systems.

Processor 1505 may be coupled to a number of other chip-lets that can be on the same die as SoC 1500 or on separate dies. These chip-lets include connectivity circuitry 1506, I/O controller 1507, power management 1508, and display system 1509, and peripheral connectivity 1506.

Connectivity 1506 represents hardware devices and software components for communicating with other devices. Connectivity 1506 may support various connectivity circuitries and standards. For example, connectivity 1506 may support GSM (global system for mobile communications) or variations or derivatives, CDMA (code division multiple access) or variations or derivatives, TDM (time division multiplexing) or variations or derivatives, 3rd Generation Partnership Project (3GPP) Universal Mobile Telecommunications Systems (UMTS) system or variations or derivatives, 3GPP Long-Term Evolution (LTE) system or variations or derivatives, 3GPP LTE-Advanced (LTE-A) system or variations or derivatives, Fifth Generation (5G) wireless system or variations or derivatives, 5G mobile networks system or variations or derivatives, 5G New Radio (NR) system or variations or derivatives, or other cellular service standards. In some embodiments, connectivity 1506 may support non-cellular standards such as WiFi.

I/O controller 1507 represents hardware devices and software components related to interaction with a user. I/O controller 1507 is operable to manage hardware that is part of an audio subsystem and/or display subsystem. For example, input through a microphone or other audio device can provide input or commands for one or more applications or functions of SoC 1500. In some embodiments, I/O controller 1507 illustrates a connection point for additional devices that connect to SoC 1500 through which a user might interact with the system. For example, devices that can be attached to the SoC 1500 might include microphone devices, speaker or stereo systems, video systems or other display devices, keyboard or keypad devices, or other I/O devices for use with specific applications such as card readers or other devices.

Power management 1508 represents hardware or software that perform power management operations, e.g., based at least in part on receiving measurements from power measurement circuitries, temperature measurement circuitries, charge level of battery, and/or any other appropriate information that may be used for power management. By using majority and threshold gates of various embodiments, non-volatility is achieved at the output of these logic. Power management 1508 may accordingly put such logic into low power state without the worry of losing data. Power management may select a power state according to Advanced Configuration and Power Interface (ACPI) specification for one or all components of SoC 1500.

Display system 1509 represents hardware (e.g., display devices) and software (e.g., drivers) components that provide a visual and/or tactile display for a user to interact with the processor 1505. In some embodiments, display system 1509 includes a touch screen (or touch pad) device that provides both output and input to a user. Display system 1509 may include a display interface, which includes the particular screen or hardware device used to provide a display to a user. In some embodiments, the display interface includes logic separate from processor 1505 to perform at least some processing related to the display.

Peripheral connectivity 1510 may represent hardware devices and/or software devices for connecting to peripheral devices such as printers, chargers, cameras, etc. Peripheral connectivity 1510 say support communication protocols, e.g., PCIe (Peripheral Component Interconnect Express), USB (Universal Serial Bus), Thunderbolt, High-Definition Multimedia Interface (HDMI), Firewire, etc.

In various embodiments, SoC 1500 includes coherent cache or memory-side buffer chiplet 1511 which include ferroelectric or paraelectric memory. Coherent cache or memory-side buffer chiplet 1511 can be coupled to processor 1505 and/or memory 1501 according to the various embodiments described herein (e.g., via silicon bridge or vertical stacking).

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus, which comprises the device.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "adjacent" here generally refers to a position of a thing being next to (e.g., immediately next to or close to with one or more things between them) or adjoining another thing (e.g., abutting it).

The term "circuit" or "module" may refer to one or more passive and/or active components that are arranged to cooperate with one another to provide a desired function.

The term "signal" may refer to at least one current signal, voltage signal, magnetic signal, or data/clock signal. The meaning of "a," "an," and "the" include plural references. The meaning of "in" includes "in" and "on."

Here, the term "analog signal" generally refers to any continuous signal for which the time varying feature (variable) of the signal is a representation of some other time varying quantity, i.e., analogous to another time varying signal.

Here, the term "digital signal" generally refers to a physical signal that is a representation of a sequence of discrete values (a quantified discrete-time signal), for example of an arbitrary bit stream, or of a digitized (sampled and analog-to-digital converted) analog signal.

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level.

The terms "substantially," "close," "approximately," "near," and "about," generally refer to being within +/−10% of a target value. For example, unless otherwise specified in the explicit context of their use, the terms "substantially equal," "about equal" and "approximately equal" mean that there is no more than incidental variation between among things so described. In the art, such variation is typically no more than +/−10% of a predetermined target value.

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Here, multiple non-silicon semiconductor material layers may be stacked within a single fin structure. The multiple non-silicon semiconductor material layers may include one or more "P-type" layers that are suitable (e.g., offer higher hole mobility than silicon) for P-type transistors. The multiple non-silicon semiconductor material layers may further include one or more "N-type" layers that are suitable (e.g., offer higher electron mobility than silicon) for N-type transistors. The multiple non-silicon semiconductor material layers may further include one or more intervening layers separating the N-type from the P-type layers. The intervening layers may be at least partially sacrificial, for example to allow one or more of a gate, source, or drain to wrap completely around a channel region of one or more of the N-type and P-type transistors. The multiple non-silicon semiconductor material layers may be fabricated, at least in part, with self-aligned techniques such that a stacked CMOS device may include both a high-mobility N-type and P-type transistor with a footprint of a single FET (field effect transistor).

Here, the term "backend" generally refers to a section of a die which is opposite of a "frontend" and where an IC (integrated circuit) package couples to IC die bumps. For example, high-level metal layers (e.g., metal layer 6 and above in a ten-metal stack die) and corresponding vias that are closer to a die package are considered part of the backend of the die. Conversely, the term "frontend" generally refers to a section of the die that includes the active region (e.g., where transistors are fabricated) and low-level metal layers and corresponding vias that are closer to the active region (e.g., metal layer 5 and below in the ten-metal stack die example).

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional elements.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well-known power/ground connections to integrated circuit (IC) chips and other components may or may not be shown within the presented figures, for simplicity of illustration and discussion, and so as not to obscure the disclosure. Further, arrangements may be shown in block diagram form to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth to describe example embodiments of the disclosure, it should be apparent to one skilled in the art that the disclosure can be practiced without, or with variation of, these specific details. The description is thus to be regarded as illustrative instead of limiting.

The structures of various embodiments described herein can also be described as method of forming those structures, and method of operation of these structures.

Following examples are provided that illustrate the various embodiments. The examples can be combined with other examples. As such, various embodiments can be combined with other embodiments without changing the scope of the invention.

Example 1: An apparatus comprising: a first 5-input gate comprising non-linear polar material; a second 5-input gate comprising the non-linear polar material; a clock node coupled to a first input of the first 5-input gate; a data node coupled to the first 5-input gate; and a 3-input gate comprising the non-linear polar material, wherein a first output of the first 5-input gate is coupled to a first input of the 3-input gate, wherein a second output of the second 5-input gate is coupled to a second input of the 3-input gate, wherein an output of the 3-input gate is coupled an input of the second 5-input gate, wherein the second 5-input gate is not connected to the data node.

Example 2: The apparatus of example 1, wherein the data node is coupled to the first 5-input gate via a first inverting logic gate.

Example 3: The apparatus of example 2, wherein the clock node is coupled to the first 5-input gate via a second inverting logic gate.

Example 4: The apparatus of example 3, wherein the clock node is coupled to the second 5-input gate via a delay stage and a third inverting logic gate.

Example 5: The apparatus of example 4, wherein the clock node is coupled to the second 5-input gate via the delay stage.

Example 6: The apparatus of example 4, wherein the delay stage is a programmable delay stage.

Example 7: The apparatus of example 4, wherein one of the first inverting logic gate, the second inverting logic gate, or the third inverting logic gate comprises one of an inverter, NAND gate, or an NOR gate.

Example 8: The apparatus of example 1 comprises a fourth inverting logic gate coupled to an output of the 3-input gate.

Example 9: The apparatus of example 1, wherein: the first 5-input gate comprises a first 5-input minority gate, a first 5-input majority gate, or a first 5-input threshold gate; the second 5-input gate comprises a second 5-input minority gate, a second 5-input majority gate, or a second 5-input threshold gate; and the 3-input gate comprises a 3-input minority gate, a 3-input majority gate, or a 3-input threshold gate.

Example 10: The apparatus of example 1, wherein the non-linear polar material includes one of: ferroelectric material, paraelectric material, or non-linear dielectric.

Example 11: The apparatus of example 10, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hf1-x Ex Oy, where E can be Al, Ca, Ce, Dy, er, Gd, Ge, La, Sc, Si, Sr, Sn, Zr, or Y; Al(1-x)Sc(x)N, Ga(1-x)Sc(x)N, Al(1-x)Y(x)N or Al(1-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 12: The apparatus of example 10, wherein the paraelectric material includes: SrTiO3, Ba(x)Sr(y)TiO3 (where x is −0.05, and y is 0.95), HfZrO2, Hf—Si—O, La-substituted PbTiO3, or PMN-PT based relaxor ferroelectrics.

Example 13: The apparatus of example 1, wherein the first 5-input gate comprises: a first capacitor to receive a first input, the first capacitor coupled to a node; a second capacitor to receive a second input, the second capacitor coupled to the node; a third capacitor to receive a third input, wherein the third capacitor is coupled to the node; a fourth capacitor to receive a fourth input, wherein the third capacitor is coupled to the node; a fifth capacitor to receive a fifth input, wherein the fifth capacitor is coupled to the node; wherein the first capacitor, the second capacitor, the third capacitor, the fourth capacitor, and the fifth capacitor include the non-linear polar material; and a driver circuitry having a capacitive input coupled to the node, and an output which is to provide a majority or minority logic function of the first input, the second input, the third input, the fourth input and the fifth input.

Example 14: The apparatus of example 1, wherein two inputs of the first 5-input gate are tied to ground.

Example 15: The apparatus of example 1, wherein one input of the second 5-input gate is tied to ground.

Example 16: The apparatus of example 1, wherein one input of the 3-input gate is tied to ground.

Example 17: An apparatus comprising: a first minority gate to receive a clock, an inverted data input, a delayed and inverted version of the clock, and two inputs tied to ground; a second minority gate to receive an inverted version of the clock, a delayed version of the clock, and an input tied to ground; and a third minority gate to receive an output of the first minority gate, an output of the second minority gate, and an input tied to ground, wherein an output of the third minority gate is coupled to at least two inputs of the third minority gate.

Example 18: The apparatus of example 17, wherein the first minority gate, the second minority gate, and the third minority gate comprise a non-linear polar material.

Example 19: The apparatus of example 18, wherein the non-linear polar material includes one of: ferroelectric material, paraelectric material, or non-linear dielectric.

Example 20: A system comprising: a processor circuitry to execute one or more instructions; a communication interface communicatively coupled to the processor circuitry; and a memory coupled to the processor circuitry, wherein the processor circuitry comprises a sequential circuitry which includes: a first 5-input gate comprising non-linear polar material; a second 5-input gate comprising the non-linear polar material; a clock node coupled to a first input of the first 5-input gate; a data node coupled to the first 5-input gate; and a 3-input gate comprising the non-linear polar material, wherein a first output of the first 5-input gate is coupled to a first input of the 3-input gate, wherein a second output of the second 5-input gate is coupled to a second input of the 3-input gate, wherein an output of the 3-input gate is coupled an input of the second 5-input gate, wherein the second 5-input gate is not connected to the data node.

Example 21: The system of example 20, wherein the first 5-input gate, the second 5-input gate, and the 3-input gate comprise a non-linear polar material.

Example 22: The system of example 21, wherein the non-linear polar material includes one of: ferroelectric material, paraelectric material, or non-linear dielectric.

Example 1a: A sequential circuit comprising: a first pass-gate controllable by a first clock and a second clock, wherein the second clock is an inverse of the first clock; a data input coupled to the first pass-gate; a first capacitor coupled to the first pass-gate; a first driver coupled to the first pass-gate and the first capacitor, wherein the first capacitor is coupled to an input of the first driver; a second pass-gate controllable by the first clock and the second clock, the second pass-gate coupled to an output of the first driver; a second capacitor coupled to the second pass-gate; and a second driver coupled to the second pass-gate and second capacitor, wherein the second capacitor is coupled to an input of the second driver.

Example 2a: The sequential circuit of example 1a, wherein the first driver is a first inverting logic gate, and wherein the second driver is second inverting logic gate.

Example 3a: The sequential circuit of example 1a, wherein the first capacitor is coupled to a ground rail, and wherein the second capacitor is coupled to a ground rail.

Example 4a: The sequential circuit of example 1a, wherein when the first pass-gate is on, the second pass-gate is off, and wherein when the first pass-gate is off, the second pass-gate is on.

Example 5a: The sequential circuit of example 1a, wherein the first capacitor and the second capacitor comprise linear capacitors.

Example 6a: The sequential circuit of example 1a, wherein the first capacitor or the second capacitor include non-linear polar material.

Example 7a: The sequential circuit of example 6a, wherein the non-linear polar material includes one of: ferroelectric material, paraelectric material, or non-linear dielectric.

Example 8a: The sequential circuit of claim 7a, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hfl-x Ex Oy, where E can be Al, Ca, Ce, Dy, er, Gd, Ge, La, Sc, Si, Sr, Sn, Zr, or Y; Al(l-x)Sc(x)N, Ga(l-x)Sc(x)N, Al(l-x)Y(x)N or Al(l-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 9a: The sequential circuit of example 8a, wherein the paraelectric material includes: SrTiO3, Ba(x)Sr(y)TiO3 (where x is −0.05, and y is 0.95), HfZrO2, Hf—Si—O, La-substituted PbTiO3, or PMN-PT based relaxor ferroelectrics.

Example 10a: The sequential circuit of example 1a, wherein the first driver and the second driver include one of: an inverter, a buffer, a NAND gate, or a NOR gate.

Example 11a: A sequential circuit comprising: a first pass-gate controllable by a first clock and a second clock, wherein the second clock is an inverse of the first clock; a data input coupled to the first pass-gate; a first driver coupled to the first pass-gate; a second pass-gate controllable by the first clock and the second clock, the second pass-gate coupled to an output of the first driver; a first capacitor coupled to the second pass-gate, the first capacitor including non-linear polar material, wherein the first capacitor is coupled to a first reference; a second capacitor coupled to the second pass-gate, wherein the second capacitor is coupled to a second reference; and a second driver coupled to the second pass-gate and the second capacitor, wherein the second capacitor is coupled to an input of the second driver.

Example 12a: The sequential circuit of example 11a, wherein the first reference has a voltage level lower than a voltage level of the second reference.

Example 13a: The sequential circuit of example 11a, wherein the first reference is a ground reference, wherein the second reference is a supply reference.

Example 14a: The sequential circuit of example 11a, wherein the second capacitor is a linear capacitor.

Example 15a: The sequential circuit of example 11a, wherein the second capacitor comprises a non-linear polar material.

Example 16a: The sequential circuit of example 11a, wherein the non-linear polar material includes one of: ferroelectric material, paraelectric material, or non-linear dielectric.

Example 17a: A system comprising: a processor circuitry to execute one or more instructions; a communication interface communicatively coupled to the processor; and a memory coupled to the processor circuitry, wherein the processor circuitry comprises a sequential circuitry which includes: a first pass-gate controllable by a first clock and a second clock, wherein the second clock is an inverse of the first clock; a data input coupled to the first pass-gate; a first capacitor coupled to the first pass-gate; a first driver coupled to the first pass-gate and the first capacitor, wherein the first capacitor is coupled to an input of the first driver; a second pass-gate controllable by the first clock and the second clock, the second pass-gate coupled to an output of the first driver; a second capacitor coupled to the second pass-gate; and a second driver coupled to the second pass-gate and second capacitor, wherein the second capacitor is coupled to an input of the second driver.

Example 18a: The system of example 17a, wherein the first capacitor and the second capacitor comprise linear capacitors.

Example 19a: The system of example 17a, wherein the first capacitor or the second capacitor include non-linear polar material.

Example 20a: The system of example 19a, wherein: the non-linear polar material includes one of: ferroelectric material, paraelectric material, or non-linear dielectric; the first driver and the second driver include one of: an inverter, a buffer, a NAND gate, or a NOR gate; and the first driver is a first inverting logic gate, wherein the second driver is a second inverting logic gate, wherein the first capacitor is coupled to a ground rail, and wherein the second capacitor is coupled to a ground rail.

Example 1b: An apparatus comprising: a first NAND gate comprising non-linear polar material; a second NAND gate comprising non-linear polar material, wherein an output of the first NAND gate is connected to a first input of the second NAND gate, and an output of the second NAND gate is connected to a first input of the first NAND gate; a third NAND gate comprising non-linear polar material, wherein an output of the second NAND gate is connected to a first input of the third NAND gate; a fourth NAND gate comprising non-linear polar material, wherein an output of the third NAND gate is connected to a first input of the fourth NAND gate, wherein an output of the fourth NAND gate is connected to a second input of the third NAND gate and a second input of the first NAND gate; a clock node coupled to a second input of the second NAND gate, and a third input of the third NAND gate; and a data node coupled to a second input of the fourth NAND gate.

Example 2b: The apparatus of example 1b, comprising a fifth NAND gate including a first input coupled to the output of the second NAND gate.

Example 3b: The apparatus of example 2b comprising a sixth NAND gate, wherein an output of the sixth NAND gate is coupled to a second input of the fifth NAND gate, wherein an output of the fifth NAND gate is coupled to a first input of the sixth NAND gate.

Example 4b: The apparatus of example 3b, wherein the output of the third NAND gate is coupled to a second input of the sixth NAND gate.

Example 5b: The apparatus of example 4b, wherein the first NAND gate, the second NAND gate, the third NAND gate, the fourth NAND gate, the fifth NAND gate, and the sixth NAND gate are implemented as one of: a majority gate, a minority gate, or a threshold gate.

Example 6b: The apparatus of example 4b, wherein the first NAND gate, the second NAND gate, the third NAND gate, the fourth NAND gate, the fifth NAND gate, and the sixth NAND gate include at least three capacitors with the non-linear polar material.

Example 7b: The apparatus of example 6b, wherein at least one terminal of the at least three capacitors is coupled to ground.

Example 8b: The apparatus of example 1b, wherein the first NAND gate comprises: a first capacitor to receive the first input of the first NAND gate, the first capacitor coupled to a node; a second capacitor to receive the second input of the first NAND gate, the second capacitor coupled to the node; a third capacitor to receive a third input, wherein the third input is coupled to ground, wherein the third capacitor is coupled to the node; wherein the first capacitor, the second capacitor, and the third capacitor include the non-linear polar material; and a driver circuitry having a capacitive input coupled to the node, and an output which is to provide a majority or minority logic function of the first input, the second input, and the third input.

Example 9b: The apparatus of example 1b, wherein the non-linear polar material includes one of: ferroelectric material, paraelectric material, or non-linear dielectric.

Example 10b: The apparatus of example 9, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: $BaTiO3$, $PbTiO3$, $KNbO3$, or $NaTaO3$; hexagonal ferroelectric includes one of: $YMnO3$, or $LuFeO3$; hexagonal ferroelectrics of a type h-$RMnO3$, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hfl-x Ex Oy, where E can be Al, Ca, Ce, Dy, er, Gd, Ge, La, Sc, Si, Sr, Sn, Zr, or Y; Al(l-x)Sc(x)N, Ga(l-x)Sc(x)N, Al(l-x)Y(x)N or Al(l-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 11b: The apparatus of example 9b, wherein the paraelectric material includes: SrTiO3, Ba(x)Sr(y)TiO3 (where x is −0.05, and y is 0.95), HfZrO2, Hf—Si—O, La-substituted PbTiO3, or PMN-PT based relaxor ferroelectrics.

Example 12b: An apparatus comprising: a first NAND gate, a second NAND gate, a third NAND gate, a fourth NAND gate, a fifth NAND gate, and a sixth NAND gate, wherein each of the first NAND gate, the second NAND gate, the third NAND gate, the fourth NAND gate, the fifth NAND gate, and the sixth NAND gate include non-linear polar material, wherein the first NAND gate is connected to the second NAND gate, wherein the second NAND gate is connected to the third NAND gate, wherein the third NAND gate is connected to the fourth NAND gate, wherein the second NAND gate is connected to the fifth NAND gate, wherein the third NAND gate is connected to the sixth NAND gate, wherein the fifth NAND gate is connected to the sixth NAND gate; a clock node connected to the second NAND gate and the third NAND gate; and a data node connected to the fourth NAND gate.

Example 13b: The apparatus of example 12b, wherein the first NAND gate comprises: a first capacitor to receive a first input of the first NAND gate, the first capacitor coupled to a node, wherein the first input is coupled to an output of the second NAND gate; a second capacitor to receive a second input of the first NAND gate, the second capacitor coupled to the node, wherein the second input is coupled to an output of the fourth NAND gate; a third capacitor to receive a third input, wherein the third input is coupled to ground, wherein the third capacitor is coupled to the node; wherein the first capacitor, the second capacitor, and the third capacitor include the non-linear polar material; and a driver circuitry having a capacitive input coupled to the node, and an output which is to provide a majority or minority logic function of the first input, the second input, and the third input.

Example 14b: The apparatus of example 12b, wherein the non-linear polar material includes one of: ferroelectric material, paraelectric material, or non-linear dielectric.

Example 15b: The apparatus of example 12b, wherein the first NAND gate, the second NAND gate, the third NAND gate, the fourth NAND gate, the fifth NAND gate, and the sixth NAND gate include at least three capacitors with the non-linear polar material.

Example 16b: The apparatus of example 15b, wherein at least one terminal of the at least three capacitors is coupled to ground.

Example 17b: A system comprising: a processor circuitry to execute one or more instructions; a communication interface communicatively coupled to the processor circuitry; and a memory coupled to the processor circuitry, wherein the processor circuitry comprises a sequential circuitry which includes: a first NAND gate comprising non-linear polar material; a second NAND gate comprising non-linear polar material, wherein an output of the first NAND gate is connected to a first input of the second NAND gate, and an output of the second NAND gate is connected to a first input of the first NAND gate; a third NAND gate comprising non-linear polar material, wherein an output of the second NAND gate is connected to a first input of the third NAND gate; a fourth NAND gate comprising non-linear polar material, wherein an output of the third NAND gate is connected to a first input of the fourth NAND gate, wherein an output of the fourth NAND gate is connected to a second input of the third NAND gate and a second input of the first NAND gate; a clock node coupled to a second input of the second NAND gate, and a third input of the third NAND gate; and a data node coupled to a second input of the fourth NAND gate.

Example 18b: The system of example 17b, wherein the first NAND gate comprises: a first capacitor to receive the first input of the first NAND gate, the first capacitor coupled to a node; a second capacitor to receive the second input of the first NAND gate, the second capacitor coupled to the node; a third capacitor to receive a third input, wherein the third input is coupled to ground, wherein the third capacitor is coupled to the node; wherein the first capacitor, the second capacitor, and the third capacitor include the non-linear polar material; and a driver circuitry having a capacitive input coupled to the node, and an output which is to provide a majority or minority logic function of the first input, the second input, and the third input.

Example 19b: The system of example 17b, wherein the non-linear polar material includes one of: ferroelectric material, paraelectric material, or non-linear dielectric.

Example 20b: The system of example 17b, comprising: a fifth NAND gate including a first input coupled to the output of the second NAND gate; and a sixth NAND gate, wherein an output of the sixth NAND gate is coupled to a second input of the fifth NAND gate, wherein an output of the fifth NAND gate is coupled to a first input of the sixth NAND gate.

Example 1c: An apparatus comprising: a data input; a clock node; a compare logic coupled to the clock node; a majority gate having a first input coupled to the data input, a second input coupled to an output of the compare logic, and a third input coupled to an input of the compare logic; and a driver circuitry coupled to an output of the majority gate, wherein an output of the driver circuitry is coupled to the input of the compare logic, wherein the majority gate comprises at least three capacitors with non-linear polar material.

Example 2c: The apparatus of example 1c, wherein the majority gate comprises: a first capacitor to receive the data input, the first capacitor coupled to a node; a second capacitor to receive the output of the compare logic, the second capacitor coupled to the node; and a third capacitor coupled to the input of the compare logic, wherein the third capacitor is coupled to the node, wherein the first capacitor, the second capacitor, and the third capacitor include the non-linear polar material, and wherein the first capacitor, the second capacitor, and the third capacitor are the at least three capacitors.

Example 3c: The apparatus of example 1c, wherein the driver circuitry comprises a buffer.

Example 4c: The apparatus of example 1c, wherein the compare logic comprises an XOR gate.

Example 5c: The apparatus of example 4c, wherein the XOR gate comprises majority gates, wherein an individual majority gate includes three capacitors with non-linear polar material.

Example 6c: The apparatus of claim 1c, wherein the clock node is a first clock node, wherein the compare logic is a first compare logic, wherein the majority gate is a first majority gate, wherein the driver circuitry is a first driver circuitry, wherein the apparatus comprises: a second compare logic coupled to a second clock node; a second majority gate having a first input coupled to the output of the first driver circuitry, a second input coupled to an output of the second compare logic, and a third input coupled to an input of the second compare logic; and a second driver circuitry coupled to an output of the second majority gate, wherein an output of the second driver circuitry is coupled to the input of the second compare logic, wherein the second majority gate comprises at least three capacitors with non-linear polar material.

Example 7c: The apparatus of example 6c, wherein the second driver circuitry comprises a second buffer.

Example 8c: The apparatus of example 6c, wherein the second compare logic comprises a second XOR gate.

Example 9c: The apparatus of example 8c, wherein the second XOR gate comprises majority gates, wherein an individual majority gate includes three capacitors with non-linear polar material.

Example 10c: The apparatus of example 6c, wherein the second clock node is to provide a clock which is an inverse of a clock on the first clock node.

Example 11c: The apparatus of example 1c, wherein the non-linear polar material includes one of: ferroelectric material, paraelectric material, or non-linear dielectric.

Example 12c: The apparatus of example 11c, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hfl-x Ex Oy, where E can be Al, Ca, Ce, Dy, er, Gd, Ge, La, Sc, Si, Sr, Sn, Zr, or Y; Al(l-x)Sc(x)N, Ga(l-x)Sc(x)N, Al(l-x)Y(x)N or Al(l-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 13c: The apparatus of example 11c, wherein the paraelectric material includes: SrTiO3, Ba(x)Sr(y)TiO3 (where x is −0.05, and y is 0.95), HfZrO2, Hf—Si—O, La-substituted PbTiO3, or PMN-PT based relaxor ferroelectrics.

Example 14c: An apparatus comprising: a first circuitry comprising a first compare circuitry, a first majority gate having three capacitors with non-linear polar material, and a first driver circuitry, wherein a first input of the first majority gate is coupled to a data input node, wherein a second input of the first majority gate is coupled to an output of the first compare circuitry, and wherein a third input of the first majority gate is coupled to an output of the first driver circuitry and a first input of the first compare circuitry, wherein a second input of the first compare circuitry is coupled to a first clock node; and a second circuitry coupled to the first circuitry, wherein the second circuitry comprises a second compare circuitry, a second majority gate having three capacitors with non-linear polar material, and a second driver circuitry, wherein a first input of the second majority gate is coupled to a the output of the first driver circuitry, wherein a second input of the second majority gate is coupled to an output of the second compare circuitry, and wherein a third input of the second majority gate is coupled to an output of the second driver circuitry and a first input of the second compare circuitry, wherein a second input of the second compare circuitry is coupled to a second clock node.

Example 15c: The apparatus of example 14c, wherein the second clock node is to provide a clock which is an inverse of a clock on the first clock node.

Example 16c: The apparatus of example 14c, wherein the non-linear polar material includes one of: ferroelectric material, paraelectric material, or non-linear dielectric.

Example 17c: A system comprising: a processor circuitry to execute one or more instructions; a communication interface communicatively coupled to the processor circuitry; and a memory coupled to the processor circuitry, wherein the processor circuitry comprises a sequential circuitry which includes: a data input; a clock node; a compare logic coupled to the clock node; a majority gate having a first input coupled to the data input, a second input coupled to an output of the compare logic, and a third input coupled to an input of the compare logic; and a driver circuitry coupled to an output of the majority gate, wherein an output of the driver circuitry is coupled to the input of the compare logic, wherein the majority gate comprises at least three capacitors with non-linear polar material.

Example 18c: The system of example 17c, wherein the majority gate comprises: a first capacitor to receive the data input, the first capacitor coupled to a node; a second capacitor to receive the output of the compare logic, the second capacitor coupled to the node; and a third capacitor coupled to the input of the compare logic, wherein the third capacitor is coupled to the node, wherein the first capacitor, the second capacitor, and the third capacitor include the non-linear polar material, and wherein the first capacitor, the second capacitor, and the third capacitor are the at least three capacitors.

Example 19c: The system of example 17c, wherein the driver circuitry comprises a buffer, and wherein the compare logic comprises an XOR gate.

Example 20c: The system of example 19c, wherein the XOR gate comprises majority gates, wherein an individual majority gate includes three capacitors with non-linear polar material.

Example 1d: An apparatus comprising: a clock node to provide a clock; a delay stage coupled to the clock node, wherein the delay stage is to generate a delayed version of the clock; and a plurality of sequential circuits coupled to the clock node and the delay stage, wherein an individual sequential circuit of the plurality is to receive an individual input data on an input data node and to provide an individual output which is a sampled or latched version of the individual input data, wherein the individual sequential circuit includes a majority or minority logic gate.

Example 2d: The apparatus of example 1d, wherein the individual sequential circuit includes: a first 5-input gate comprising non-linear polar material; and a second 5-input gate comprising the non-linear polar material, wherein the first 5-input gate receives the individual input data or a version of the individual input data, wherein the first 5-input gate receives the clock, wherein the second 5-input gate receives the delayed version of the clock.

Example 3d: The apparatus of example 2d, wherein the individual sequential circuit includes: a 3-input gate comprising the non-linear polar material, wherein a first output of the first 5-input gate is coupled to a first input of the 3-input gate, wherein a second output of the second 5-input gate is coupled to a second input of the 3-input gate, wherein an output of the 3-input gate is coupled an input of the second 5-input gate, wherein the second 5-input gate is not connected to the input data node.

Example 4d: The apparatus of example 2d, wherein the input data node is coupled to the first 5-input gate via a first inverting logic gate, wherein the first inverting logic gate provides the version of the individual input data.

Example 5d: The apparatus of example 4d, wherein the clock node is coupled to the first 5-input gate via a second inverting logic gate.

Example 6d: The apparatus of example 5d, wherein the clock node is coupled to the second 5-input gate via the delay stage and a third inverting logic gate.

Example 7d: The apparatus of example 6d, wherein one of the first inverting logic gate, the second inverting logic gate, or the third inverting logic gate comprises one of an inverter, NAND gate, or an NOR gate.

Example 8d: The apparatus of example 3d, wherein the individual sequential circuit includes a fourth inverting logic gate coupled to an output of the 3-input gate.

Example 9d: The apparatus of example 1, wherein the delay stage is a programmable delay stage.

Example 10d: The apparatus of example 3d, wherein: the first 5-input gate comprises a first 5-input minority gate, a first 5-input majority gate, or a first 5-input threshold gate; the second 5-input gate comprises a second 5-input minority gate, a second 5-input majority gate, or a second 5-input threshold gate; and the 3-input gate comprises a 3-input minority gate, a 3-input majority gate, or a 3-input threshold gate.

Example 11d: The apparatus of example 3d, wherein the non-linear polar material includes one of: ferroelectric material, paraelectric material, or non-linear dielectric.

Example 12d: The apparatus of example 11d, wherein the ferroelectric material includes one of: Bismuth ferrite (BFO), BFO with a doping material where in the doping material is one of Lanthanum, or elements from lanthanide series of periodic table; Lead zirconium titanate (PZT), or PZT with a doping material, wherein the doping material is one of La, Nb; relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST); perovskite includes one of: BaTiO3, PbTiO3, KNbO3, or NaTaO3; hexagonal ferroelectric includes one of: YMnO3, or LuFeO3; hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y); Hafnium (Hf), Zirconium (Zr), Aluminum (Al), Silicon (Si), their oxides or their alloyed oxides; Hafnium oxides as Hfl-x Ex Oy, where E can be Al, Ca, Ce, Dy, er, Gd, Ge, La, Sc, Si, Sr, Sn, Zr, or Y; Al(l-x)Sc(x)N, Ga(l-x)Sc(x)N, A1(*l-x*)Y(x)N or Al(l-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction; Niobate type compounds LiNbO3, LiTaO3, Lithium iron Tantalum Oxy Fluoride, Barium Strontium Niobate, Sodium Barium Niobate, or Potassium strontium niobate; or improper ferroelectric includes one of: [PTO/STO]n or [LAO/STO]n, where 'n' is between 1 to 100.

Example 13d: The apparatus of example 11d, wherein the paraelectric material includes: SrTiO3, Ba(x)Sr(y)TiO3 (where x is −0.05, and y is 0.95), HfZrO2, Hf—Si—O, La-substituted PbTiO3, or PMN-PT based relaxor ferroelectrics.

Example 14d: The apparatus of example 2d, wherein the first 5-input gate comprises: a first capacitor to receive a first input, the first capacitor coupled to a node; a second capacitor to receive a second input, the second capacitor coupled to the node; a third capacitor to receive a third input, wherein the third capacitor is coupled to the node; a fourth capacitor to receive a fourth input, wherein the third capacitor is coupled to the node; a fifth capacitor to receive a fifth input, wherein the fifth capacitor is coupled to the node; wherein the first capacitor, the second capacitor, the third capacitor, the fourth capacitor, and the fifth capacitor include the non-linear polar material; and a driver circuitry having a capacitive input coupled to the node, and an output which is to provide a majority or minority logic function of the first input, the second input, the third input, the fourth input and the fifth input.

Example 15d: The apparatus of example 3d, wherein two inputs of the first 5-input gate are tied to ground, wherein one input of the second 5-input gate is tied to ground, and wherein one input of the 3-input gate is tied to ground.

Example 16d: An apparatus comprising: a clock circuitry to provide a first clock and a second clock, wherein the second clock is derived from the first clock; and a plurality of sequential circuits coupled to the clock circuitry, wherein an individual sequential circuit of the plurality is to receive an individual input data on an input data node and to provide an individual output which is a sampled or latched version of the individual input data, wherein the individual sequential circuit includes a majority or minority logic gate.

Example 17d: The apparatus of example 16d, wherein the majority or minority logic gate includes non-linear polar material.

Example 18d: A system comprising: a processor circuitry to execute one or more instructions; a communication interface communicatively coupled to the processor circuitry; and a memory coupled to the processor circuitry, wherein the processor circuitry comprises a vectored sequential circuitry which includes: a clock circuitry to provide a first clock and a second clock, wherein the second clock is derived from the first clock; and a plurality of sequential circuits coupled to the clock circuitry, wherein an individual sequential circuit of the plurality is to receive an individual input data on an input data node and to provide an individual output which is a sampled or latched version of the individual input data, wherein the individual sequential circuit includes a majority logic gate or a minority logic gate.

Example 19d: The system of example 18d, wherein the majority logic gate or the minority logic gate includes non-linear polar material.

Example 20d: The system of example 19d, wherein the non-linear polar material includes one of: ferroelectric material, paraelectric material, or non-linear dielectric.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first 5-input gate comprising non-linear polar material;
   a second 5-input gate comprising the non-linear polar material;
   a clock node coupled to a first input of the first 5-input gate;
   a data node coupled to the first 5-input gate; and
   a 3-input gate comprising the non-linear polar material, wherein a first output of the first 5-input gate is coupled to a first input of the 3-input gate, wherein a second output of the second 5-input gate is coupled to a second input of the 3-input gate, wherein an output of the 3-input gate is coupled an input of the second 5-input gate, and wherein the second 5-input gate is not connected to the data node.

2. The apparatus of claim 1, wherein the data node is coupled to the first 5-input gate via a first inverting logic gate.

3. The apparatus of claim 2, wherein the clock node is coupled to the first 5-input gate via a second inverting logic gate.

4. The apparatus of claim 3, wherein the clock node is coupled to the second 5-input gate via a delay stage and a third inverting logic gate.

5. The apparatus of claim 4, wherein the clock node is coupled to the second 5-input gate via the delay stage.

6. The apparatus of claim 4, wherein the delay stage is a programmable delay stage.

7. The apparatus of claim 4, wherein one of the first inverting logic gate, the second inverting logic gate, or the third inverting logic gate comprises one of an inverter, NAND gate, or an NOR gate.

8. The apparatus of claim 1 comprises a fourth inverting logic gate coupled to an output of the 3-input gate.

9. The apparatus of claim 1, wherein:
   the first 5-input gate comprises a first 5-input minority gate, a first 5-input majority gate, or a first 5-input threshold gate;
   the second 5-input gate comprises a second 5-input minority gate, a second 5-input majority gate, or a second 5-input threshold gate; and
   the 3-input gate comprises a 3-input minority gate, a 3-input majority gate, or a 3-input threshold gate.

10. The apparatus of claim 1, wherein the non-linear polar material includes one of:
    ferroelectric material, paraelectric material, or non-linear dielectric.

11. The apparatus of claim 10, wherein the ferroelectric material includes one of:
    Bismuth ferrite (BFO), BFO with a doping material where in the doping material is one of Lanthanum, or elements from lanthanide series of periodic table;
    Lead zirconium titanate (PZT), or PZT with a doping material, wherein the doping material is one of La or Nb;
    a relaxor ferroelectric which includes one of lead magnesium niobate (PMN), lead magnesium niobate-lead titanate (PMN-PT), lead lanthanum zirconate titanate (PLZT), lead scandium niobate (PSN), Barium Titanium-Bismuth Zinc Niobium Tantalum (BT-BZNT), or Barium Titanium-Barium Strontium Titanium (BT-BST);
    a perovskite which includes one of: BaTiO3, PbTiO3, KNbO3, or NaTaO3;
    a hexagonal ferroelectric which includes one of: YMnO3 or LuFeO3;
    hexagonal ferroelectrics of a type h-RMnO3, where R is a rare earth element which includes one of: cerium (Ce), dysprosium (Dy), erbium (Er), europium (Eu), gadolinium (Gd), holmium (Ho), lanthanum (La), lutetium (Lu), neodymium (Nd), praseodymium (Pr), promethium (Pm), samarium (Sm), scandium (Sc), terbium (Tb), thulium (Tm), ytterbium (Yb), or yttrium (Y);
    Hafnium (Hf), Zirconium (Zr), Aluminum (Al), Silicon (Si), their oxides or their alloyed oxides;
    Hafnium oxides as Hfl-x Ex Oy, where E can be Al, Ca, Ce, Dy, Er, Gd, Ge, La, Sc, Si, Sr, Sn, Zr, or Y;
    Al(l-x)Sc(x)N, Ga(l-x)Sc(x)N, Al(l-x)Y(x)N or Al(l-x-y)Mg(x)Nb(y)N, y doped HfO2, where x includes one of: Al, Ca, Ce, Dy, Er, Gd, Ge, La, Sc, Si, Sr, Sn, or Y, wherein 'x' is a fraction;
    Niobate type compounds LiNbO3, LiTaO3, Lithium iron Tantalum Oxy Fluoride, Barium Strontium Niobate, Sodium Barium Niobate, or Potassium strontium niobate; or
    an improper ferroelectric which includes one of: [PTO/STO]n or [LAO/STO]n, where 'n' is between 1 to 100.

12. The apparatus of claim 10, wherein the paraelectric material includes: SrTiO3, Ba(x)Sr(y)TiO3 (where x is −0.05, and y is 0.95), HfZrO2, Hf—Si—O, La-substituted PbTiO3, or PMN-PT based relaxor ferroelectrics.

13. The apparatus of claim 1, wherein the first 5-input gate comprises:
    a first capacitor to receive a first input, the first capacitor coupled to a node;
    a second capacitor to receive a second input, the second capacitor coupled to the node;
    a third capacitor to receive a third input, wherein the third capacitor is coupled to the node;
    a fourth capacitor to receive a fourth input, wherein the third capacitor is coupled to the node;
    a fifth capacitor to receive a fifth input, wherein the fifth capacitor is coupled to the node;
    wherein the first capacitor, the second capacitor, the third capacitor, the fourth capacitor, and the fifth capacitor include the non-linear polar material; and
    a driver circuitry having a capacitive input coupled to the node, and an output which is to provide a majority or minority logic function of the first input, the second input, the third input, the fourth input and the fifth input.

14. The apparatus of claim 1, wherein two inputs of the first 5-input gate are tied to ground.

15. The apparatus of claim 1, wherein one input of the second 5-input gate is tied to ground.

16. The apparatus of claim 1, wherein one input of the 3-input gate is tied to ground.

17. An apparatus comprising:

a first minority gate to receive a clock, an inverted data input, a delayed and inverted version of the clock, and two inputs tied to ground;

a second minority gate to receive an inverted version of the clock, a delayed version of the clock, and an input tied to ground; and a third minority gate to receive an output of the first minority gate, an output of the second minority gate, and an input tied to ground, wherein an output of the third minority gate is coupled to at least two inputs of the second minority gate.

18. The apparatus of claim 17, wherein the first minority gate, the second minority gate, and the third minority gate comprise a non-linear polar material.

19. The apparatus of claim 18, wherein the non-linear polar material includes one of: ferroelectric material, paraelectric material, or non-linear dielectric.

20. A system comprising:

a processor circuitry to execute one or more instructions;

a communication interface communicatively coupled to the processor circuitry; and a memory coupled to the processor circuitry, wherein the processor circuitry comprises a sequential circuitry which includes:

a first 5-input gate comprising non-linear polar material;

a second 5-input gate comprising the non-linear polar material;

a clock node coupled to a first input of the first 5-input gate;

a data node coupled to the first 5-input gate; and a 3-input gate comprising the non-linear polar material, wherein a first output of the first 5-input gate is coupled to a first input of the 3-input gate, wherein a second output of the second 5-input gate is coupled to a second input of the 3-input gate, wherein an output of the 3-input gate is coupled an input of the second 5-input gate, and wherein the second 5-input gate is not connected to the data node.

21. The system of claim 20, wherein the first 5-input gate, the second 5-input gate, and the 3-input gate comprise a non-linear polar material.

22. The system of claim 21, wherein the non-linear polar material includes one of: ferroelectric material, paraelectric material, or non-linear dielectric.

* * * * *

UNITED STATES PATENT AND TRADEMARK OFFICE
CERTIFICATE OF CORRECTION

PATENT NO. : 11,303,280 B1
APPLICATION NO. : 17/407031
DATED : April 12, 2022
INVENTOR(S) : Amrita Mathuriya et al.

It is certified that error appears in the above-identified patent and that said Letters Patent is hereby corrected as shown below:

In the Specification

Column 4, Line 44; Column 17, Line 67; Column 28, Line 67; Column 35, Line 29; Column 38, Line 25; Column 40, Line 49; Column 43, Line 30; Column 45, Line 52; Column 47, Lines 65-66: delete ", BFO". replace --where in-- with --wherein--
Column 4, Line 66; Column 18, Line 14; Column 29, Line 15; Column 35, Line 50; Column 38, Line 46; Column 43, Line 51; Column 46, Line 6: replace --er-- with --Er--
Column 6, Line 7, Line 49: replace --pass gates-- with --pass-gates--
Column 6, Line 9: replace --pass gate-- with --pass-gate--
Column 11, Lines 9, 48, add --(FF)-- after flip-flop
Column 12, Line 44: replace the second --646-- with --649--
Column 12, Line 64: add --, respectively,-- after 602
Column 13, Line 14: add --(logic gate)-- after minority gate
Column 13, Line 16: replace --Gate-- with --gate--
Column 13, Line 21 add --first-- before driver
Column 13, Line 23: add --second-- before driver
Column 13, Line 66; Column 15, Lines 24, and 31; Column 15, Line 20-21: add --non-linear polar-- before capacitor
Column 14, Lines 1, 27, and 51: replace --FEC-- with --non-linear polar capacitor--
Column 15, Lines 2, 8: replace --FE-- with --non-linear polar--
Column 16, Line 33; Column 29, Lines 56-57: delete "(where x is -0.5, and y is 0.95)"
Column 18, Line 13: delete the "," after form
Column 18, Line 15-16: add --the-- before FE; and add --of non-linear polar capacitor-- before 705
Column 18, Line 62: replace --drivers 701, 702, and 703-- with --first, second, and third drivers 701, 702, and 703, respectively--
Column 19, Lines 4, and 7: add --non-linear polar-- before capacitor
Column 20, Line 57: add --circuitry-- after driver
Column 21, Line 59: replace --200-- with --730--
Column 22, Line 22: replace --askin-- with --akin--
Column 25, Line 23: replace --1101-- with --1102--

Signed and Sealed this
Twenty-seventh Day of August, 2024

Katherine Kelly Vidal
*Director of the United States Patent and Trademark Office*

CERTIFICATE OF CORRECTION (continued)

Column 25, Line 27: replace --second XOR gate 1106-- with --second compare circuitry (e.g., XOR gate) 1106--
Column 25, Line 30: replace --1103-- with --1104--
Column 26, Line 2: add --(RAM)-- before 1304
Column 26, Line 5: remove second --)--. remove --main--
Column 26, Line 43-44: add --block-- after computational
Column 27, Line 11: replace --architecture-- with --AI machine--
Column 27, Line 13: replace --FeRAM 1304-- with --First RAM 1304 (e.g., FeRAM)--
Column 27, Line 14: replace --inference die 1301-- with --computational block 1401 (e.g., inference die or accelerator)--
Column 28, Lines 12-13; Column 29, Line 3: add --the-- before FE. delete "213"
Column 30, Line 11: replace --first die 1401-- with --first RAM (e.g., die 1401)--
Column 30, Line 12: replace --second die 1402-- with --second RAM (e.g., die 1402)--
Column 30, Line 15-16: add --a-- before first and second, delete "1401" and "1402"
Column 30, Lines 58 and 62-63: replace --Architecture-- with --Computational block--
Column 31, Lines 5: delete ", and peripheral connectivity 1506"
Columns 31-32, Lines 53, 55, 56.2: add --circuitry-- after --connectivity--
Column 32, Line 51: add --a-- after --includes--
Column 32, Lines 52 and 54: delete "1511"
Column 32, Line 53: replace --Coherent-- with --The coherent--